United States Patent
Niira et al.

(10) Patent No.: US 11,990,867 B2
(45) Date of Patent: May 21, 2024

(54) INFORMATION PROCESSING APPARATUS, CONTROL METHOD, AND PROGRAM

(71) Applicant: KYOCERA Corporation, Kyoto (JP)

(72) Inventors: Koichiro Niira, Higashioumi (JP); Shinsuke Uchida, Ise (JP); Takuya Kurose, Koka (JP); Shinji Yada, Ise (JP); Kyosuke Fujiwara, Suzuka (JP); Hidetaka Takato, Koriyama (JP); Katsuhiko Shirasawa, Koriyama (JP); Yuji Ino, Koriyama (JP)

(73) Assignee: KYOCERA CORPORATION, Kyoto (JP)

( * ) Notice: Subject to any disclaimer, the term of this patent is extended or adjusted under 35 U.S.C. 154(b) by 307 days.

(21) Appl. No.: 17/437,404

(22) PCT Filed: Mar. 6, 2020

(86) PCT No.: PCT/JP2020/009892
§ 371 (c)(1),
(2) Date: Sep. 8, 2021

(87) PCT Pub. No.: WO2020/184495
PCT Pub. Date: Sep. 17, 2020

(65) Prior Publication Data
US 2022/0190782 A1     Jun. 16, 2022

(30) Foreign Application Priority Data

Mar. 8, 2019    (JP) ................................ 2019-043208
Mar. 8, 2019    (JP) ................................ 2019-043209
(Continued)

(51) Int. Cl.
*H02S 50/10*      (2014.01)
*H02S 40/40*      (2014.01)

(52) U.S. Cl.
CPC .............. *H02S 50/10* (2014.12); *H02S 40/40* (2014.12)

(58) Field of Classification Search
None
See application file for complete search history.

(56) References Cited

U.S. PATENT DOCUMENTS

2012/0053867 A1*   3/2012   Dunn ...................... H02S 50/10
                                                                       702/58
2014/0375343 A1   12/2014   Chen et al.
2016/0162616 A1   6/2016   Hasan et al.

FOREIGN PATENT DOCUMENTS

CN          102904289 A   *   1/2013
CN          103293423 A   *   9/2013
(Continued)

OTHER PUBLICATIONS

S. Kurtz et al., "Evaluation of High-Temperature Exposure of Photovoltaic Modules", Conference Paper NREL/CP-520-45986, Jun. 2009, National Renewable Energy Laboratory, 9pp.

*Primary Examiner* — Patrick Assouad
*Assistant Examiner* — Haidong Zhang
(74) *Attorney, Agent, or Firm* — HAUPTMAN HAM, LLP

(57) ABSTRACT

An apparatus for predicting useful life of a photovoltaic module includes an input and an output. The input receives first information indicating an amount of hygrothermal stress that a photovoltaic module undergoes from a start until an end of a period during which the photovoltaic module outputs predetermined electric power. The input further receives second information indicating an amount of hygrothermal stress that the photovoltaic module undergoes per a predetermined time in a field where the photovoltaic module is deployed. The second information is generated based on information about daily maximum temperatures of the pho-
(Continued)

tovoltaic module in the field where the photovoltaic module is deployed. The output outputs result information about a predicted period during which the photovoltaic module is expected to output the predetermined electric power when the photovoltaic module is deployed in the field.

15 Claims, 35 Drawing Sheets

(30) Foreign Application Priority Data

| Jun. 20, 2019 | (JP) | ................................ | 2019-114877 |
| Jun. 20, 2019 | (JP) | ................................ | 2019-114880 |
| Mar. 6, 2020 | (JP) | ................................ | 2020-039351 |
| Mar. 6, 2020 | (JP) | ................................ | 2020-039352 |
| Mar. 6, 2020 | (JP) | ................................ | 2020-039355 |

(56) References Cited

FOREIGN PATENT DOCUMENTS

| CN | 204810230 U | 11/2015 |
| JP | 2007165438 A | 6/2007 |
| JP | 201482309 A | 5/2014 |
| KR | 101488205 B1 * | 1/2015 |

\* cited by examiner

FIG. 10

| FIELD | Heff (= ANNUAL MEDIAN VALUE OF DAILY EFFECTIVE STRESS TIME heff) [h] |
|---|---|
| CHIBA PREFECTURE | 4.4 h |
| YAMANASHI PREFECTURE | 4.0 h |
| CALIFORNIA STATE (USA) | 4.0 h |
| LOS ALAMOS (NEW MEXICO STATE, USA) | 3.0 h |

FIG. 24

|  | WATER MOLECULE CONCENTRATION IN EVA |
|---|---|
| TEST PRODUCT AT RELATIVE HUMIDITY OF 95% (TEMPERATURE 125°C) | 1 TO 2 × $10^{20}$/cm$^3$ |
| TEST PRODUCT AT RELATIVE HUMIDITY OF 95% (TEMPERATURE 95°C) | 5 TO 8 × $10^{19}$/cm$^3$ |
| COLLECTED PRODUCT FROM FIELD IN JAPAN | 3 TO 5 × $10^{19}$/cm$^3$ |

FIG. 29

| STRESS AMOUNT (1) OBTAINED BY PERFORMING DH TEST ON INITIAL PRODUCT FOR α [HOURS] | |
|---|---|
| STRESS AMOUNT (3) OF COLLECTED PRODUCT MOUNTED ON FIELD FOR X [YEARS] | STRESS AMOUNT (2) OBTAINED BY PERFORMING DH TEST ON COLLECTED PRODUCT FOR β [HOURS] |

FIG. 30

| STRESS AMOUNT (1) OBTAINED BY PERFORMING DH TEST ON INITIAL PRODUCT FOR α [HOURS] | | |
|---|---|---|
| STRESS AMOUNT (3) OF COLLECTED PRODUCT MOUNTED ON FIELD FOR X [YEARS] | STRESS AMOUNT (2) OBTAINED BY PERFORMING DH TEST ON COLLECTED PRODUCT FOR β [HOURS] | |
| | STRESS AMOUNT (4) OBTAINED BY PERFORMING DH TEST SUCCESSIVELY TO UV TEST FOR γ [HOURS] | |
| STRESS AMOUNT (5) OF Z [YEARS] FROM UV TESTING ON INITIAL PRODUCT | DAMP HEAT STRESS AMOUNT (7) ON FIELD | |
| UV STRESS AMOUNT (6) ON FIELD | | |

INFORMATION PROCESSING APPARATUS, CONTROL METHOD, AND PROGRAM

CROSS REFERENCE TO RELATED APPLICATIONS

The present application is a national phase of International Application No. PCT/JP2020/009892, filed on Mar. 6, 2020 which claims priority to Japanese Patent Application No. 2019-43208 and Japanese Patent Application No. 2019-43209 both filed in Japan on Mar. 8, 2019, Japanese Patent Application No. 2019-114877 and Japanese Patent Application No. 2019-114880 both filed in Japan on Jun. 20, 2019, and Japanese Patent Application No. 2020-39351, Japanese Patent Application No. 2020-39352, and Japanese Patent Application No. 2020-39355 all three filed in Japan on Mar. 6, 2020, the entire disclosure of which is incorporated herein by reference.

TECHNICAL FIELD

The present disclosure relates to an information processing apparatus, a control method, and a program.

BACKGROUND ART

In recent years, studies on the degradation of photovoltaic modules (hereinafter also referred to as "PV modules" or simply as "modules") have been in progress. For example, NPL 1 discloses the degradation of a polymer material for a PV module that operates in a high-temperature environment. In addition, for example, PTL 1 discloses a PV module evaluation method that measures the ingress of water at a stage before alteration of the PV module occurs. Furthermore, for example, PTL 2 discloses a management apparatus that estimates a decrease in the output of a PV module.

CITATION LIST

Non Patent Literature

NPL 1: Sarah Kurtz, et al "Evaluation of High-Temperature Exposure of Rack-Mounted Photovoltaic Modules" Conference Paper NREL/CP-520-45986, June 2009

Patent Literature

PTL 1: Japanese Unexamined Patent Application Publication No. 2007-165438
PTL 2: Japanese Unexamined Patent Application Publication No. 2014-82309

SUMMARY OF INVENTION

Solution to Problem

In some embodiments, an apparatus for predicting useful life of a photovoltaic module comprises:
an input that receives first information indicating an amount of hygrothermal stress that a photovoltaic module undergoes from a start until an end of a period during which the photovoltaic module outputs predetermined electric power, and receives second information indicating an amount of hygrothermal stress that the photovoltaic module undergoes per a predetermined time in a field where the photovoltaic module is deployed, the second information generated based on information about daily maximum temperatures of the photovoltaic module in the field where the photovoltaic module is deployed; and
an output that outputs result information about a predicted period during which the photovoltaic module is expected to output the predetermined electric power when the photovoltaic module is deployed in the field.

In some embodiments, a control method of a device for predicting useful life of a photovoltaic module comprises:
acquiring first information indicating an amount of hygrothermal stress that a photovoltaic module undergoes from a start until an end of a period during which the photovoltaic module outputs predetermined electric power;
acquiring second information indicating an amount of hygrothermal stress that the photovoltaic module undergoes per a predetermined time in the field where the photovoltaic module is deployed, the second information generated based on information about daily maximum temperatures of the photovoltaic module in the field where the photovoltaic module is deployed; and
based on input of the first information and the second information, outputting result information about a predicted period during which the photovoltaic module is expected to output the predetermined electric power when the photovoltaic module is deployed in the field.

In some embodiments, a non-transitory computer-readable recording medium stores a control program for a device that predicts useful life of a photovoltaic module, the control program executing process of:
acquiring first information indicating an amount of hygrothermal stress that a photovoltaic module undergoes from a start until an end of a period during which the photovoltaic module outputs predetermined electric power;
acquiring second information indicating an amount of hygrothermal stress that the photovoltaic module undergoes per a predetermined time in the field where the photovoltaic module is deployed, the second information generated based on information about daily maximum temperatures of the photovoltaic module in the field where the photovoltaic module is deployed; and
based on input of the first information and the second information, outputting result information about a predicted period during which the photovoltaic module is expected to output the predetermined electric power when the photovoltaic module is deployed in the field.

In some embodiments, an apparatus for predicting useful life of a photovoltaic module comprises:
an input that receives first information indicating a representative value of a temperature of a photovoltaic module deployed in the field throughout a year, and receives second information indicating a correlation between the temperature and/or a humidity of the photovoltaic module and a period during which the photovoltaic module outputs predetermined electric power, the correlation obtained from results of two or more tests performed under different environment conditions, and
an output that outputs result information about a predicted period during which the photovoltaic module is expected to output the predetermined electric power in the field.

In some embodiments, a control method of a device for predicting useful life of a photovoltaic module comprises:

acquiring first information indicating a representative value of a temperature of a photovoltaic module deployed in the field throughout a year;

acquiring second information indicating a correlation between the temperature and/or a humidity of the photovoltaic module and a period during which the photovoltaic module outputs predetermined electric power, the correlation obtained from results of two or more tests performed under different environment conditions; and outputting, based on the first information and the second information, result information about a predicted period during which the photovoltaic module is expected to output the predetermined electric power in the field.

In some embodiments, a non-transitory computer-readable recording medium stores a control program for a device that predicts useful life of a photovoltaic module, the control program executing process of:

acquiring first information indicating a representative value of a temperature of a photovoltaic module deployed in the field throughout a year;

acquiring second information indicating a correlation between the temperature and/or a humidity of the photovoltaic module and a period during which the photovoltaic module outputs predetermined electric power, the correlation obtained from results of two or more tests performed under different environment conditions; and outputting, based on the first information and the second information, result information about a predicted period during which the photovoltaic module is expected to output the predetermined electric power in the field.

BRIEF DESCRIPTION OF DRAWINGS

FIG. 10 illustrates an example of calculated daily effective stress times.

FIG. 24 illustrates examples of a water molecule concentration in some EVA.

FIG. 29 illustrates useful life prediction using an acceleration test for a PV module collected in the field.

FIG. 30 illustrates useful life prediction using an acceleration test for a PV module collected in the field.

DESCRIPTION OF EMBODIMENTS (Information Processing Apparatus)

Figure 1:
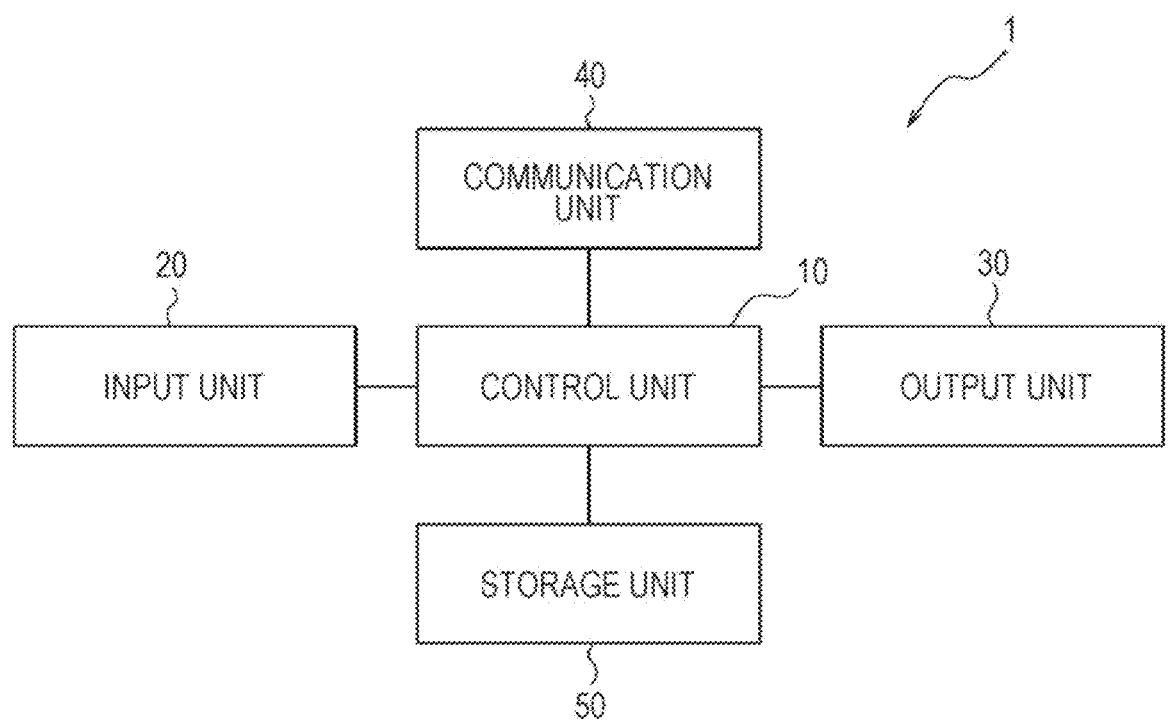
FIG. 1 is a block diagram schematically illustrating an example of the configuration of an information processing apparatus according to an embodiment.

If a prediction of the useful life of a PV module based on degradation can be converted into a reasonable numeric value, it contributes to the evaluation of the PV module. The present disclosure relates to providing an information processing apparatus, a control method, and a program that contribute to the evaluation of the PV module. According to an embodiment, it is possible to provide an information processing apparatus, a control method, and a program that contribute to the evaluation of the PV module. Hereinafter, an information processing apparatus according to an embodiment will be described with reference to the drawings.

It is assumed that a user of the information processing apparatus according to an embodiment may be, for example, a person who wishes to know a predicted useful life of a PV module that constitutes a photovoltaic generation system or the like. The person who wishes to know the predicted useful life of the PV module may be, for example, a person in an ordinary family, a company, or the like, who is considering setting up or selling a photovoltaic generation system. The person who wishes to know the predicted useful life of the PV module may also be, for example, a person who performs inspection or evaluation of PV modules in an inspection organization or the like. The assumed user of the information processing apparatus according to an embodiment may be any person who wishes to know the predicted useful life of a PV module. Hereinafter, a person who operates the information processing apparatus according to an embodiment (e.g., a consumer, a trader, a technician, or a testing technician) will be simply referred to as a "user".

The information processing apparatus according to an embodiment typically outputs information about the useful life of the PV module in accordance with an input by an operation by a user. For example, a user can input, to the information processing apparatus according to an embodiment, various types of information about the PV module for which the useful life is to be measured. For example, in accordance with various types of information about the PV module that are input by the user, the information processing apparatus according to an embodiment outputs information about a prediction of the useful life of the PV module. The information about the prediction of the useful life of the PV module that is output from the information processing apparatus according to an embodiment may be, for example, information on a time period, such as the number of years, until the useful life of the PV module. The information on the time period until the useful life of the PV module may be, for example, a time period during which electric power generation is possible without significant reduction in the characteristics of the PV module (Pm characteristics or FF characteristics described later); that is, a time period during which the characteristics of the PV module are reduced to a predetermined ratio relative to an initial value. The information about the prediction of the useful life of the PV module output in this manner can be typically displayed on a display apparatus or the like. Therefore, the user is able to know the predicted useful life of the PV module.

FIG. 1 is a functional block diagram schematically illustrating the configuration of the information processing apparatus according to an embodiment.

The information processing apparatus according to an embodiment can be formed as, for example, a dedicated terminal. On the other hand, the information processing apparatus according to an embodiment may also be formed of, for example, a laptop PC (Personal Computer), a desktop PC, a tablet terminal, a smartphone, a mobile phone, or the like. In addition, the functions of the information processing apparatus according to an embodiment may be implemented as part of the functions of another electronic device. The functions of the information processing apparatus according to an embodiment can also be implemented by executing an application program for performing processing of the information processing apparatus according to an embodiment in any given electronic device equipped with a computer.

As illustrated in FIG. 1, an information processing apparatus 1 according to an embodiment includes a control unit 10, an input unit 20, an output unit 30, a communication unit 40, and a storage unit 50.

The control unit 10 controls and manages the entirety of the information processing apparatus 1, including functional units constituting the information processing apparatus 1. The control unit 10 can be constituted by including, for example, a CPU (Central Processing Unit) and the like. In the information processing apparatus 1 according to an embodiment, the control unit 10 may compute and/or process various types of information relating to a prediction of the useful life of a PV module.

To provide control and processing capacity for executing various functions, the information processing apparatus 1 may also include, as the control unit 10, at least one processor. In various embodiments, the at least one processor may be implemented as a single integrated circuit (IC) or a plurality of integrated circuits that are communicably connected, and/or as a discrete circuit (discrete circuits). The at least one processor can be implemented in accordance with various known techniques.

In an embodiment, the processor includes one or more circuits or units formed to execute one or more data calculation procedures or processes. For example, the processor may execute the following functions by including one or more processors, controllers, microprocessors, microcontrollers, application specific integrated circuits (ASICs), digital signal processing apparatuses, programmable logic devices, field programmable gate arrays, any given combination of these devices or configurations, or a combination of other known devices or configurations.

The input unit 20 can be any given input device used for user operations, for example, a key (physical key) such as a keyboard, a pointing device such as a mouse or a track ball, and/or the like. In an embodiment, since the input unit 20 can be any known input device, a more detailed description is omitted. In an embodiment, the information processing apparatus 1 may acquire various types of information necessary for prediction of the useful life of the PV module from the input unit 20.

The output unit 30 displays processing results or the like obtained by the information processing apparatus 1. In an embodiment, for example, as a display, the output unit 30 displays, for example, the information relating to the prediction of the useful life of the PV module. In addition, in an embodiment, for example, to output the above information, the output unit 30 displays characters, symbols, images, and/or the like constituting a screen for encouraging the user to input predetermined information. Data necessary for display on the output unit 30 is supplied from the control unit 10.

The output unit 30 may be any given display device such as a liquid crystal display, an organic EL display (Organic Electro-Luminescence panel), or an inorganic EL display (Inorganic Electro-Luminescence panel). The output unit 30 may display various types of information such as characters, figures, symbols, or graphs. To encourage the user who operates the information processing apparatus 1 to perform operation, the output unit 30 may display an object constituting various GUIs including a pointer, an icon image, and the like. In addition, the output unit 30 may be constituted by including a backlight or the like as necessary.

In addition, the output unit 30 is not necessarily limited to a device that gives the user visual effects. The output unit 30 may employ any given configuration as long as the user can be informed of the information about the prediction of the useful life of the PV module. For example, as the output unit 30, a speaker that delivers the information about the prediction of the useful life of the PV module by using voice or the like may be substituted. Furthermore, such a speaker may also be provided in the output unit 30.

In an embodiment, the output unit 30 may also be constituted as, for example, a touch screen display together with the input unit 20. In this case, the touch screen display may include, as the output unit 30, for example, a display device such as a liquid crystal display or an organic EL display. In addition, in this case, the touch screen display may include, as the input unit 20, for example, a touch sensor or a touch panel that detects the presence or absence of a touch by a user and the position of the touch. In such a configuration, for example, a key such as a numeric keypad, an icon, or the like can be displayed on the output unit 30 as an object, and operation of an operator touching the object can be detected by the input unit 20. The input unit 20 can employ a touch panel of various types, such as a resistive type, a capacitive type, or an optical type.

The communication unit 40 can implement various functions including wireless communication. The communication unit 40 may, for example, implement communication by various communication methods such as LTE (Long Term Evolution). The communication unit 40 may, for example, include a modem whose communication method is standardized by the ITU-T (International Telecommunication Union Telecommunication Standardization Sector). The communication unit 40 may perform wireless communication via a network with, for example, an external device such as an external server or a cloud server, via, for example, an antenna. In an embodiment, the communication unit 40 may receive various types of information from, for example, an external database such as an external server or a cloud server. In addition, various types of information received by the communication unit 40 in this manner may be stored in the storage unit 50. In an embodiment, the information processing apparatus 1 may receive or acquire various types of information necessary for the prediction of the useful life of the PV module through the communication unit 40.

The communication unit 40 is not limited to a functional unit that performs wireless communication. For example, the communication unit 40 may be formed as an interface for wired connection with an external device via a cable or the like.

The storage unit 50 stores information acquired from the control unit 10, the communication unit 40, and the like. In addition, the storage unit 50 stores a program to be executed by the control unit 10, or the like. Besides, the storage unit 50 also stores, for example, various pieces of data such as computation results obtained by the control unit 10. Furthermore, the following description is made on the assumption that the storage unit 50 can include a work memory or the like used when the control unit 10 operates. The storage unit 50 can be constituted by, for example, a semiconductor memory, a magnetic disk, or the like, but, without limitation to these, can be any given storage apparatus. For example, the storage unit 50 may also be an optical storage apparatus such as an optical disc or may be a magneto-optical disk or the like. In addition, for example, the storage unit 50 may also be a storage medium such as a memory card inserted into the information processing apparatus 1 according to this embodiment. In addition, the storage unit 50 may also be an internal memory of a CPU used as the control unit 10. In an embodiment, the information processing apparatus 1 may store, in the storage unit 50, various types of information necessary for prediction of the useful life of the PV module.

In FIG. 1, each of the input unit 20, the output unit 30, the communication unit 40, and the storage unit 50 may be built into the information processing apparatus 1 or may be provided external to the information processing apparatus 1.

In the following description, various calculations and/or processes performed by the information processing apparatus 1 according to an embodiment may be performed by the control unit 10. In the information processing apparatus 1 according to an embodiment, information necessary for various calculations and/or processes performed by the control unit 10 may be stored in the storage unit 50, may be acquired from the input unit 20, or may be received from the communication unit 40. In addition, in the information processing apparatus 1 according to an embodiment, results of various calculations and/or processes performed by the control unit 10 may be stored in the storage unit 50, may be output from the output unit 30, or may be externally transmitted from the communication unit 40.

Next, processes performed by the information processing apparatus 1 according to an embodiment will be described.
(Degradation and Useful Life of PV Module)

The information processing apparatus 1 according to an embodiment estimates the useful life of a PV module on the basis of predetermined information regarding the PV module. The useful life of the PV module is attributable to the degradation of the PV module, and thus, the degradation of the PV module will be described below.

For degradation of the PV module, degradation based on several points of view is expected. In addition, the degradation from each point of view is expected to involve several factors. In the present disclosure, "degradation of the PV module" means a phenomenon by which the electric power output obtained by photovoltaic generation by the PV module gradually reduces over time and then rapidly decreases. As the factors of such degradation of the PV module, the applicants have found that ultraviolet light (hereinafter also referred to as "UV") and/or hygrothermal stress are involved. Thus, the information processing apparatus 1 according to an embodiment estimates the useful life of the PV module based on UV and/or hygrothermal degradation.

Figure 2:
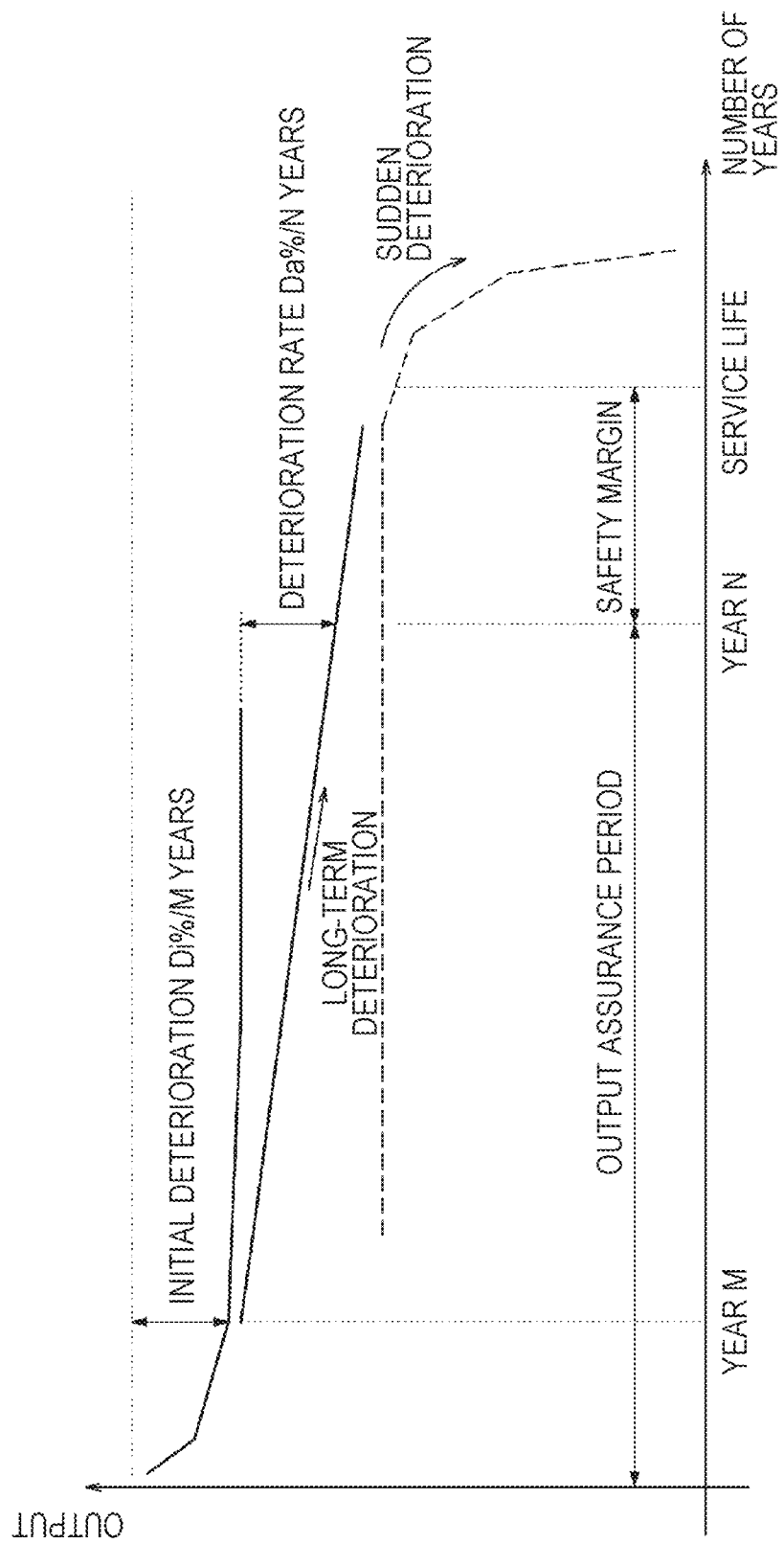
FIG. 2 illustrates degradation of a PV module.

FIG. 2 illustrates the degradation of a PV module. In FIG. 2, the horizontal axis represents time [years], and the vertical axis represents the output of the PV module by photovoltaic generation. That is, FIG. 2 illustrates a state in which the output of a conventional PV module decreases over time. As illustrated in FIG. 2, in a conventional PV module, an initial degradation of Di % occurs annually from the start of photovoltaic generation until Year M. In addition, as illustrated in FIG. 2, in the conventional PV module, a gradual annual degradation of Da % occurs annually. Subsequently, as illustrated in FIG. 2, in the conventional PV module, rapid degradation occurs at a certain time point (the time point reaching the useful life) as described above. Electric power by the photovoltaic generation of the PV module "rapidly decreases" as described above owing to the "rapid degradation" illustrated in FIG. 2. It is known that this rapid degradation is caused by acid that is generated in an encapsulant of the PV module owing to UV and/or hygrothermal stress.

In the PV module, a mode of gradual degradation over time and a mode of rapid degradation at a certain time point are not necessarily the same degradation mode. In the degradation caused by acid that is generated owing to UV and hygrothermal stress treated herein, almost no degradation serving as a main factor in the annual degradation is seen. Therefore, the annual degradation is expected to be degradation caused by, as a main factor, another degradation mode that is different from the degradation caused by acid owing to UV and hygrothermal stress. The rapid degradation described above is a mode of rapid degradation at a certain time point. The rapid degradation is degradation that rapidly appears at a certain time point by exceeding the annual degradation by the other degradation mode up to that time.

Next, to describe the above factors of the degradation of the PV module, the structure of the PV module will be described.

Figure 3:
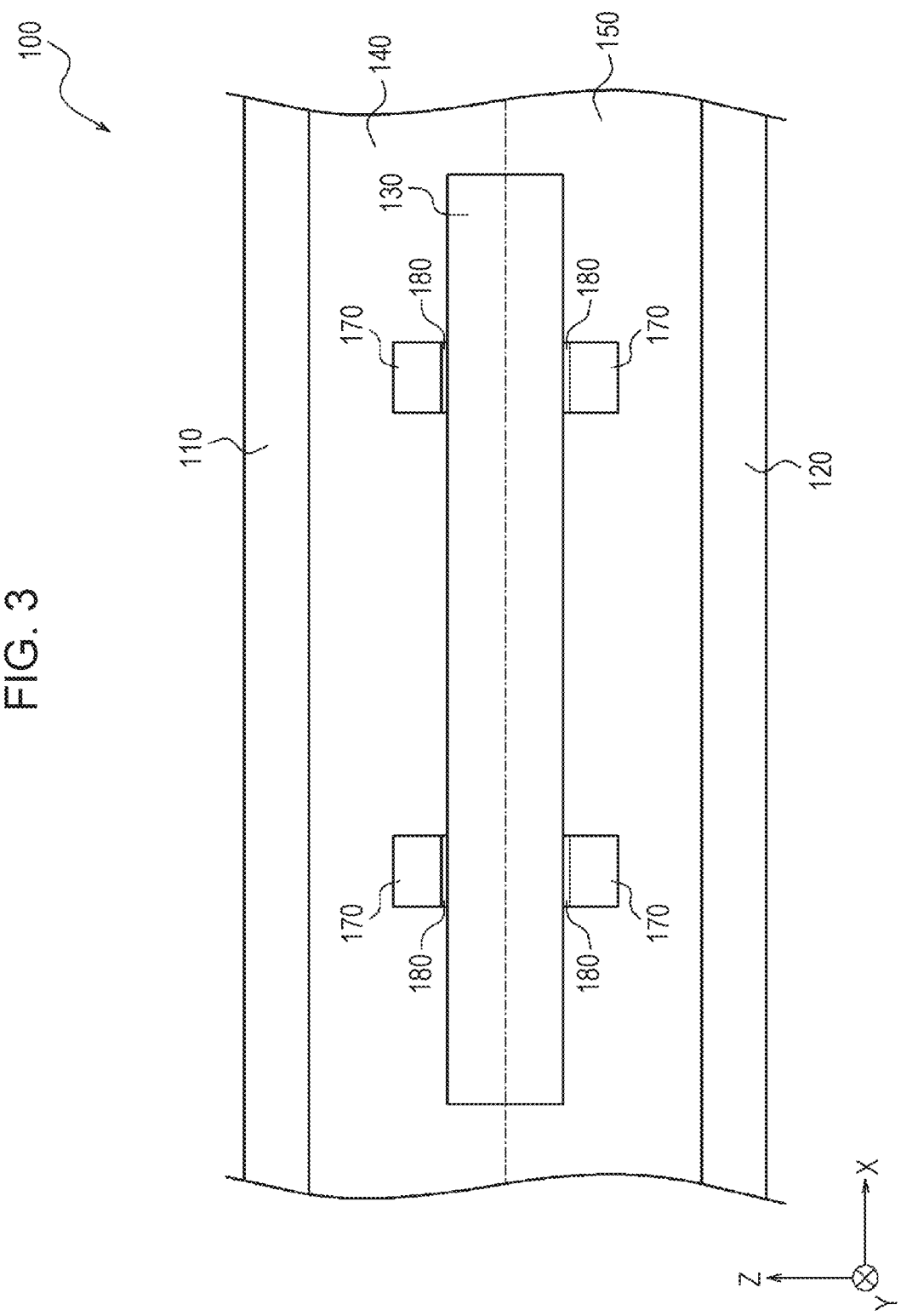
FIG. 3 illustrates the structure of a conventional PV module.

FIG. 3 illustrates the structure of the PV module. FIG. 3 illustrates a cross section of the PV module. FIG. 3 schematically illustrates a cross section of a conventional PV module as an example. The PV module illustrated in FIG. 3 has a thickness in the Z-axis direction as illustrated in FIG. 3. In the PV module illustrated in FIG. 3, the positive direction side of the Z-axis is also referred to as "front side", and the negative direction side of the Z-axis is also referred to as "back side". In FIG. 3, parts that are not related or weakly related to the above degradation of the PV module are omitted as appropriate.

As illustrated in FIG. 3, a PV module 100 includes a surface glass 110, a back sheet 120, and a photovoltaic cell 130. The surface glass 110 forms an incident surface for light such as sunlight. The surface glass 110 also provides a function as a surface protective material. The back sheet 120 provides a function as a back-surface protective material. The photovoltaic cell 130 is formed from a semiconductor such as silicon (Si). The photovoltaic cell 130 absorbs light energy and converts it to electricity.

The photovoltaic cell 130 is encapsulated by an encapsulant 140 on the front side and an encapsulant 150 on the back side between the surface glass 110 and the back sheet 120. In many PV modules, the encapsulant 140 and the encapsulant 150 are formed by using a copolymer of ethylene-vinyl acetate (EVA). For the surface glass 110, for example, a material with high light transmittance is used, such as super white glass, tempered glass, or heat-reflecting glass, with a thickness of about 2 mm to 5 mm. For the back sheet 120, for example, one type or two or more types of polymer material from among polypropylene and polyolefin or the like is used, and may further have an aluminum (Al) sheet between the polymer materials.

As illustrated in FIG. 3, the photovoltaic cell 130 includes electrodes 170 on the front side and on the back side of a semiconductor substrate formed of silicon or the like. The electrodes 170 are, for example, formed by using a metal such as silver (Ag) or aluminum (Al). Any desired number of electrodes 170 may be formed on at least one of the front side and the back side of the semiconductor substrate. As illustrated in FIG. 3, the electrodes 170 are formed on the semiconductor substrate with contact portions 180 interposed therebetween. In many PV modules, the contact portions 180 are formed with a thin glass layer. The electrodes 170 and the contact portions 180 are typically formed by printing a conductive paste such as glass-frit-containing silver on the semiconductor substrate and firing it. The electrodes 170 and the contact portions 180 may also be formed by using a film deposition technique such as sputtering or a plating method, and the contact portions 180 may be formed with the same material as the electrodes 170.

As described above, the degradation of the PV module 100 illustrated in FIG. 3 involves UV and/or hygrothermal stress. The degradation involving UV and/or hygrothermal stress in the PV module 100 is caused by the corrosion of the contact portions (glass layers) 180 formed between the electrodes 170 and the semiconductor substrate by acid that is generated in EVA owing to UV and/or hygrothermal stress. As the contact portions 180 between the electrodes 170 and the semiconductor substrate, a thin glass layer with a thickness of about 10 to 100 nm is formed. This glass layer functions as both electric bonding and mechanical bonding between the electrodes 170 of Ag and the semiconductor substrate of Si. In addition, since the thickness of this glass layer is thin, electrical connection between the electrodes 170 and the semiconductor substrate is not impaired. Corrosion by acid may occur in the electrodes 170 on both the front side and the back side of the photovoltaic cell 130. However, since almost no UV light enters the back side of the photovoltaic cell 130, mainly hygrothermal stress is involved at the electrodes 170 on the back side of the photovoltaic cell 130.

EVA forming the encapsulants 140 and 150 generates acid (mainly acetic acid) under UV and/or hygrothermal stress. Once this acid corrodes the glass layer forming the contact portions 180, the mechanical bonding function of the glass layer is lost. Even if a certain mechanical bonding function is maintained, the corrosion of the glass layers increases electrical resistance, and the electrical bonding function deteriorates. Then, once the mechanical and/or electrical bonding function of the contact portions 180 is lost, it is not possible to extract, from the Ag electrodes, photogenerated carriers generated in Si. In this manner, the photovoltaic characteristics of the PV module 100 degrade.

The corrosion of the glass layer forming the contact portions 180 can be directly confirmed through cross-sectional SEM observation, EPMA analysis, or the like on the contact portions 180. That is, the disappearance of the glass layer of the contact portions 180 (cavity between Ag and Si), the compositional change of the glass layer, and/or the like corresponding to the degree of corrosion can be observed. More simply, the corrosion of the glass layer can be determined by viewing an EL image of the PV module. That is, it is possible to observe the generation, and/or expansion, and the like, of a characteristic EL dark area corresponding to the degree of corrosion.

The electric power output characteristics by the photovoltaic generation of the PV module 100 rapidly decrease when UV and/or hygrothermal stress reaches a predetermined amount. This is a phenomenon caused by rapid corrosion of glass in the contact portions 180 as a result of an increase of the above-described acid. The time point at which the acetic acid concentration (the concentration of acetic acid molecules) in EVA becomes around $10^{19}/cm^3$ can be regarded as a guide as to the occurrence of such a phenomenon. Note that the concentration of acetic acid molecules means the number of acetic acid molecules in an EVA unit volume at 25° C. (298.15 K) at 1 atmospheric pressure. The state in which the electric power output characteristics by the photovoltaic generation of the PV module 100 rapidly decrease may be a state in which the PV module 100 has already reached the useful life.

(Prediction of Useful Life of PV Module)

Next, the principle of estimating, by the information processing apparatus 1 according to an embodiment, the useful life of the PV module based on UV and/or hygrothermal degradation will be described. Hereinafter, the prediction of the useful life of the PV module based on UV and/or hygrothermal degradation, performed by the information processing apparatus 1 according to an embodiment, will also be simply referred to as "prediction of the useful life" or "useful life prediction".

First, a basic principle for estimating the useful life will be described. The "useful life" predicted by the information processing apparatus 1 according to an embodiment may be, for example, the time from the start of the electric generation of the PV module until a rapid decrease of the electric power output characteristics when UV and/or hygrothermal stress reaches a predetermined amount. Hereinafter, a rough value of "useful life" predicted by the information processing apparatus 1 according to an embodiment is until a time point at which a fill factor (hereinafter also referred to as "FF characteristics") or generated electric power (hereinafter also referred to as "Pm characteristics") is reduced by 10% compared with an initial value. The initial value indicates the value before a useful life prediction test. However, the principle of the prediction of the useful life by the information processing apparatus 1 according to an embodiment may also be employed in a case where a rapid decrease in the electric power output characteristics is not confirmed at the time point at which the FF characteristics or Pm characteristics are reduced by 10% compared with the initial value. In this case, even if a rough value of the useful life is until the time point at which the FF characteristics or Pm characteristics are reduced by 20%, 30%, or the like compared with the initial value, the principle of the prediction of the useful life by the information processing apparatus 1 according to an embodiment holds in substantially the same manner. Here, the output characteristics of the PV module are measured in conformity with the IEC 60891 standard (or JIS C8914).

Next, a damp heat test performed in the prediction of the useful life will be described. As a method for the damp heat test, a PV module is placed in a thermo-hygrostat test apparatus that is set under predetermined temperature and humidity conditions, and thereby, the PV module is exposed in a predetermined atmosphere. As the temperature condition, a temperature range of 80 to 135° C. is used. As the humidity condition, a humidity range of the relative humidity 85 to 95% is used. The temperature condition and the humidity condition may be set in this manner as appropriate, and, for example, under conditions of a temperature of 85° C. and a humidity of 85%, the damp heat test can be performed. Then, after the PV module is extracted from the test apparatus every predetermined time period, the output characteristics of the PV module are measured. Then, the PV module is placed again in the test apparatus and is exposed in the predetermined atmosphere. By repeating this step, the time until the output characteristics of the PV module rapidly decrease is measured. In this case, the predetermined time period may be changed as appropriate. A long measurement interval may be set immediately after the start of the test, and, if a decrease in the output characteristics to a certain degree can be seen, a short measurement interval may be set. Here, the damp heat test is performed under two or more, preferably three or more, temperature conditions. Under three or more temperature conditions, it is possible to determine whether the relationship between the useful life and the temperature is a linear relationship in an Arrhenius plot. If the linearity is not obtained, the test can be performed by newly setting the temperature condition on the low-temperature side such that the linearity is obtained.

(Logic Flow of Useful Life Prediction)

Figure 4:
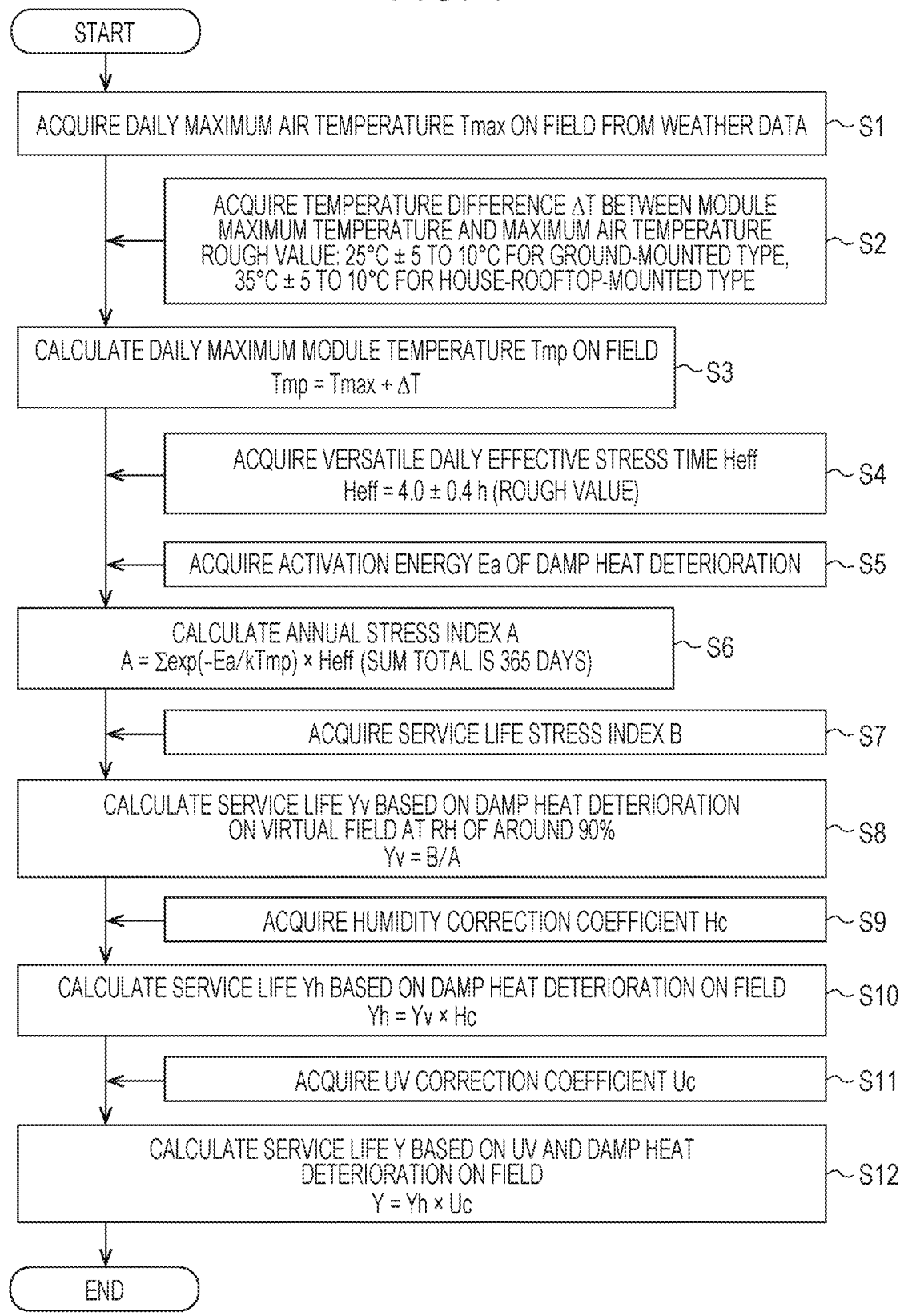
FIG. 4 illustrates a logic flow for useful life prediction according to an embodiment.

FIG. 4 illustrates a logic flow of useful life prediction according to an embodiment. FIG. 4 schematically illustrates a logic flow in a case where the information processing apparatus 1 according to an embodiment performs useful life prediction. Individual details will be described later. As illustrated in FIG. 4, the information processing apparatus 1 according to an embodiment may perform useful life prediction on the basis of the following logic flow.

That is, as illustrated in step S1 in FIG. 4, the control unit 10 of the information processing apparatus 1 acquires a daily maximum atmospheric temperature Tmax in the field. This may be acquired from weather data, for example.

As illustrated in step S2 in FIG. 4, the control unit 10 acquires $\Delta T$ (temperature difference between a module maximum temperature Tmp and the daily maximum atmospheric temperature Tmax). A rough value of this can be acquired if the module is not deployed in the field or temperature information of the module is unavailable. The rough value can be, for example, about 25° C.±(5 to 10) ° C. in a case of ground-mounting and about 35° C.±(5 to 10) ° C. in a case of rooftop-mounting. In addition, if the module is deployed in the field and the temperature information of the module is available, it may be acquired from actually measured data of the module maximum temperature Tmp and daily maximum atmospheric temperature data Tmax.

As illustrated in step S3 in FIG. 4, the control unit 10 calculates the daily maximum temperature Tmp (=Tmax+$\Delta T$) of the PV module in the field.

As illustrated in step S4 in FIG. 4, the control unit 10 acquires a daily effective stress time Heff that can be used in a versatile manner throughout a year. If the temperature information of the module in the field is unavailable, as a rough value, it is possible to set Heff=4.0±0.4 h. More preferably, if an annual average temperature of the daily maximum atmospheric temperature Tmax is represented as "Tmax annual average", it is possible to set Heff [h]=0.108× Tmax annual average [° C.]+1.7. Further preferably, it is possible to set Heff [h]=−0.00248×(Tmax annual average [° C.])$^2$+0.245×Tmax annual average [° C.]. If the module temperature in the field is available, Heff can be an annual median value of a daily effective stress time Neff, which differs from day to day throughout a year.

As illustrated in step S5 in FIG. 4, the control unit 10 acquires an activation energy Ea of hygrothermal degradation. This may be acquired from, for example, results of damp heat tests under two or more temperature conditions.

As illustrated in step S6 in FIG. 4, the control unit 10 calculates an annual stress index A (=Σ exp(−Ea/kTmp) ·Heff, the sum total is 365 days). In this case, Tmp is a value that may differ from day to day.

As illustrated in step S7 in FIG. 4, the control unit 10 acquires a useful life stress index B (=exp(−Ea/kTm)×τ). Here, Tm is the temperature of a damp heat test (the temperature of the module), and T is a useful life in the damp heat test (details thereof will be further described later).

As illustrated in step S8 in FIG. 4, the control unit 10 calculates a useful life Yv (=B/A) based on hygrothermal degradation on a virtual field at a relative humidity RH of around 90%.

As illustrated in step S9 in FIG. 4, the control unit 10 acquires a humidity correction coefficient Hc. In the following step S10, by using the humidity correction coefficient Hc, a useful life Yh (=Yv×Hc) based on hygrothermal degradation in the field is calculated. In step 10, although the humidity correction coefficient Hc is desirably used, if it is not used, calculation can be performed by setting Yh=Yv, and the useful life can be predicted with rough accuracy.

As illustrated in step S11 in FIG. 4, the control unit 10 acquires a UV correction coefficient Uc. In the following step S12, by using the UV correction coefficient Uc, a useful life Y (=Yh×Uc) based on UV and hygrothermal degradation in the field is calculated. In step 12, although the UV correction coefficient Uc is desirably used, if it is not used, calculation can be performed by setting Y=Yh, and the useful life can be predicted with rough accuracy.

Figure 5:
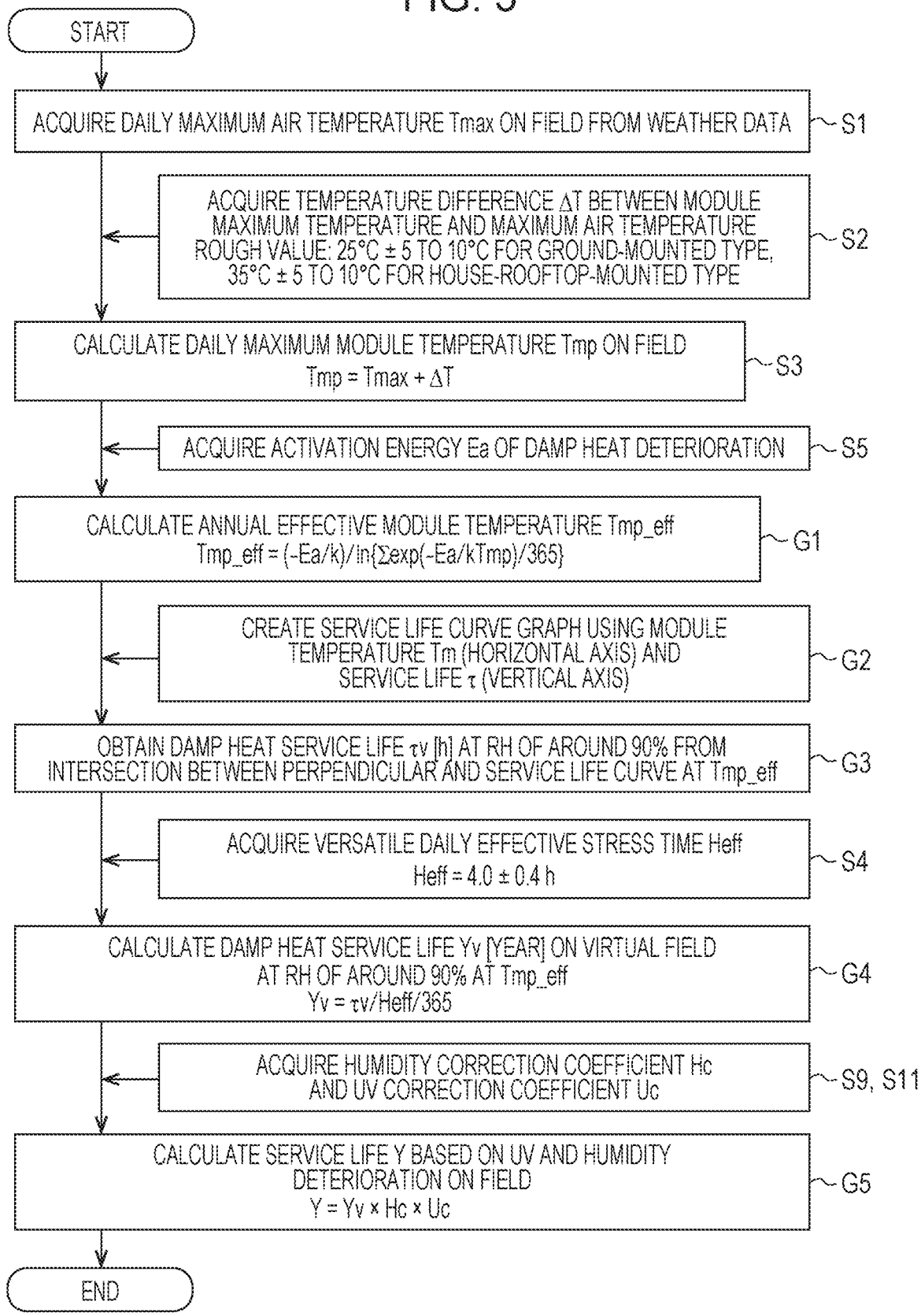
FIG. 5 illustrates another logic flow for useful life prediction according to an embodiment.

FIG. 5 illustrates a logic flow in a case where useful life prediction that is equivalent to the useful life prediction illustrated in FIG. 4 is performed by using a graph. Individual details will be described later. As illustrated in FIG. 5, the information processing apparatus 1 according to an embodiment may perform useful life prediction on the basis of the following logic flow.

That is, as illustrated in step G1 in FIG. 5, on the basis of results of processing from step S1 to step S3 and step S5 in FIG. 4, the control unit 10 of the information processing apparatus 1 calculates an in-field annual effective module temperature Tmp_eff (=(−Ea/k)/ln{Σ exp(−Ea/kTmp)/365}). Here, the sum total is 365 days.

As illustrated in step G2 in FIG. 5, the control unit 10 acquires a graph of a useful life curve illustrating a relationship between a module temperature Tm and a useful life T. The graph of the useful life curve may be depicted on the basis of, for example, results of damp heat tests under two or more temperature conditions. In this case, the useful life curve is depicted by using a relationship of exp(−Ea/kTm1)×τ1=exp(−Ea/kTm2)×τ2.

As illustrated in step G3 in FIG. 5, on the basis of results of processing in step G1 and step G2, the control unit 10 calculates a useful life τv based on hygrothermal degradation on a virtual field at a relative humidity RH of around 90% at a temperature of Tmp_eff.

As illustrated in step G4 in FIG. 5, on the basis of results of processing in step G3 and step S4 illustrated in FIG. 4, the control unit 10 calculates a number of useful life years Yv based on hygrothermal degradation on a virtual field at a relative humidity RH of around 90%.

As illustrated in step G5 in FIG. 5, on the basis of results of processing in step G4 and steps S9 and S11 illustrated in FIG. 4, the control unit 10 calculates a number of useful life years Y (=Yv×Hc×Uc) based on UV and hygrothermal degradation in the field.

Details of processing in the logic flows in FIG. 4 and FIG. 5 will be described below.

(Number of Useful Life Years Y)

On the basis of predetermined information regarding a PV module, the information processing apparatus 1 according to an embodiment estimates, as the useful life of the PV module, for example, the number of useful life years Y illustrated in the following Formula (1).

Number of useful life years Y=(useful life stress index B/annual stress index A)×humidity correction coefficient Hc×UV correction coefficient Uc  Formula (1)

Here, the number of useful life years Y means the number of useful life years of the PV module based on UV and/or hygrothermal degradation in the field. The number of useful life years Y is a value that may differ depending on an environment and/or a mounting style (ground-mounting, rooftop-mounting, etc.) of the place where the PV module is deployed even if the specifications of the PV module are the same. That is, the number of useful life years Y is a value dependent on conditions (environment conditions and/or mounting style conditions) in the field where the PV module is deployed.

The control unit 10 of the information processing apparatus 1 according to an embodiment can obtain the number of useful life years based on hygrothermal degradation on a virtual field at a relative humidity RH of around 90% from (useful life stress index B/annual stress index A) on the right side of Formula (1). In addition, the control unit 10 of the information processing apparatus 1 according to an embodiment can multiply the above number of useful life years by the humidity correction coefficient Hc and the UV correction coefficient Uc, thereby calculating the number of useful life years Y based on UV and/or hygrothermal degradation in the field where the PV module is actually deployed. Here, humidity correction in the humidity correction coefficient Hc is correction that is performed in consideration of the humidity in the field. In addition, UV correction in the UV correction coefficient Uc is correction that is performed in consideration of the influence of UV light in the field. The concept of each element for calculating the number of useful life years Y illustrated in Formula (1) will be described below.

(Useful Life Stress Index B)

The useful life stress index B in Formula (1) is an index indicating an amount of hygrothermal stress of a PV module until the useful life of a PV module. The useful life stress index B can be determined by performing a damp heat test. The useful life stress index B is an index corresponding to an amount of hygrothermal stress until the PV module reaches the useful life (output characteristics rapidly decrease) and is expressed as in the following Formula (2).

Useful life stress index B=exp(−Ea/kTm)×T  Formula (2)

Here, Ea is the activation energy [J] of hygrothermal degradation, k is the Boltzmann constant, Tm is the temperature [absolute temperature K] of the PV module, and T is a useful life [h] in a damp heat test. Hereinafter, the temperature of the PV module will be also simply referred to as "module temperature". In Formula (2), the term of the exp function is equivalent to exp(−Ea/(k×Tm)).

In Formula (2), exp(−Ea/kTm) indicates an index corresponding to a stress amount per unit time. By multiplying the above exp(−Ea/kTm) by the useful life T, the useful life stress index B is calculated as an index corresponding to the total stress amount until the useful life. Here, the damp heat test is typically performed at a relative humidity of around 90% (about 85% to 95%). Therefore, the useful life stress index B calculated here is a value assuming a relative humidity of around 90%.

In Formula (2), the activation energy Ea of hygrothermal degradation can be calculated according to the following Formula (3) by performing damp heat tests under two or more temperature conditions.

exp(−Ea/kT1)×τ1=exp(−Ea/kT2)×τ2  Formula (3)

Here, T1 and T2 are temperature conditions in the respective damp heat tests, and τ1 and τ2 are useful lives obtained through the respective damp heat tests.

For a PV module using conventional EVA (EVA 1) with addition of an ultraviolet absorber, a PV module using improved EVA (EVA 2) with addition of the ultraviolet absorber, and a PV module using improved EVA (EVA 3) without addition of the ultraviolet absorber, which will be described later, specific values of these are indicated as follows. The useful lives obtained in damp heat tests at a temperature of 95° C. and a humidity of 95% are 2200 hours for EVA 1, 6500 hours for EVA 2, and 6000 hours for EVA 3. The useful lives obtained in damp heat tests at a temperature of 125° C. and a humidity of 95% are 450 hours for EVA 1, 950 hours for EVA 2, and 950 hours for EVA 3. Activation energies Ea of hygrothermal degradation are 0.668 eV for EVA 1, 0.810 eV for EVA 2, and 0.776 eV for EVA 3. Ea [eV] and Ea [J] are in a relationship of Ea [J]=q·Ea [eV]. Here, q is an electronic elementary charge and is, specifically, q=1.6×10$^{-19}$ [C].

Each damp heat test performed here is preferably performed until output characteristics of the PV module rapidly decrease (reach the useful life). Specifically, for example, the damp heat test may be performed until the FF characteristics of the PV module are reduced by 10% compared with the initial value. In addition, in each damp heat test performed here, a degradation mode of the PV module is preferably confirmed to be the same. Whether the degradation mode is the same can be confirmed by examining V-I characteristics of the PV module, an EL image pattern, the acetic acid concentration in EVA, or the like.

(Annual Stress Index A)

The annual stress index A in Formula (1) is an index indicating an amount of hygrothermal stress of a PV module for a year in the field. As will be described later, the annual stress index A is an index indicating an amount of hygrothermal stress for a year on a virtual field at a relative humidity of around 90%. The annual stress index A is expressed as in the following Formula (4).

$$\text{Annual stress index } A = \int \exp(-Ea/kTm) dt \qquad \text{Formula (4)}$$

Here, the integral interval is one year.

In Formula (4), when dt is discretized as $\Delta t$, the annual stress index A is expressed as in the following Formula (5).

$$\text{Annual stress index } A \approx \int \exp(-Ea/kTm) \Delta t \qquad \text{Formula (5)}$$

Here, the sum total interval is one year.

In Formula (5), $\Delta t$ may be a 1-minute interval or a 1-hour interval. The applicants have confirmed that, even if $\Delta t$ is calculated by using 1-hour interval data, there is no problem with accuracy. Therefore, in the following description, $\Delta t$ is a 1-hour interval. In this case, $\Delta t=1$ [h], and Formula (5) is expressed as in the following Formula (6).

$$\text{Annual stress index } A \approx \Sigma \exp(-Ea/kTm) \qquad \text{Formula (6)}$$

Here, the sum total interval is one year at 1-hour intervals. Tm is a value that may differ from hour to hour. In addition, in a case of calculating $\Delta t$ by using 1-minute interval data, in Formula (6), by setting $\Delta t=1/60$ [h], the sum total interval may be one year at 1-minute intervals.

The annual stress index A calculated here is a value assuming a virtual field at a relative humidity of around 90%. To estimate the useful life in a humidity range on an actual field, humidity correction is necessary. Humidity correction will be further described later.

As illustrated in Formula (5) and Formula (6), to calculate the value of the annual stress index A, 1-hour interval data of the module temperature Tm is necessary. In a state in which a photovoltaic generation system including the PV module is already deployed in the field, if data of the module temperature is acquired for one year at 1-hour intervals, according to the above calculation, the value of the annual stress index A can be calculated.

On the other hand, in a state in which a photovoltaic generation system including the PV module has not been deployed in the field yet, it is not possible to calculate the value of the annual stress index A according to the above calculation formula. However, it is extremely beneficial if, before the photovoltaic generation system is actually deployed in the field, the useful life of the PV module in a case of being deployed in the field can be predicted. Even if the photovoltaic generation system is already deployed in the field, it is expected that data of the module temperature is unacquirable (or unavailable). Even in such a case, it is also extremely beneficial if the useful life of the PV module in a case of being deployed in the field can be predicted.

Therefore, the information processing apparatus 1 according to an embodiment enables calculation of the value of the annual stress index A even if data of the module temperature is not acquired for one year at 1-hour intervals. The principle of such calculation will be described below.

Generally, at an excessively large number of locations over the world, weather data is measured and accumulated on a daily basis. For example, various types of data can be acquired on the website of Japan Meteorological Agency. Specifically, it is possible to acquire atmospheric temperature data of each hour at each location, atmospheric temperature data on a daily basis at each location (minimum atmospheric temperature, average atmospheric temperature, maximum atmospheric temperature, and the like), and data of the average atmospheric temperature on a monthly basis (monthly average value of daily minimum atmospheric temperature, monthly average value of daily average atmospheric temperature, monthly average value of daily maximum atmospheric temperature, and the like).

Among the above pieces of data, if the atmospheric temperature data of each hour is used, the module temperature Tm of each hour can be expressed as in the following Formula (7).

$$\text{Module temperature } Tm \text{ of each hour} = \text{atmospheric temperature } T + \Delta T \qquad \text{Formula (7)}$$

Here, $\Delta T$ is a difference between the module temperature and the atmospheric temperature, and the atmospheric temperature T is a value of each hour.

To obtain the module temperature Tm of each hour by using Formula (7), data of $\Delta T$ of each hour is necessary. Thus, a method of estimating $\Delta T$ of each hour from weather information of each hour is considered. It is expected that $\Delta T$ is determined by the amount of solar radiation, the wind velocity, and/or the mounting style (ground-mounting, rooftop-mounting, etc.) of the PV module. Here, by using information called Nominal Operating Cell Temperature (NOCT), a rough value of $\Delta T$ in a case of ground-mounting is given as in the following Formula (8). NOCT that is described on specifications of a photovoltaic manufacturer may be used.

$$\Delta T = (NOCT - 20) \times S / 80 \qquad \text{Formula (8)}$$

Here, S is an incident light amount [mW/cm²].

As described above, the atmospheric temperature data of each hour is measured at a large number of locations and is in an available state. In contrast, locations where data of the incident light amount S of each hour in Formula (8) are currently limited both in Japan and abroad. Therefore, a method of appropriately estimating the annual stress index A at a given location for practical use without using the data of the incident light amount S of each hour is considered.

In an embodiment, to calculate the annual stress index A, instead of estimating $\Delta T$ of each hour as described above, giving a daily stress index by a sum total of 24 hours of each hour is considered. On such an assumption, the daily stress index is expressed as in the following Formula (9).

$$\Sigma \exp(-Ea/kTm) = \exp(-Ea/kTmp) \cdot \text{heff} \qquad \text{Formula (9)}$$

Here, the sum total interval of the left side is 24 hours of each hour, Tmp on the right side is the daily maximum temperature [absolute temperature K] of the PV module, and heff is the daily effective stress time [h]. The sum total interval of the left side may be at 1-minute intervals, in which case, heff is replaced by heff [h]×60. In this manner, heff may be a value obtained by dividing $\Sigma \exp(-Ea/kTm)$ by $\exp(-Ea/kTmp)$ according to Formula (9). Here, $\Sigma$ exp ($-Ea/kTm$) is a sum, over a predetermined time period, of the amount in proportion to daily hygrothermal stress of the PV module deployed in the field. In addition, $\exp(-Ea/kTmp)$ is an amount that is in proportion to hygrothermal stress per unit time at a maximum temperature of the PV module deployed in the field.

By using Formula (9), the annual stress index A can be expressed as in the following Formula (10).

$$\text{Annual stress index } A = \Sigma\{\exp(-Ea/kTmp)\cdot\text{heff}\} \quad \text{Formula (10)}$$

Here, the sum total interval is 365 days of each day. In addition, Tmp and heff are each a value that may differ from day to day.

In Formula (10), Tmp for 365 days of each day can be expressed as in the following Formula (11) if annual daily atmospheric temperature information in this area and information on the mounting style of the PV module are given.

$$Tmp = T\max + \Delta T \quad \text{Formula (11)}$$

Here, Tmax is data of the daily maximum atmospheric temperature, for 365 days of each day. The data of each day of the daily maximum atmospheric temperature Tmax can be acquired from, for example, annual weather data of Japan Meteorological Agency or the like. In addition, $\Delta T$ is a difference between the module temperature and the atmospheric temperature.

Figure 6:
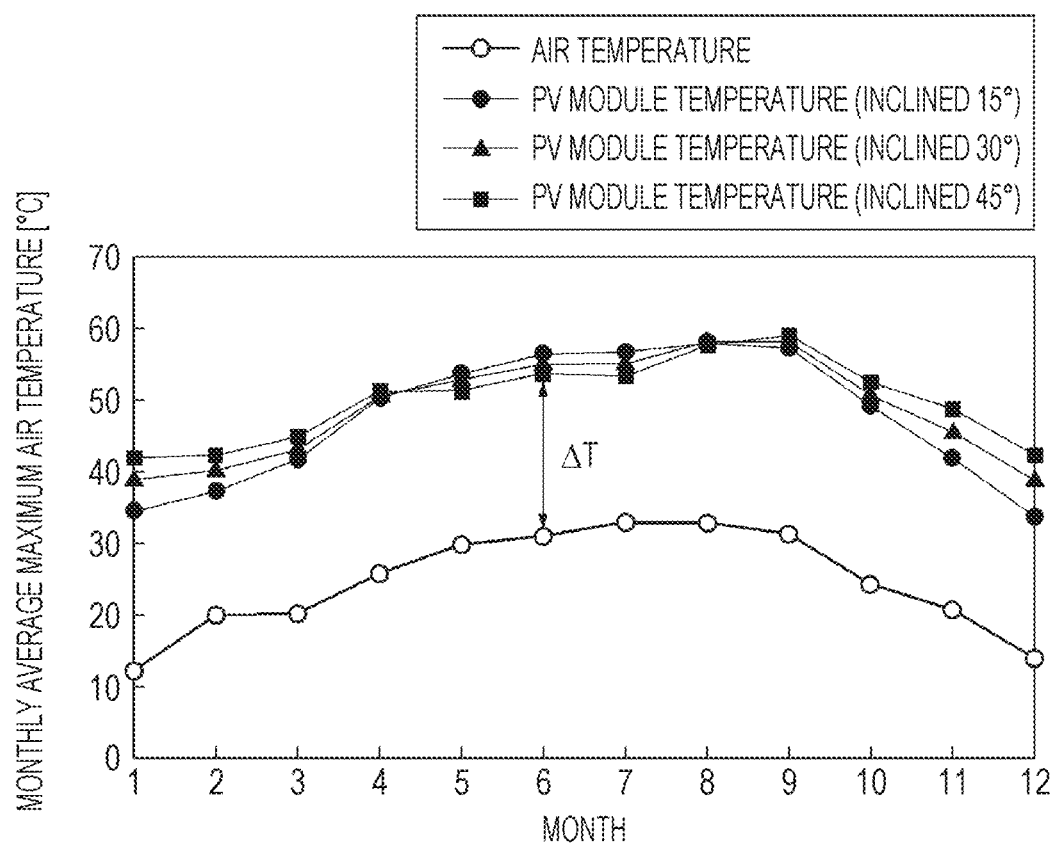
FIG. 6 illustrates an example of temperature data actually measured in the field.

FIG. 6 illustrates an example of annual data obtained by actually measuring, in the field, the daily maximum temperature Tmp of the PV module and the daily maximum atmospheric temperature Tmax. In FIG. 6, each black dot indicates the module temperature, and each white circle dot indicates the atmospheric temperature. In FIG. 6, the value of each month indicates a monthly average value of the daily maximum atmospheric temperature Tmax and the maximum temperature Tmp of the PV module. FIG. 6 indicates monthly average values of the maximum temperature Tmp of the PV module for three types of PV modules (inclined 15°, inclined 30°, and inclined 45°) with different inclining angles (mounting angles) from the ground surface in the field.

As illustrated in FIG. 6, if $\Delta T$ (=Tmp−Tmax) illustrated in Formula (11) is indicated as the monthly average value of each month, it is allowable to regard it as an almost constant value throughout a year. The value of $\Delta T$ tends to be about 25° C.±(5 to 10) °C. in a case of a PV module deployed on the ground and about 35° C.±(5 to 10) °C. in a case of a PV module deployed on the rooftop of a house. If $\Delta T$ indicated as the monthly average value is not regarded as an almost constant value throughout a year, it is possible to employ an annual median value of $\Delta T$ indicated as the monthly average value.

Figure 7:
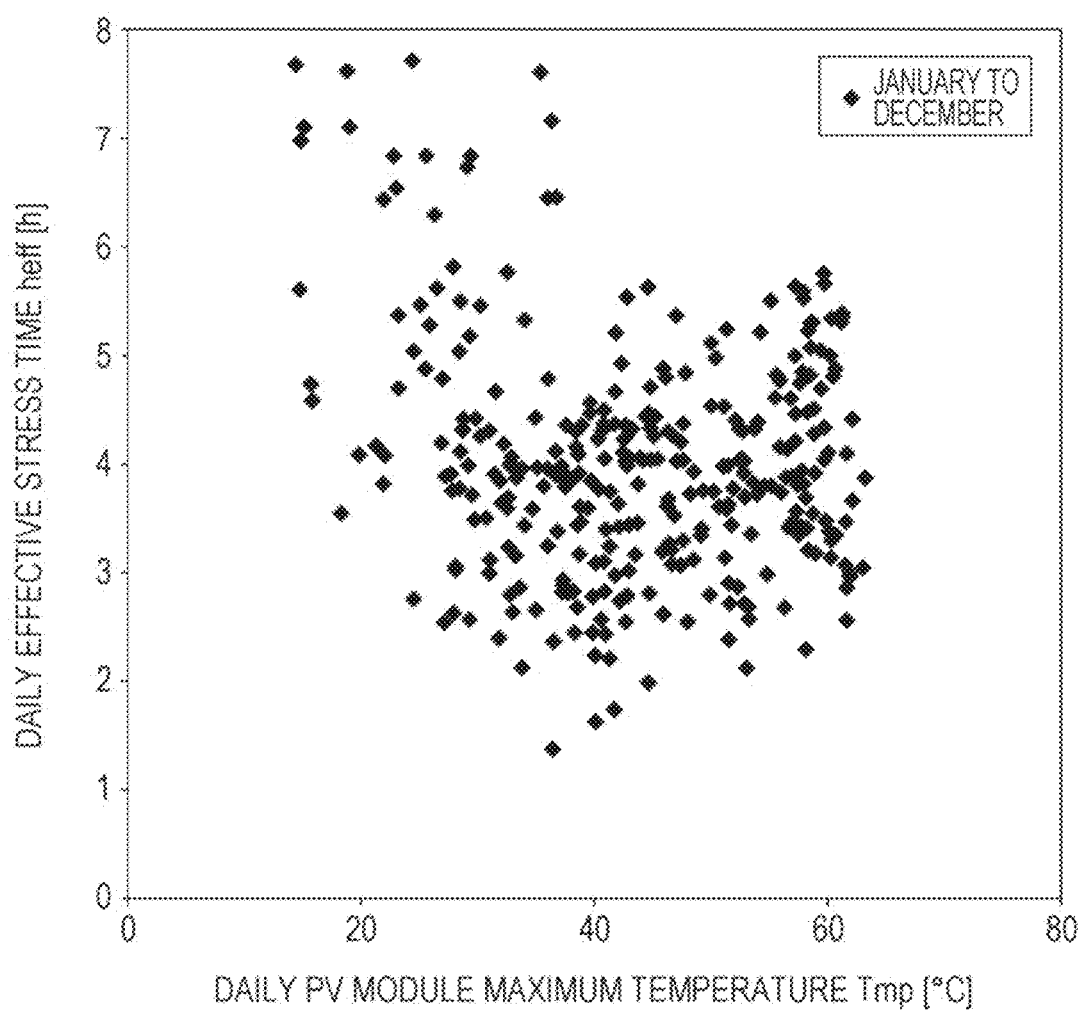
FIG. 7 illustrates an example of daily effective stress times.
Figure 8:
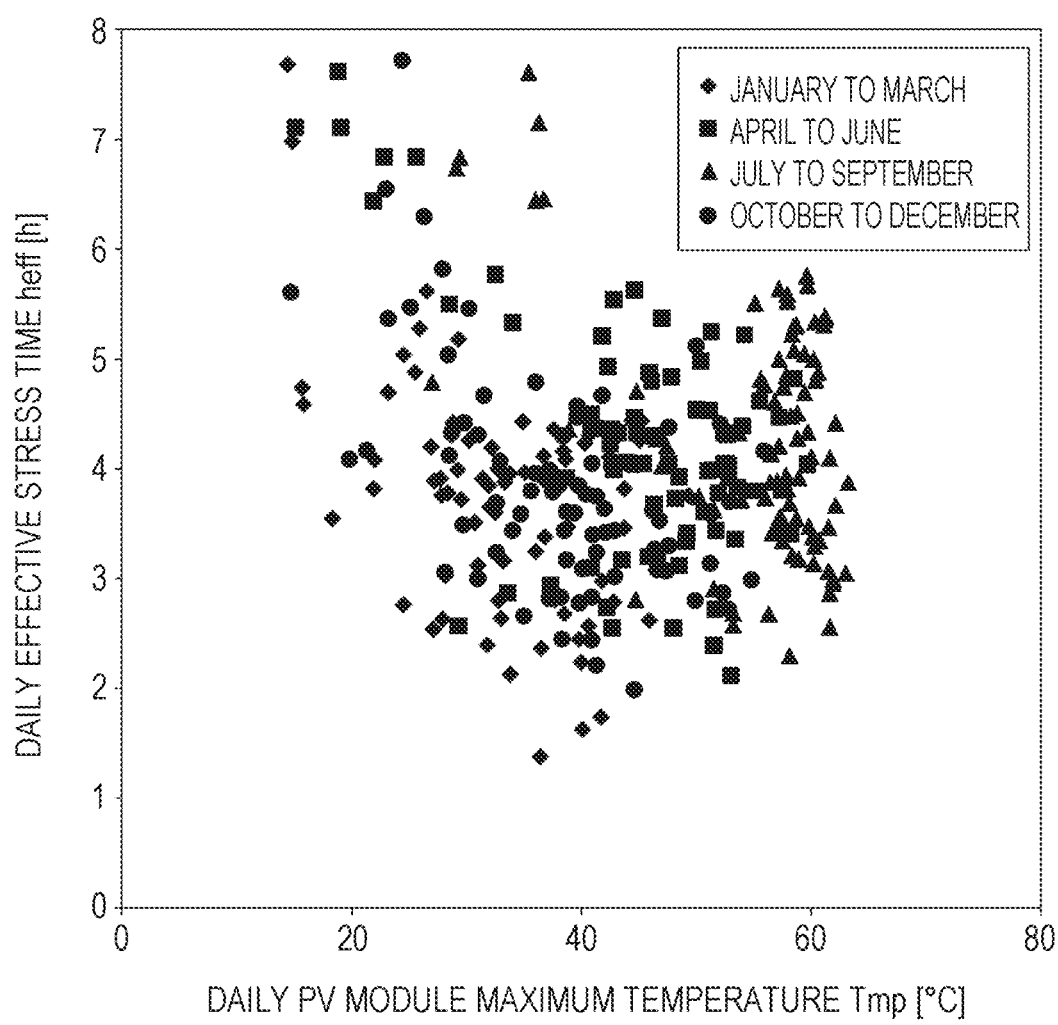
FIG. 8 further illustrates an example of daily effective stress times.

As described above, the daily effective stress time heff is a value that may differ every day throughout a year. FIG. 7 and FIG. 8 illustrate examples in which daily effective stress times heff used in Formula (9) are calculated from data obtained by actually measuring the PV module temperature Tm of each hour. FIG. 7 and FIG. 8 illustrate data based on results of acquiring, for a year, data of the module temperature of each hour in the field where a photovoltaic generation system is deployed. In FIG. 7 and FIG. 8, the horizontal axis represents the daily maximum temperature Tmp of the PV module, and the vertical axis represents the daily effective stress time heff. In FIG. 7, correlations between Tmp and heff are plotted all by the same dots from January to December. In FIG. 8, correlations between Tmp and heff are plotted by dots that differ every three months.

As illustrated in FIG. 7 and FIG. 8, the correlations between Tmp and heff are distributed in a wide range, reflecting variations of each day. On the other hand, as illustrated in FIG. 7 and FIG. 8, there is a coarse and dense distribution of the correlations between Tmp and heff. This is considered to be because of a positional relationship between the Sun and the Earth and the regularity (law) of a time period of rotation of the Earth and the like. In this manner, the distribution of the correlations between Tmp and heff is expected to indicate a certain trend.

Figure 9:
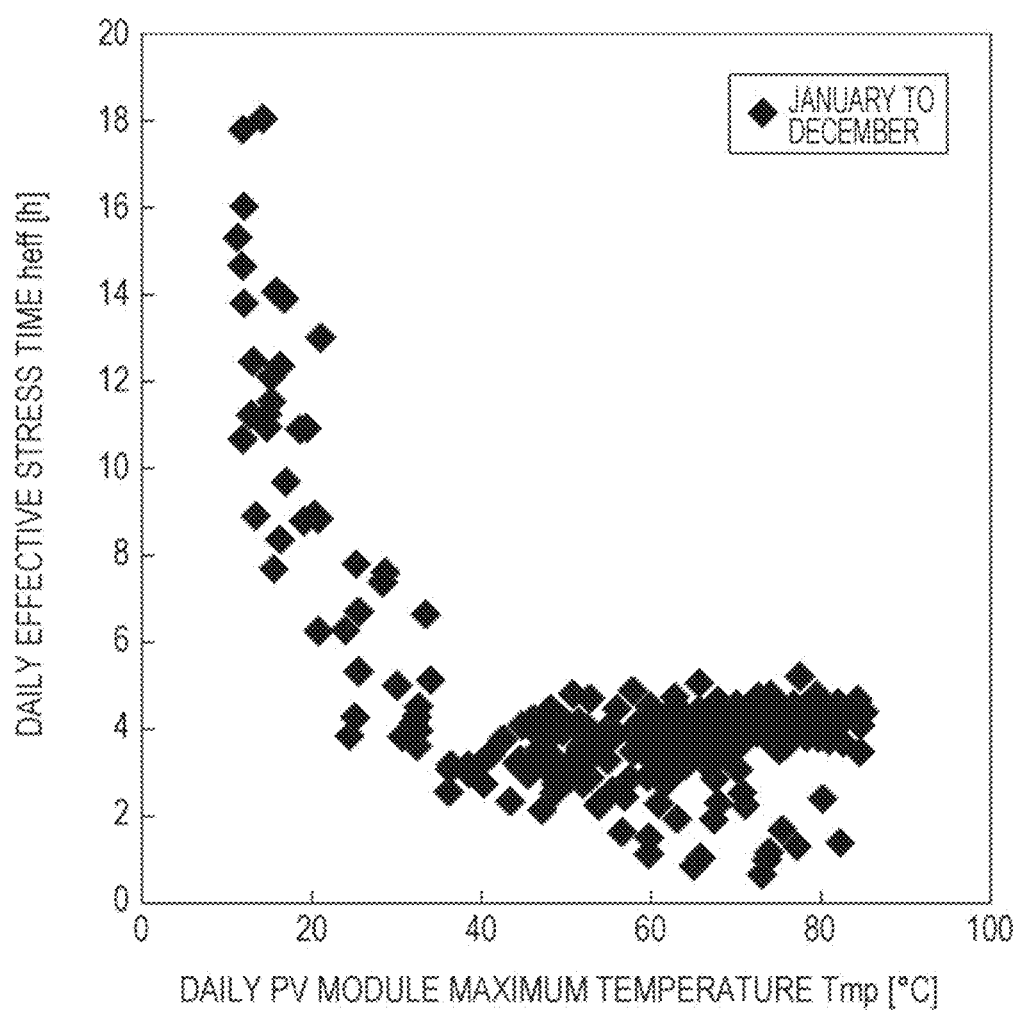
FIG. 9 further illustrates an example of daily effective stress times.

FIG. 9 illustrates correlations between the maximum temperature Tmp of the PV module for a year, which is 365 days, and the daily effective stress time heff in substantially the same manner in a field different from the field illustrated in FIG. 7 and FIG. 8. In FIG. 9, as in FIG. 7, the correlations between Tmp and heff are plotted all by the same dots from January to December. As illustrated in FIG. 9, the correlations between Tmp and heff are distributed in a wide range reflecting variations of each day. As in FIG. 7 and FIG. 8, also in FIG. 9, it can be confirmed that the distribution of the correlations between Tmp and heff is sparse and dense.

The information processing apparatus 1 according to an embodiment sets the daily effective stress time Heff, which is a constant value (versatile value) throughout a year, instead of the daily effective stress time heff, which differs from day to day throughout a year, to calculate the annual stress index A more easily. Such calculation will be described below.

The information processing apparatus 1 according to an embodiment calculates the annual stress index A by using the following Formula (12).

$$\Sigma\{\exp(-Ea/kTmp)\cdot\text{heff}\} = \text{Heff}\cdot\Sigma \exp(-Ea/kTmp) \quad \text{Formula (12)}$$

Here, the sum total interval is 365 days on a daily basis. In addition, Tmp and heff are each a value that may differ from day to day.

By using Formula (12), the annual stress index A can be expressed as in the following Formula (13).

$$\text{Annual stress index } A = \text{Heff}\cdot\Sigma \exp(-Ea/kTmp) \quad \text{Formula (13)}$$

Here, the sum total interval is each day of 365 days of each day. In addition, Tmp is a value that may differ from day to day, but Heff is a constant value (versatile value) throughout a year. As described above, if the daily effective stress time Heff, which can be used throughout a year, can be set appropriately, the calculation of the annual stress index A becomes very easy.

As a result of considering the value of Heff that can reproduce the annual stress index A with high accuracy, the applicants have found that the above annual median value of the daily effective stress time heff is preferably used. FIG. 10 illustrates an example of Heff (i.e., the annual median value of the daily effective stress time heff) [h] calculated for four fields. As illustrated in FIG. 10, for example, in an example of a PV module deployed in Chiba Prefecture, by setting the value of Heff to 4.4 h, the annual stress index A could be reproduced with high accuracy. In addition, for example, in an example of a PV module deployed in Yamanashi Prefecture, by setting the value of Heff to 4.0 h, the annual stress index A could be reproduced with high accuracy. In addition, also in examples of PV modules deployed in California and Los Alamos, substantially the same reproductivity could be confirmed.

That is, by acquiring, for a year, data of the module temperature of each hour on four fields illustrated in FIG. 10, the applicants have obtained each value of the annual stress index A accurately. Then, the applicants have calculated the annual stress index A by using Heff illustrated in FIG. 10 on each of the four fields. As a result, the applicants have confirmed that the value of the annual stress index A calculated by using Heff on each field is reproduced with practically sufficient accuracy.

In addition, the applicants have inspected dependency of the above Heff on Ea. As a result, the applicants have also confirmed that the range of variation of Heff falls within about ±10% with a range of variation of Ea=about 0.8 eV±0.1 eV.

From the above results, the information processing apparatus 1 according to an embodiment can use the following Formula (14) as a rough value of the daily effective stress time Heff throughout a year, which can be used in a versatile manner.

Daily effective stress time $Heff$ (constant value throughout a year)=4.0 h±0.4 h (±10%)      Formula (14)

In particular, Formula (14) can be used effectively in Japan.

The applicants have inspected annual information of the PV module temperature and the atmospheric temperature in substantially the same manner further in Thailand as a fifth field in addition to the above four fields. As a result, a value of 5.8 h has been obtained for Heff, which is the annual median value of the daily effective stress time Neff that differs from day to day throughout a year. Furthermore, it has been confirmed that the following correlation can be found by examining a relationship between the values of Heff on the five fields and a Tmax annual average, which is an annual average value of the daily maximum atmospheric temperature. That is, as a linear function approximate equation, a correlation of Heff [h]=0.108×Tmax annual average [° C.]+1.7 has been found. In addition, as a quadratic function approximate equation, a correlation of Heff [h]=−0.00248×(Tmax annual average [° C.])$^2$+0.245×Tmax annual average [° C.] has been found. By using these correlation formulas, Heff with higher accuracy can be used in wide area including the outside of Japan. The values of the Tmax annual average, which is the annual average of the daily maximum atmospheric temperature, on the five fields are predicted to be 20.3° C., 19.7° C., 23.5° C., 15.6° C., and 38.1° C., in Chiba prefecture, Yamanashi prefecture, California, Los Alamos, and Thailand, respectively, from weather information and atmospheric temperature information of the locations around 2015.

By using the above value of Heff as a versatile rough value, the information processing apparatus 1 according to an embodiment can calculate the annual stress index A with practical accuracy even in a situation in which a photovoltaic generation system is not yet deployed. In addition, by using the above value of Heff as a versatile rough value, the information processing apparatus 1 according to an embodiment can calculate the annual stress index A with practical accuracy even in a situation in which data of the module temperature is unavailable.

As described above, the information processing apparatus 1 according to an embodiment can calculate the annual stress index A simply as in the following Formula (15).

Annual stress index $A \approx Heff \cdot \Sigma \exp(-Ea/kTmp)$      Formula (15)

Here, the sum total interval is 365 days of each day. Tmp is the daily maximum temperature of the PV module (=the daily maximum atmospheric temperature Tmax+ΔT) and is a value that may differ from day to day. In addition, Heff may be 4.0 h±0.4 as a versatile value and may be a constant value throughout a year. In this case, more preferably, if the annual average temperature of the daily maximum atmospheric temperature Tmax is expressed as the Tmax annual average, it is possible to set Heff [h]=0.108×Tmax annual average [° C.]+1.7. Further preferably, it is possible to set Heff [h]=−0.00248×(Tmax annual average [° C.])$^2$+0.245× Tmax annual average [° C.].

To perform the above calculation, the information processing apparatus 1 according to an embodiment employs, as atmospheric temperature information, the daily maximum atmospheric temperature (not the average atmospheric temperature). In addition, to perform the above calculation, the information processing apparatus 1 according to an embodiment employs, as Heff, the median value (not the annual average) of the daily effective stress time Neff for 365 days included in a year. In addition, to perform the above calculation, if monthly atmospheric temperature information is used, the information processing apparatus 1 according to an embodiment employs a monthly average value of the daily maximum atmospheric temperature (not a monthly maximum atmospheric temperature).

The information processing apparatus 1 according to an embodiment can estimate the number of useful life years Yv of the PV module based on hygrothermal degradation on a virtual field at a relative humidity RH of around 90% by using the following Formula (16).

Number of useful life years $Yv$ of $PV$ module useful life stress index $B$/annual stress index $A$      Formula (16)

Here, "number of useful life years Yv" of the PV module is the number of useful life years of the PV module based on hygrothermal degradation on a virtual field at a relative humidity RH of around 90%.

(Humidity Correction Coefficient Hc)

Next, the humidity correction coefficient Hc in Formula (1) will be described.

The useful life based on hygrothermal degradation in a humidity range in the field is obtained by multiplying the above number of useful life years Yv of the PV module by the humidity correction coefficient Hc as illustrated in the following Formula (17).

Number of useful life years $Yh$ of $PV$ module=number of useful life years $Yv$×humidity correction coefficient $Hc$      Formula (17)

Here, "number of useful life years Yh" of the PV module is the number of useful life years of the PV module based on hygrothermal degradation in the field. In addition, the value of the humidity correction coefficient Hc can be predicted from, for example, data obtained by an experiment performed by setting relative humidity conditions and information of the relative humidity on an actual field.

The manner of obtaining the humidity correction coefficient Hc will be described below in detail.

The useful life of a PV module deployed in the field based on hygrothermal degradation can be predicted in the following procedure. That is, first, results of a damp heat test at a relative humidity (RH) of about 90% (temperature-useful life curve, that is, the relationship between the PV module temperature Tm and the hygrothermal useful life T) is extrapolated by using the relationship "exp(−Ea/kTm)× T=constant" up to the temperature (in-field annual effective module temperature Tmp_eff) of the PV module deployed in the field. Here, the on-field annual effective module temperature Tmp_eff will be further described later in "Useful Life Prediction using Graph". Thus, the useful life based on hygrothermal degradation on a virtual field at RH of about 90% is obtained. Subsequently, the useful life based on hygrothermal degradation on the virtual field is multiplied by the humidity correction coefficient Hc.

Here, the humidity correction coefficient Hc can be predicted in the following procedure.

(1) In damp heat tests for which a plurality of relative humidities are set in advance, a correlation between the useful life based on hygrothermal degradation and a relative humidity is examined. If the relative humidity dependency of the useful life based on hygrothermal degradation is normalized and expressed based on the useful life based on hygrothermal degradation at a reference relative humidity (RH of around 90%), the normalized numeric value corresponds to the humidity correction coefficient Hc. From the above, a relationship between the relative humidity and the humidity correction coefficient Hc is obtained.

(2) The relative humidity at the temperature of the PV module deployed in the field is predicted. This is calculated considering information of the relative humidity at an atmospheric temperature (weather data) in an environment in which the PV module is deployed and temperature dependency of a saturated water vapor pressure.

(3) From the above (1) and (2), the humidity correction coefficient Hc for the PV module deployed in the field is obtained.

In the above (2), it is not possible to use the relative humidity at an atmospheric temperature (weather data) as it is. The atmosphere at a comparatively low temperature rises to a temperature corresponding to the module temperature by contacting the PV module that is at a comparatively high temperature. Moisture in EVA in the PV module is exchanging water molecules with water vapor in the atmosphere corresponding to the module temperature. That is, water molecules are entering and exiting between the atmosphere and EVA toward the thermal equilibrium state. Even if the atmosphere at a comparatively low temperature becomes the atmosphere at a comparatively high temperature, the absolute water vapor density ($\propto$ water vapor pressure) is almost unchanged. Specifically, the absolute water vapor density changes by only about 10% even considering a gas volume expansion effect.

However, since the increase of the saturated water vapor pressure in accordance with temperature increase is large, the relative humidity decreases comparatively significantly. In a case of humidity correction by using the relative humidity, this point should be cared for. Therefore, in the above (2), it is preferable to clearly quantify a process of estimating the relative humidity at the temperature of the PV module deployed in the field. This is necessary for estimating the useful life of the PV module based on hygrothermal degradation in the field with high accuracy.

The procedure in the above (1) to (3) will be specifically described below.

First, the above (1) will be described. As an example, results of damp heat tests for which a plurality of relative humidities are set for a product of the PV module using conventional EVA will be described.

Figure 11:
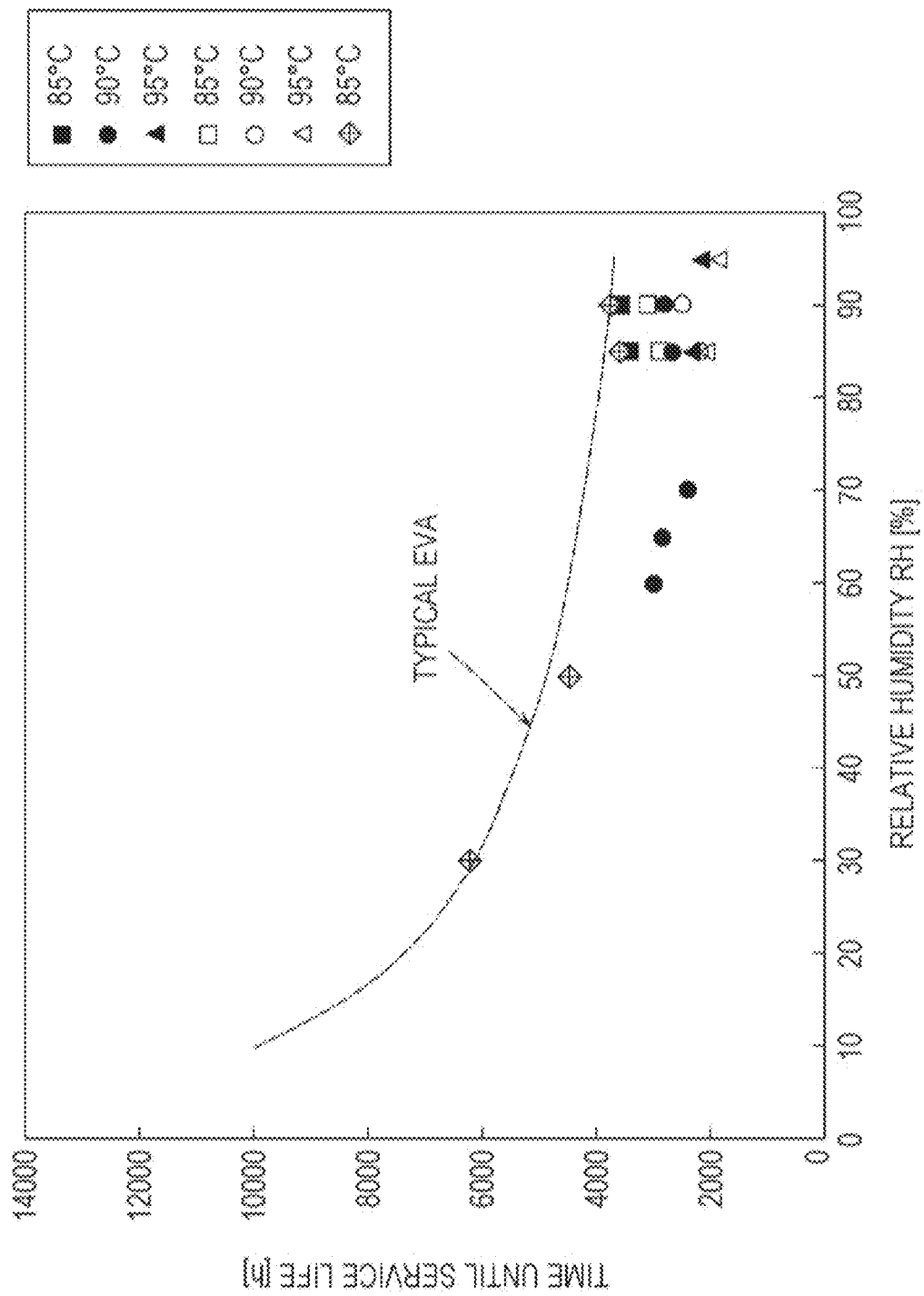
FIG. 11 is a graph illustrating humidity dependency of useful life based on hygrothermal degradation.

FIG. 11 is a graph illustrating a relationship between the relative humidity and the useful life based on hygrothermal degradation on the basis of the damp heat tests performed by using the PV module using conventional EVA. In FIG. 11, the horizontal axis represents the relative humidity RH [%], and the vertical axis represents the time [h] until the useful life of the PV module based on degradation. The time until the useful life of the PV module based on degradation may be, for example, a time until the FF characteristics are reduced by 10% compared with the initial value.

Here, in a wide range of the relative humidity including a region where the relative humidity is low, the prediction of the useful life based on hygrothermal degradation can be performed in a quantitative manner. For this purpose, the humidity dependency of the useful life based on hygrothermal degradation is approximated by the power law as illustrated in the following Formula (18).

$$\tau 2/\tau 1 = (RH2/RH1)^{-n} \qquad \text{Formula (18)}$$

Here, RH1 and RH2 are respective relative humidity conditions of respective damp heat tests, and $\tau 1$ and $\tau 2$ are useful lives obtained by the damp heat tests at the respective relative humidities. To confirm the humidity dependency of the useful life based on hygrothermal degradation in this manner, at least two damp heat tests at different humidities are necessary.

Upon analyzing the results of the damp heat tests for the product of the PV module using conventional EVA, it was found that the experiment results are favorably reproduced if n=about 0.44. In this case, it is possible to extrapolate even in a region where the relative humidity is low, where experiment data is insufficient. In FIG. 11, an approximate curve of the above power law is illustrated by a dotted and dashed line. Data from experiments performed with the widest relative humidity range is used as experimental data for the target of the power law approximation. In addition, in FIG. 11, the dots illustrate experiment results obtained under respective temperature conditions and humidity conditions. The same applies in FIG. 12, FIG. 15, FIG. 17, and FIG. 18 described later. In addition, as the humidity conditions of the damp heat tests, an experiment in which the relative humidity is at least less than or equal to 70%, preferably less than or equal to 50%, more preferably less than or equal to 30%, is preferably performed. In addition, not only in a case where the type of EVA differs, but also in a case where the encapsulant is formed of a different material, such as olefin, it is necessary to perform damp heat tests at different relative humidities and to confirm the humidity dependency of the humidity correction coefficient in each case.

Here, if the humidity dependency data of the useful life based on hygrothermal degradation is normalized by the useful life based on hygrothermal degradation at the reference relative humidity (RH of around 90%), the humidity correction coefficient Hc with respect to the relative humidity can be obtained.

Figure 12:
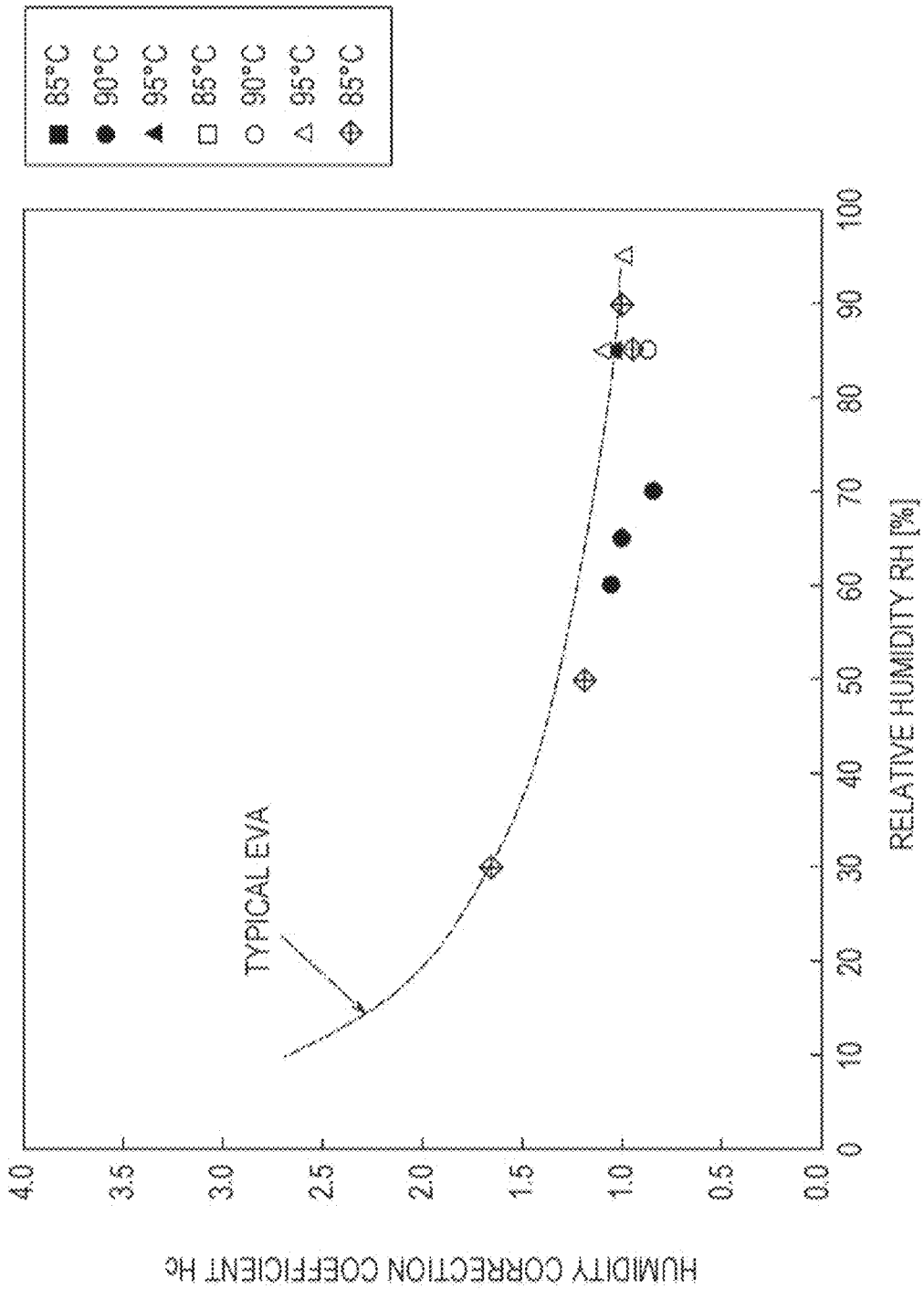
FIG. 12 is a graph illustrating an example in which the useful life based on hygrothermal degradation is normalized.

FIG. 12 is a graph illustrating an example in which the humidity dependency data of the useful life based on hygrothermal degradation is normalized by the useful life based on hygrothermal degradation at RH of 95%. In the above manner, the humidity correction coefficient Hc can be obtained in a wide relative humidity range.

Next, the above (2) will be described. A relative humidity RH(Tm) in the atmosphere at the module temperature Tm can be expressed as in the following formula (19) by using a relative humidity RH(T) in the atmosphere at an atmospheric temperature T, a saturated water vapor pressure Ps(T) at the atmospheric temperature T, and a saturated water vapor pressure Ps(Tm) at the module temperature Tm.

$$RH(Tm) \approx \{Ps(T)/Ps(Tm)\} \cdot RH(T) \qquad \text{Formula (19)}$$

Here, the relative humidity RH(T) at the atmospheric temperature T can be obtained from weather data.

In addition, Formula (19) can also be expressed as in the following Formula (20) by using, instead of the saturated water vapor pressures Ps(T) and Ps(Tm), a saturated water vapor density Ns(T) in the atmosphere at the atmospheric temperature T and a saturated water vapor density Ns(Tm) in the atmosphere at the module temperature Tm.

$$RH(Tm) \approx \{Ns(T)/Ns(Tm)\} \cdot RH(T) \quad \text{Formula (20)}$$

Here, Formula (20) is based on the physical law that the water vapor density is almost unchanged even if the temperature changes. That is, Formula (20) is based on the following Formula (21).

$$Ns(Tm) \cdot RH(Tm) \approx Ns(T) \cdot RH(T) \quad \text{Formula (21)}$$

Here, Formula (19), Formula (20), and Formula (21) are expressed by using "≈", not "=", because there is a difference of about 10% in accordance with gas volume expansion. However, even if there is an error of about 10%, the error has almost no influence on the discussion here.

Next, in daytime hours with the maximum temperature, the relative humidity RH in the atmosphere at the maximum temperature Tmp of the PV module can be expressed as in the following Formula (22).

$$RH(Tmp) = \{Ps(Tmax)/Ps(Tmp)\} \cdot RH(Tmax) \quad \text{Formula (22)}$$

Here, RH(Tmax) is the relative humidity in the atmosphere at the daily maximum atmospheric temperature. RH(Tmp) is the relative humidity in the atmosphere at the daily maximum temperature Tmp of the PV module. Ps(Tmax) is the saturated water vapor pressure at the daily maximum atmospheric temperature. Ps(Tmp) is the saturated water vapor pressure at the daily maximum temperature Tmp of the PV module.

In Formula (22), information on the relative humidity RH(Tmax) at the daily maximum atmospheric temperature is not obtained without humidity transition data on an hourly basis during the day. On the other hand, daily average RH information, which is a daily average relative humidity, is easily accessible. Thus, RH(Tmax) is expressed by the daily average RH by using the following Formula (23).

$$RH(Tmax) \approx \{Ps(T \text{ daily average})/Ps(Tmax)\} \cdot \text{daily average } RH \quad \text{Formula (23)}$$

Here, Ps(T daily average) is the saturated water vapor pressure at a daily average atmospheric temperature.

Formula (23) is expressed by using "≈", not "=", because RH(T daily average) daily average RH ("=" if RH(T daily average) is used). Here, RH(T daily average) is the relative humidity at the daily average atmospheric temperature. To obtain RH(T daily average), temporal transition information of the daily atmospheric temperature and the daily relative humidity is necessary and is not always accessible. Thus, here, the easily accessible daily average RH is used for expression.

By using Formula (22) and Formula (23), RH(Tmp) on a daily basis can be expressed as in the following Formula (24).

$$RH(Tmp) \approx \{Ps(T \text{ daily average})/Ps(Tmp)\} \cdot \text{daily average } RH \quad \text{Formula (24)}$$

Here, the daily maximum temperature Tmp of the PV module can be expressed as in the following Formula (25).

$$Tmp = Tmax + \Delta T = Tave + (\Delta T2 + \Delta T) \quad \text{Formula (25)}$$

In Formula (25), Tave is the daily average atmospheric temperature. In addition, ΔT2 is obtained by subtracting the daily average atmospheric temperature from the daily maximum atmospheric temperature. In this manner, the daily maximum temperature Tmp of the PV module and the daily average atmospheric temperature Tave can be said to basically have a substantially proportional relationship.

On the analogy of the above discussion on a daily basis, in the discussion on a yearly basis, it is considered to be expressed as in the following Formula (26) by using the annual effective module temperature Tmp_eff.

$$RH(Tmp\_eff) \approx \{Ps(T \text{ annual average})/Ps(Tmp\_eff)\} \cdot \text{annual average } RH \quad \text{Formula (26)}$$

Here, RH(Tmp_eff) is the relative humidity at the on-field annual effective module temperature Tmp_eff. An annual average RH is an annual average relative humidity. Ps(Tmp_eff) is the saturated water vapor pressure at the on-field annual effective module temperature Tmp_eff. Ps(T annual average) is the saturated water vapor pressure at an annual average atmospheric temperature.

In addition, RH(Tmp_eff) can also be expressed as in the following Expression (27) by using the relative humidity and the saturated water vapor pressure at the annual average temperature of the daily maximum atmospheric temperature Tmax.

$$RH(Tmp\_eff) \approx \{Ps(Tmax \text{ annual average})/Ps(Tmp\_eff)\} \cdot RH(Tmax \text{ annual average}) \quad \text{Formula (27)}$$

Here, RH(Tmax annual average) is the relative humidity at the annual average temperature of the daily maximum atmospheric temperature Tmax. Ps(Tmax annual average) is the saturated water vapor pressure at the annual average temperature of the daily maximum atmospheric temperature Tmax. The annual effective module temperature Tmp_eff will be further described later in "Useful Life Prediction using Graph".

It is preferable to make the humidity correction discussed here to ensure consistency with the discussion of the prediction of the useful life based on UV and hygrothermal degradation (the system composed of various quantities constituting a useful life prediction method according to the present disclosure). In this point, a relationship as in the following Formula (28) can be confirmed from temperature information of actual example cases of Chiba and Okinawa, which will be described later.

$$Tmax \text{ annual average} + \Delta T \approx Tmp\_eff \quad \text{Formula (28)}$$

Therefore, for the humidity correction in the useful life prediction, it is preferable to use the Tmax annual average, or the annual average value of the daily maximum atmospheric temperature Tmax, which is compatible with, that is, consistent with ΔT and Tmp_eff. Description will be continued with reference to Formula (27) below.

If an approximate value that serves as the rough value is wished to be obtained easily for the Tmp_eff, a definition different from step G1 in FIG. 5 described above or Formula (47) described later may be provided. That is, as illustrated in Formula (28), Tmp_eff and the Tmax annual average may be directly associated with each other without exp(−Ea/kTmp). In a case of such a definition, for example, as ΔT in Formula (28), the median value of ΔT for 365 days or an annual median value of a monthly average of ΔT may be used. If an annual average of ΔT is used as ΔT in Formula (28), Tmp_eff may be underestimated. Thus, it is not preferable to use the annual average of ΔT as ΔT in Formula (28). If a more accurate value is necessary as Tmp_eff, a value given by Formula (47) described later with an original definition can be used.

Here, a case where temperature data of the PV module is absent (i.e., a case where Tmp_eff is unknown) may be expected. In such a case, as ΔT, information of ΔT at a place where annual data of the PV module temperature and annual data of the atmospheric temperature are already obtained (field where the PV module is deployed) may be used. That is, in such a case, as ΔT, the median value of ΔT for 365 days or the annual median value of the monthly average of ΔT at a known place can be given. The rough value of ΔT may be 25° C.±(5 to 10) ° C. in a case of ground-mounting and about 35° C.±(5 to 10) ° C. in a case of rooftop-mounting.

Here, the calculation of RH(Tmax annual average) needs information of the relative humidity at the daily maximum atmospheric temperature. However, the information of the relative humidity at the daily maximum atmospheric temperature is generally not in a state of being obtained in the form of daily weather data. Thus, to obtain the information of the relative humidity at the daily maximum atmospheric temperature, data of an hourly relative humidity is retroactively searched. However, the data of the hourly relative humidity is currently obtained only at limited locations, such as about one location in each prefecture.

Thus, in an embodiment, the useful life may be predicted on a safer side in the following manner. That is, in an embodiment, RH(Tmp_eff) may be overestimated. Here, overestimating RH(Tmp_eff) corresponds to underestimating the useful life based on a useful life due to hygrothermal. Here, considering the general relationship according to which the annual average RH RH(Tmax annual average), the annual average RH is used by introducing RH'(Tmp_eff) defined in the following. Data of the daily average relative humidity and data of a monthly average relative humidity are easily accessible. Therefore, it is easy to obtain the annual average RH. Thus, using the annual average RH is convenient for the purpose of obtaining the humidity correction coefficient Hc.

The above RH'(Tmp_eff) is defined by the following Formula (29).

$$RH'(Tmp\_eff) \approx \{Ps(Tmax\ annual\ average)/Ps(Tmp\_eff)\} \cdot annual\ average\ RH \quad \text{Formula (29)}$$

Here, if Formula (27) and Formula (29) are compared with each other, a relationship as illustrated in the following Formula (30) is satisfied.

$$RH'(Tmp\_eff) \geq RH(Tmp\_eff) \quad \text{Formula (30)}$$

By using such RH', the useful life due to hygrothermal can be predicted on a safer side (underestimated). In the above manner, the procedure in the above (2) can be performed.

Next, the above (3) will be described. Considering the procedure in the above (1) and (2), (3) can be summarized as the following procedure. That is, the following procedure may be followed in order to perform humidity correction on the useful life based on hygrothermal degradation on a virtual field at RH of around 90% predicted from a damp heat test (RH=around 90%).

(i) First, the relative humidity in the atmosphere at the annual effective module temperature Tmp_eff is regarded as the above RH'(Tmp_eff). On the basis of this point of view, RH'(Tmp_eff) is obtained from information of the Tmax annual average, which is the annual average value of the daily maximum atmospheric temperature Tmax, the annual effective module temperature Tmp_eff, and the average relative humidity throughout a year (the annual average RH) (according to the above (2) procedure).

(ii) Next, the humidity correction coefficient Hc at RH' (Tmp_eff) is read from information of results of the damp heat test for which the relative humidity is set and the approximate curve representing the humidity dependency of the useful life based on hygrothermal degradation by the power law (according to the above (1) procedure). Here, the information of results of the damp heat test for which the relative humidity is set is information indicating the relationship between the relative humidity and the useful life based on hygrothermal degradation.

The procedure in each of the above (i) and (ii) in a case of a PV module using conventional EVA will be specifically described.

Figure 13A:
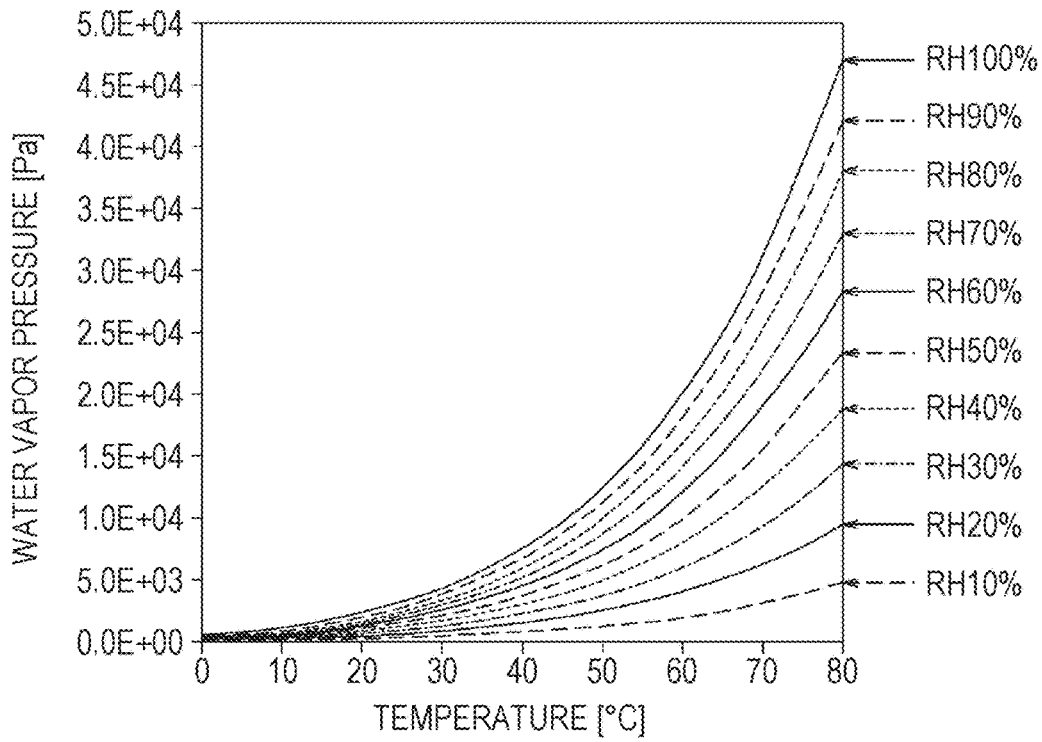
FIG. 13A and FIG. 13B are graphs illustrating temperature dependency and relative humidity dependency of water vapor pressure.
Figure 13B:
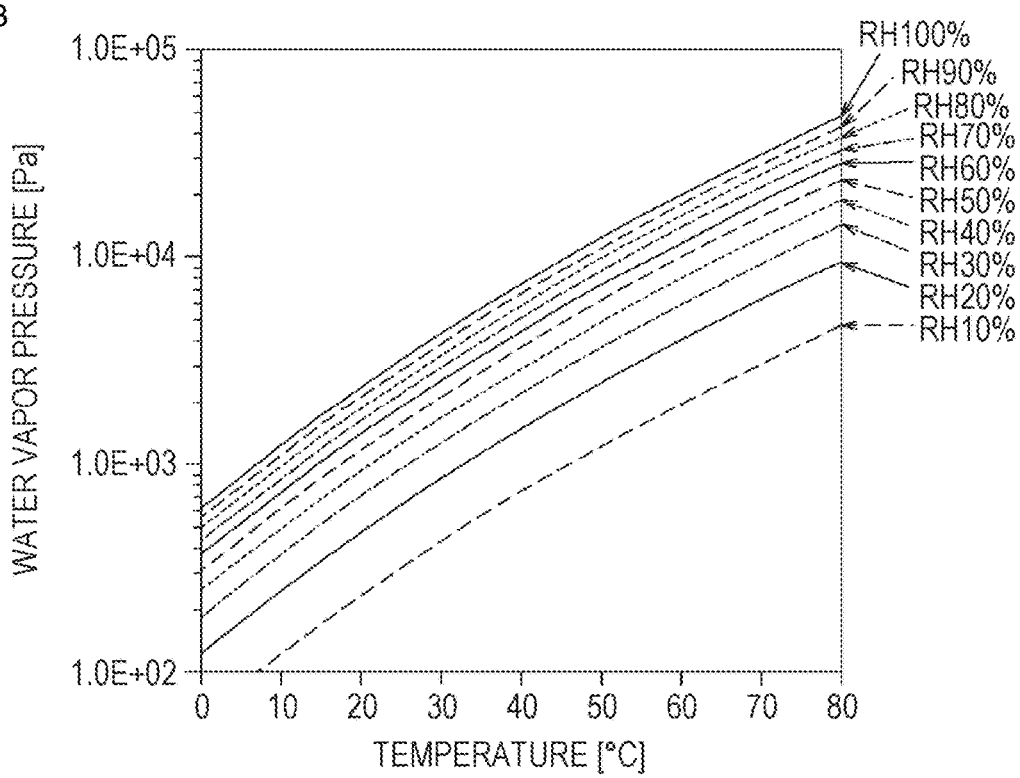

(i) Prediction of Relative Humidity RH'(Tmp_eff) in Atmosphere at Annual Effective Module Temperature Tmp_eff FIG. 13A and FIG. 13B are graphs illustrating temperature dependency and relative humidity dependency of the water vapor pressure. FIG. 13B displays the vertical axis of the graph in FIG. 13A as log. Here, as an example, a virtual model at a place where the Tmax annual average (the annual average maximum atmospheric temperature)=20° C. and the annual average relative humidity RH (T annual average) =70% in a case of ΔT=25° C. (ground-mounting) and a case of ΔT=35° C. (rooftop-mounting) will be described.

Figure 14:
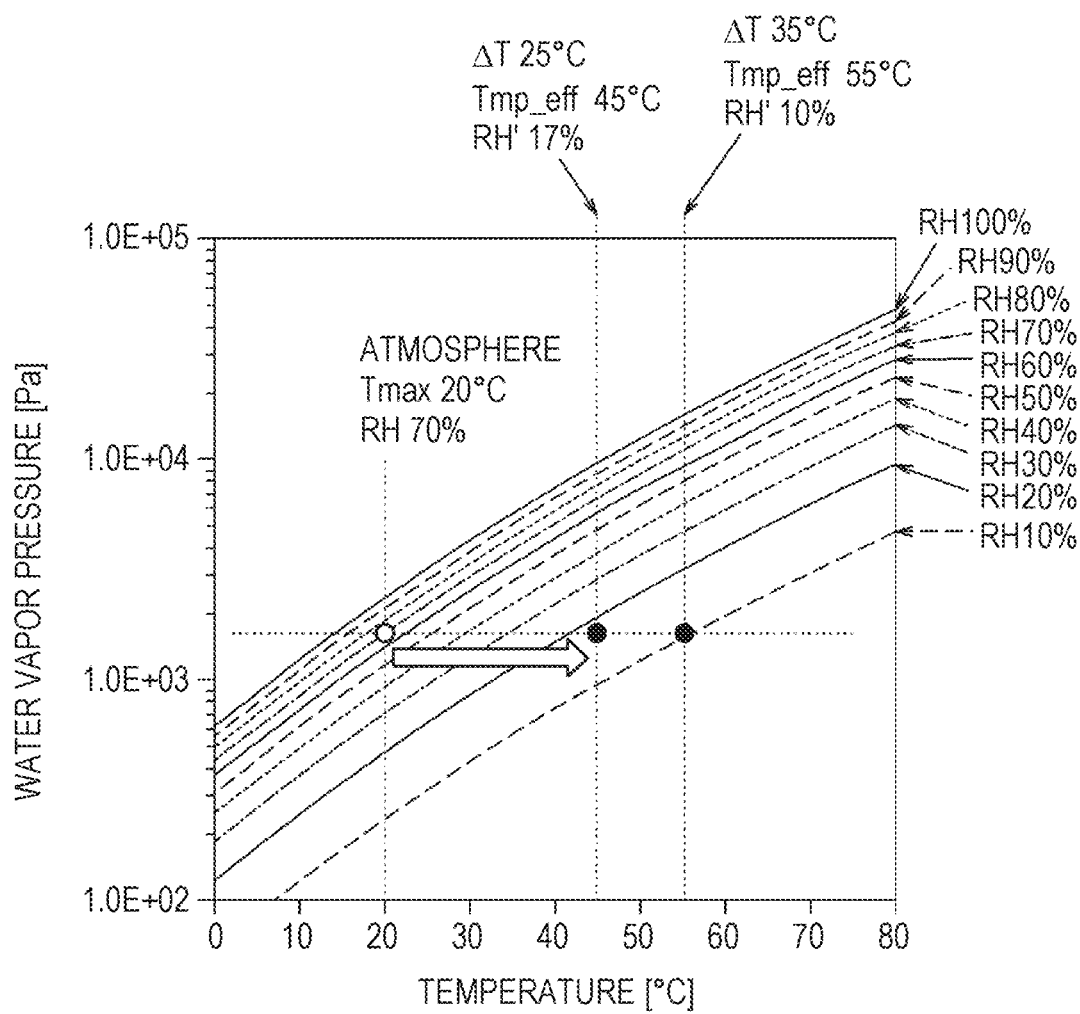
FIG. 14 illustrates a procedure for calculating a relative humidity RH at a module temperature.

FIG. 14 illustrates a procedure of calculating the relative humidity RH'(Tmp_eff) in the atmosphere at the annual effective module temperature. Even if the atmosphere at the Tmax annual average=20° C. contacts with the PV module and becomes the same temperature as the module temperature at an effective temperature of 45° C. or 55° C., as described above, the water vapor pressure itself is almost unchanged. On the basis of such a physical law, in FIG. 14, the relative humidity RH'(Tmp_eff) in the atmosphere at the annual effective module temperature is calculated as RH'=17% or RH'=10% in each case. That is, at the Tmax annual average=20° C., if ΔT=25° C. (Tmp_eff=45° C.), RH'(Tmp_eff)=17% is obtained. At the Tmax annual average=20° C., if ΔT=35° C. (Tmp_eff=55° C.), RH'(Tmp_eff)=10% is obtained.

(ii) Reading Humidity Correction Coefficient Hc at RH' (Tmp_eff)

The humidity correction coefficient Hc can be read from the graph illustrating the above relationship between the relative humidity and the humidity correction coefficient Hc.

Figure 15:
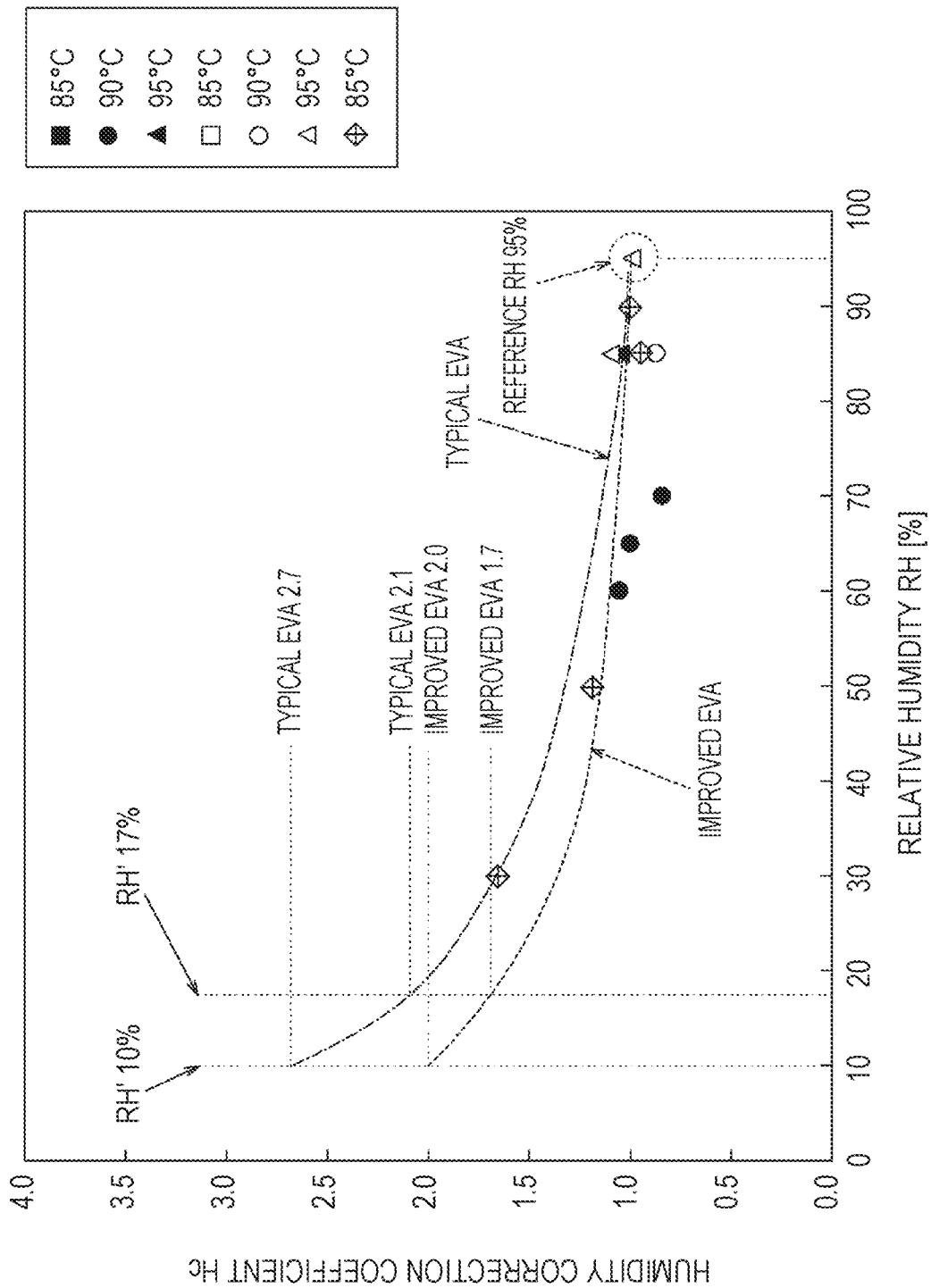
FIG. 15 is a graph illustrating an example of a relationship between relative humidity and a humidity correction coefficient Hc.

FIG. 15 is a graph illustrating an example of the relationship between the relative humidity and the humidity correction coefficient Hc. In FIG. 15, the cases where RH'=17% and RH'=10% are illustrated. From FIG. 15, it is possible to read, as the humidity correction coefficient Hc in a case of using conventional EVA, 2.1 if RH'=17% and 2.7 if RH'=10%. In addition, FIG. 15 also describes a case of improved EVA.

Figure 16:
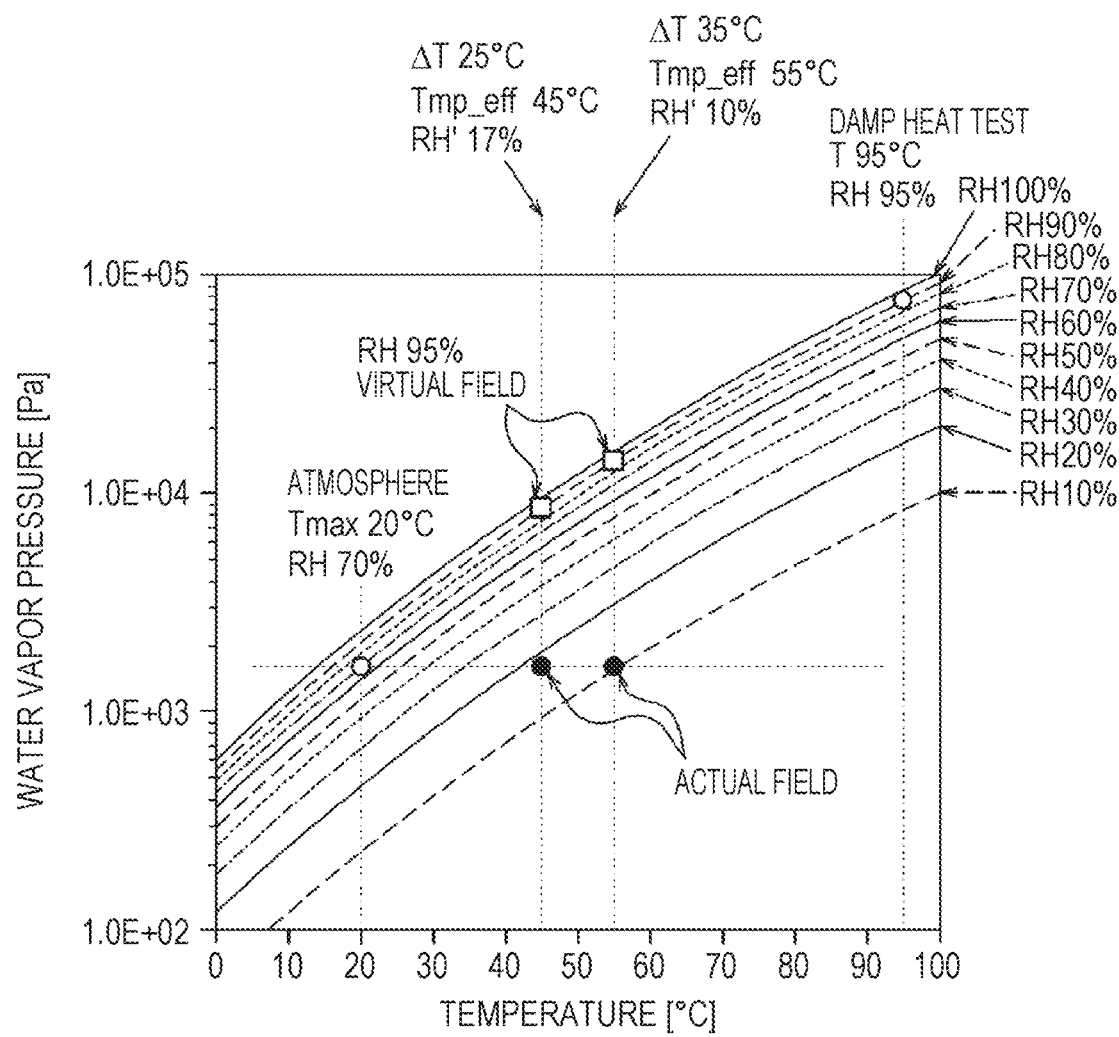
FIG. 16 is a graph illustrating a relationship between field temperature and relative humidity at a damp heat test temperature.

FIG. 16 is a graph illustrating a relationship between the temperature and the relative humidity among three things, which are a damp heat test condition at a temperature of 95° C. and a humidity of 95%, a virtual field condition at RH of 95%, and a field condition of the above virtual model. This graph illustrates the entire scope of the relationship between the temperature and the humidity in the procedure of estimating the useful life.

In accordance with the procedure described by using the above virtual model, specific predicted values of the humidity correction coefficient Hc in a case of using conventional EVA will be described by giving Chiba and Okinawa as examples. The annual average relative humidity (the annual average RH) is RH 70% as a rough value. The examples use weather data in 2015, and the Tmax annual average=20.3° C. is obtained in Chiba and the Tmax annual average=26.3° C. is obtained in Okinawa. Here, even if a value at RH of 70%±about 10% is adopted, the results do not show a significant difference. The following description will be given by using FIG. 14 and FIG. 18.

First, in Chiba (Tmax annual average=20.3° C.), if ΔT=25° C., Tmp_eff=47.5° C. is obtained. Subsequently, from FIG. 14, RH'(Tmp_eff)=15 to 20% is obtained. Then, from FIG. 18, the humidity correction coefficient Hc can be obtained as 2 to 2.2. In addition, in Chiba (Tmax annual average=20.3° C.), if ΔT=35° C., Tmp_eff=57.3° C. is obtained. Subsequently, from FIG. 14, RH'(Tmp_eff)= around 10% is obtained. Then, from FIG. 18, the humidity correction coefficient Hc can be obtained as about 2.7.

Next, in Okinawa (Tmax annual average=26.3° C.), if ΔT=25° C., Tmp_eff=52.0° C. is obtained. Subsequently, from FIG. 14, RH'(Tmp_eff)=15 to 20% is obtained. Then, from FIG. 18, the humidity correction coefficient Hc can be obtained as 2 to 2.2. In addition, in Okinawa (Tmax annual average=26.3° C.), if ΔT=35° C., Tmp_eff=62.0° C. is obtained. Subsequently, from FIG. 14, RH'(Tmp_eff)= around 10% is obtained. Then, from FIG. 18, the humidity correction coefficient Hc can be obtained as about 2.7.

Here, the annual effective module temperature Tmp_eff is calculated from the annual stress index A calculated by using the weather data in Chiba and Okinawa. The calculation of the annual effective module temperature Tmp_eff will be described later in "Useful Life Prediction using Graph". In addition, from the above examples, it can be confirmed that there is also the relationship illustrated in the above Formula (28). That is, it can be also confirmed that employing the Tmax annual average rather than the T annual average well ensures consistency with the above discussion of the prediction of the useful life based on UV and hygrothermal degradation.

After all, the rough value for the humidity correction of the PV module using conventional EVA in Japan can be the following value from the point of view of the prediction of the useful life based on hygrothermal degradation on a safer side. That is, in a case where the PV module is deployed on the ground and ΔT=25° C., the humidity correction coefficient Hc can be about 2. In addition, in a case where the PV module is deployed on a rooftop and ΔT=35° C., the humidity correction coefficient Hc can be about 2.5. To summarize the above, the humidity correction coefficient Hc for the humidity correction of the PV module using conventional EVA in Japan can be about 2.2 as a rough value.

Next, a specific predicted value of the humidity correction coefficient Hc in a case of using improved EVA will be described. As in a product of the PV module using conventional EVA, also for a product of the PV module using improved EVA, the humidity correction coefficient Hc can be obtained. It should be noted here that the humidity correction coefficient Hc differs if the type of EVA differs. Such a case will further be described below.

In the product of the PV module using improved EVA, compared with the product of the PV module using conventional EVA, the useful life based on hygrothermal degradation increases by a certain amount compared with the useful life in a case of using conventional EVA. Considering this, in the product of the PV module using improved EVA, the humidity dependency of the useful life based on hygrothermal degradation is predicted to be as illustrated in FIG. 17, for example.

Figure 17:
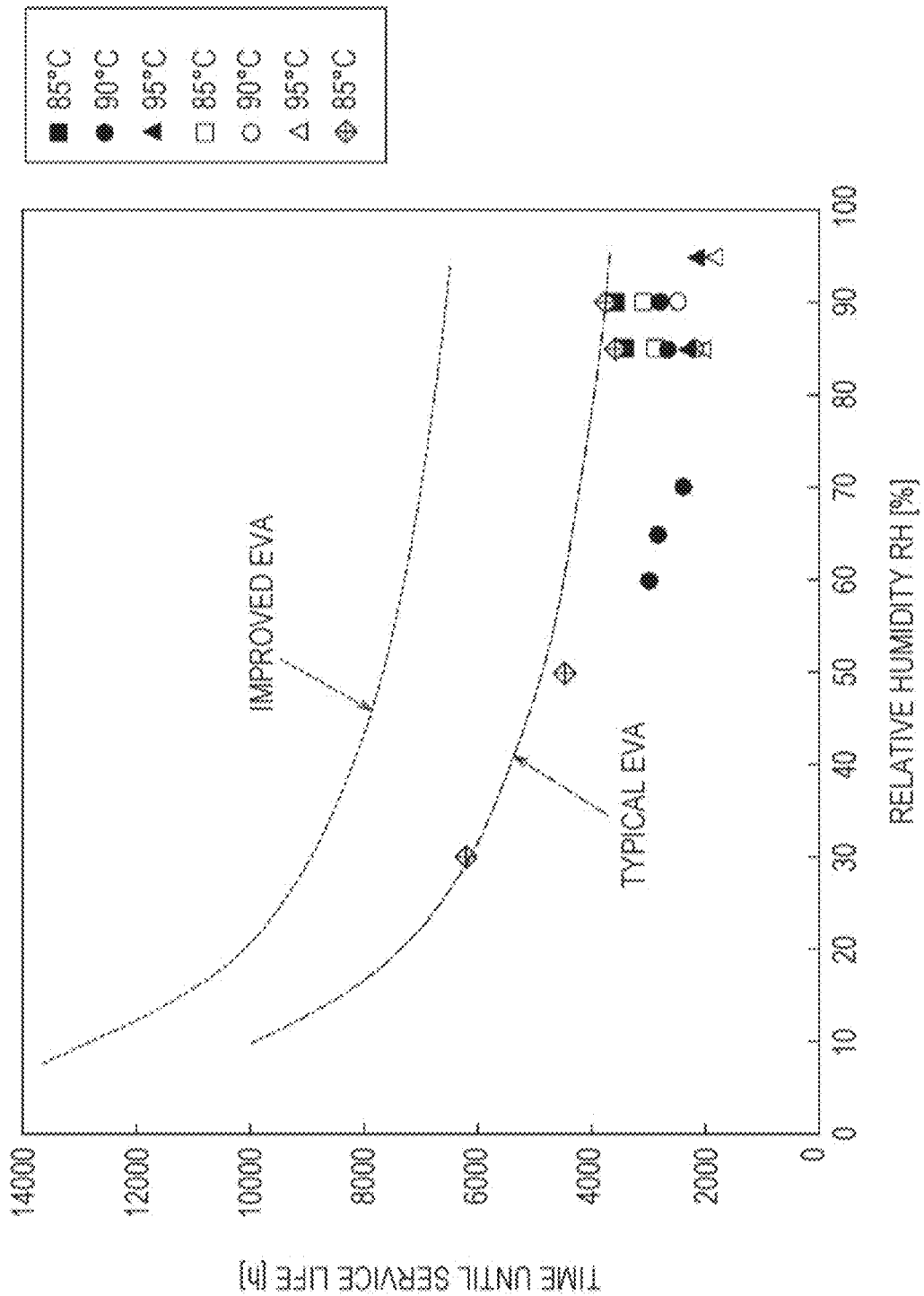
FIG. 17 is a graph illustrating humidity dependency of useful life based on hygrothermal degradation.

FIG. 17 is a graph illustrating the humidity dependency of the useful life based on hygrothermal degradation as in FIG. 11. FIG. 17 is a graph illustrating a relationship between the relative humidity and the useful life based on hygrothermal degradation for the PV module using improved EVA. In FIG. 17, the horizontal axis represents the relative humidity RH [%], and the vertical axis represents the time [h] until the useful life of the PV module based on degradation. The time until the useful life of the PV module based on degradation may be, for example, a time until the FF characteristics are reduced by 10% compared with the initial value. In FIG. 17, for comparison, the curve of the case of the product of the PV module using conventional EVA is illustrated by a dotted and dashed line, and the curve of the case of the product of the PV module using improved EVA is illustrated by a broken line.

Figure 18:
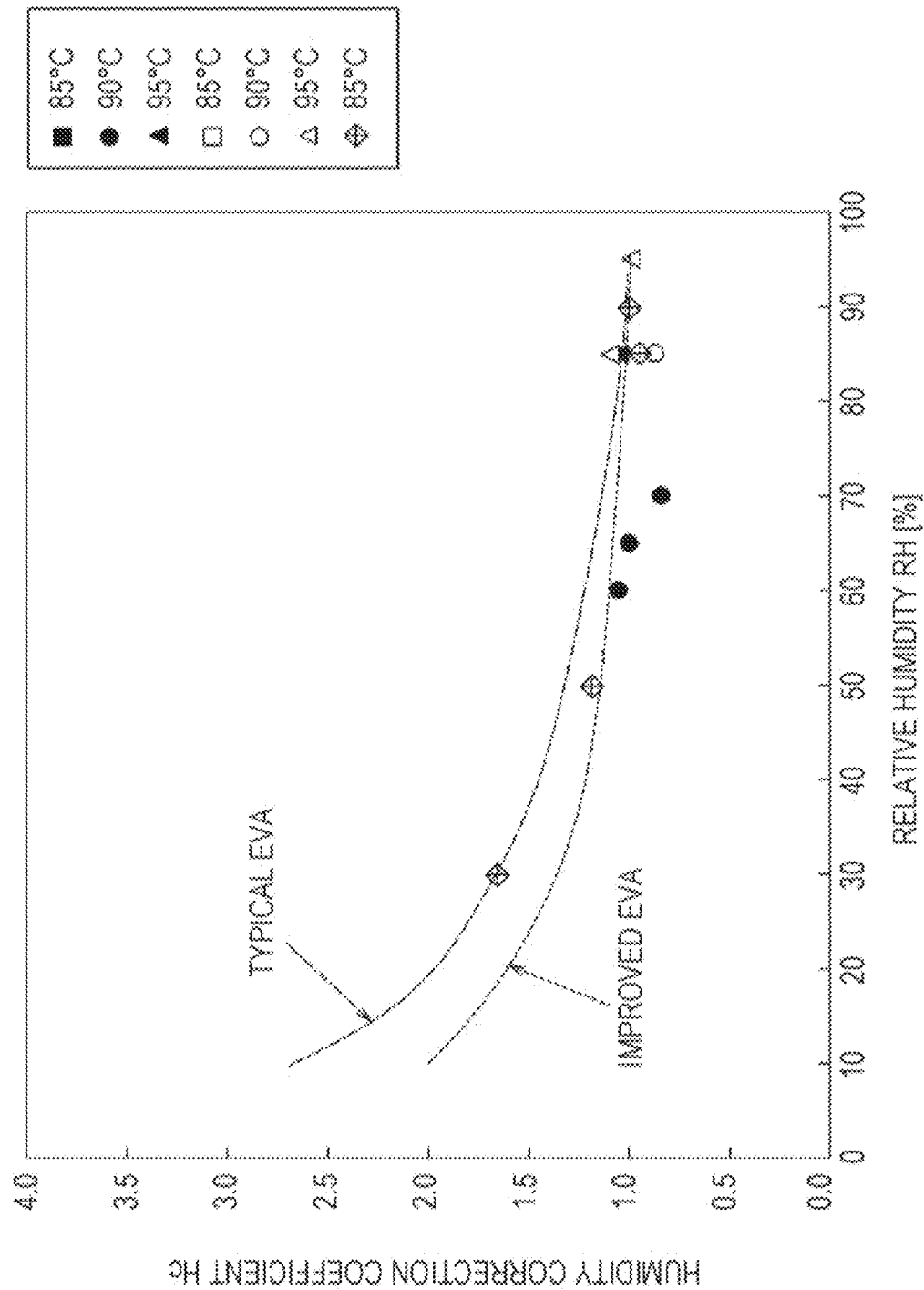
FIG. 18 is a graph illustrating an example of normalizing the useful life based on hygrothermal degradation.

From the above, the humidity dependency of the humidity correction coefficient Hc is illustrated as in FIG. 18, for example. As in FIG. 12, FIG. 18 is a graph illustrating an example in which the useful life based on hygrothermal degradation is normalized by the useful life based on hygrothermal degradation at RH of 95%. Also in FIG. 18, for comparison, the curve of the case of the product of the PV module using conventional EVA is illustrated by a dotted and dashed line, and the curve of the case of the product of the PV module using improved EVA is illustrated by a broken line. The information in FIG. 18 is also illustrated in FIG. 15.

Considering the above, as in the above case of the product of the PV module using conventional EVA, specific prediction examples of the humidity correction coefficient Hc in a case of using improved EVA will be illustrated by giving Chiba and Okinawa as examples. The following description will be given by using FIG. 14 and FIG. 18.

First, in Chiba (Tmax annual average=20.3° C.), if ΔT=25° C., Tmp_eff=47.5° C. is obtained. Subsequently, from FIG. 14, RH'(Tmp_eff)=15 to 20% is obtained. Then, from FIG. 18, the humidity correction coefficient Hc can be obtained as about 1.7. In addition, in Chiba (Tmax annual average=20.3° C.), if ΔT=35° C., Tmp_eff=57.3° C. is obtained. Subsequently, from FIG. 14, RH'(Tmp_eff)= around 10% is obtained. Then, from FIG. 18, the humidity correction coefficient Hc can be obtained as about 2.0.

Next, in Okinawa (Tmax annual average=26.3° C.), if ΔT=25° C., Tmp_eff=52.0° C. is obtained. Subsequently, from FIG. 14, RH'(Tmp_eff)=15 to 20% is obtained. Then, from FIG. 18, the humidity correction coefficient Hc can be obtained as about 1.7. In addition, in Okinawa (Tmax annual average=26.3° C.), if ΔT=35° C., Tmp_eff=62.0° C. is obtained. Subsequently, from FIG. 14, RH'(Tmp_eff)= around 10% is obtained. Then, from FIG. 18, the humidity correction coefficient Hc can be obtained as about 2.0.

After all, the rough value for the humidity correction of the PV module using improved EVA in Japan can be the following value from the point of view of the prediction of the useful life based on hygrothermal degradation on a safer side. That is, in a case where the PV module is deployed on the ground and ΔT=25° C., the humidity correction coefficient Hc can be about 1.5. In addition, in a case where the PV module is deployed on a rooftop and ΔT=35° C., the humidity correction coefficient Hc can be about 1.8. To summarize the above, the humidity correction coefficient Hc for the humidity correction of the PV module using improved EVA in Japan can be about 1.6 as a rough value.

Figure 19:
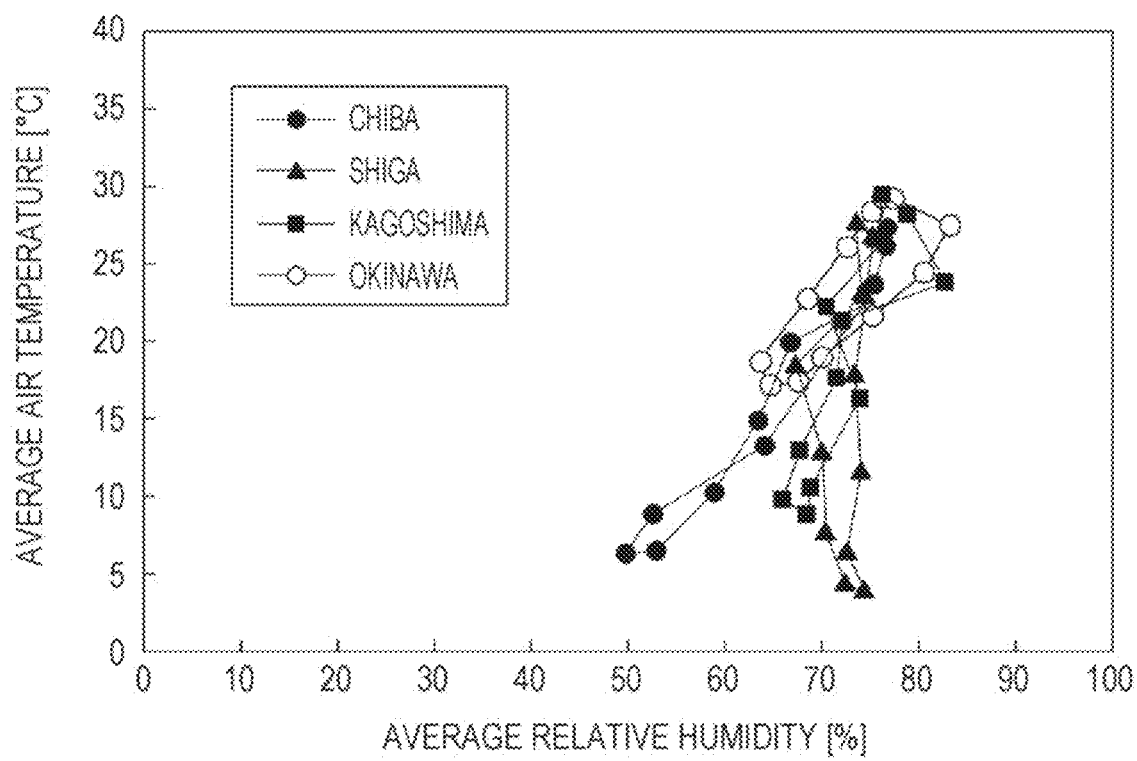
FIG. 19 illustrates a relationship between monthly average atmospheric temperature and average relative humidity in the field in Japan.

FIG. 19 plots and illustrates a relationship between an annual monthly average atmospheric temperature and an annual monthly average relative humidity on some fields in Japan. As illustrated in FIG. 19, it is found that, on some different fields in Japan, even if the average atmospheric temperature changes, the average relative humidity is substantially around 70%. Therefore, as the humidity correction coefficient for the number of useful life years Yv in a virtual field at a relative humidity of around 90%, it is proved that the above humidity correction coefficient Hc which is derived by assuming the average relative humidity in the field in Japan as about 70% is valid. That is, in the field in Japan at a relative humidity of around 70%, as described above, in a case of using conventional EVA, the rough value of the humidity correction coefficient Hc may be about 2.2. In more detail, the rough value of the humidity correction coefficient Hc may be about 2 in a case of ground-mounting and may be about 2.5 in a case of rooftop-mounting. In addition, in a case of using improved EVA, the rough value of the humidity correction coefficient Hc may be about 1.6. In more detail, the rough value of the humidity correction coefficient Hc may be about 1.5 in a case of ground-mounting and may be about 1.8 in a case of rooftop-mounting.

Next, the humidity correction coefficient Hc in the field outside Japan will be specifically considered.

Figure 20:
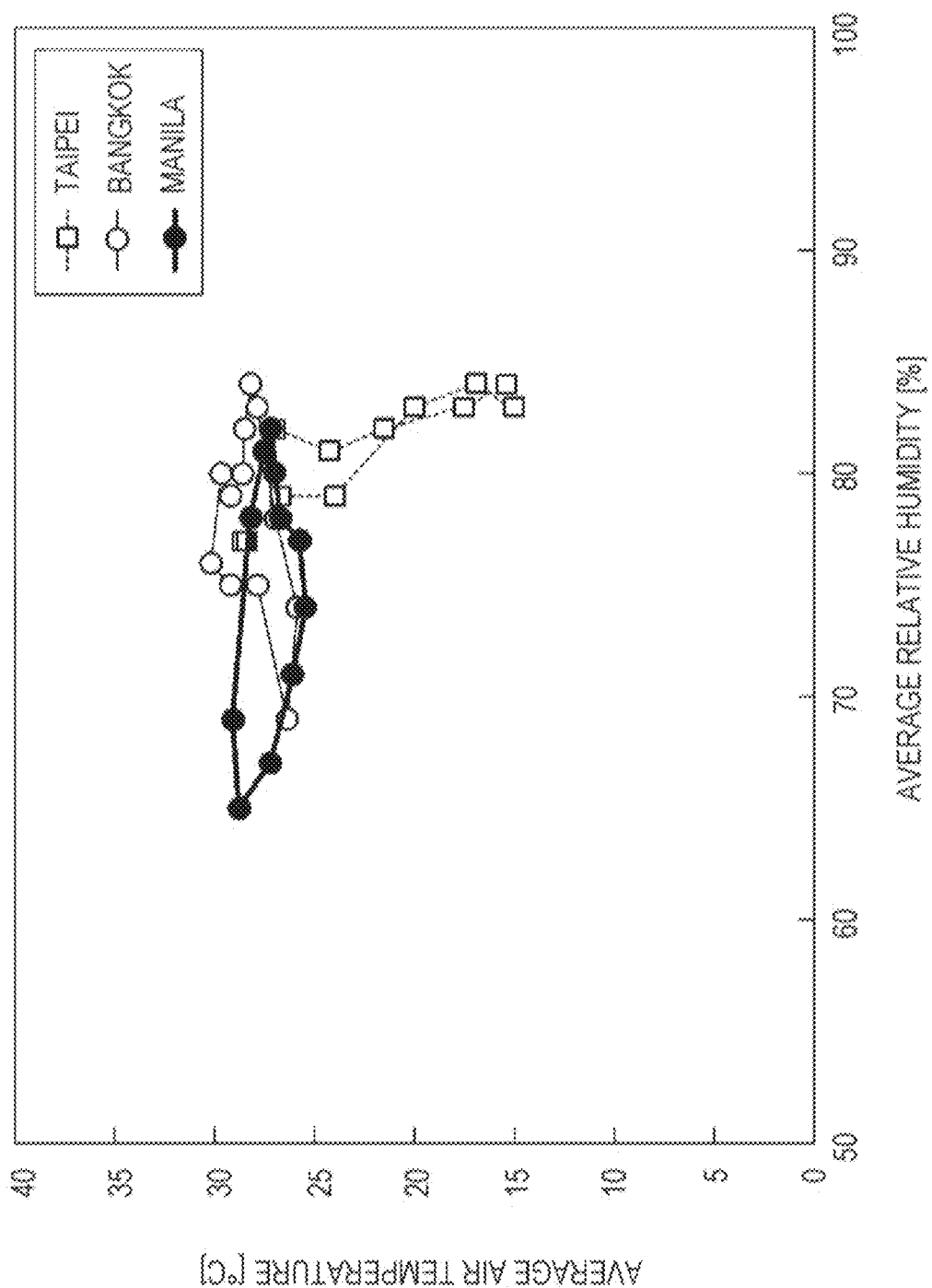
FIG. 20 illustrates a relationship between monthly average atmospheric temperature and average relative humidity in the field outside Japan.
Figure 21:
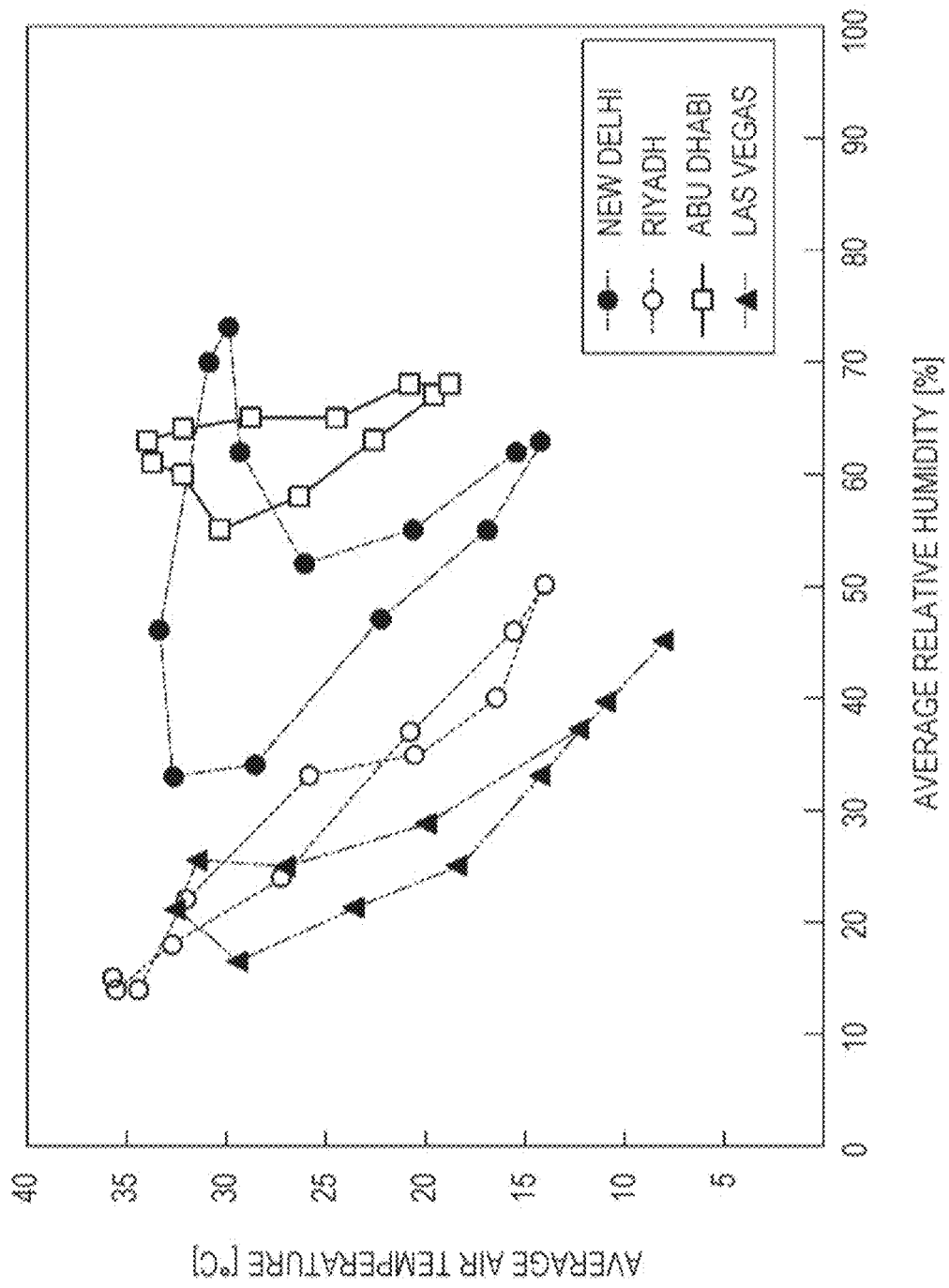
FIG. 21 illustrates the relationship between monthly average atmospheric temperature and average relative humidity in the field outside Japan.

FIG. 20 and FIG. 21 plot and illustrate a relationship between an annual monthly average atmospheric temperature and an average relative humidity on fields outside Japan.

In FIG. 20, a relationship between the annual monthly average atmospheric temperature and the average relative humidity in Taipei, Bangkok, and Manila is illustrated as examples. In particular, Bangkok and Manila are in a hot and humid state throughout a year, and the annual average relative humidity exceeds 70%. In addition, in Taipei, the annual average relative humidity exceeds 80%. Thus, in a case of using conventional EVA, the humidity correction coefficient Hc in these areas may be made smaller than 2 for ground-mounting and may be made smaller than 2.5 for rooftop-mounting. In addition, in a case of using improved EVA, the humidity correction coefficient Hc may be made smaller than 1.5 for ground-mounting and may be made smaller than 1.8 for rooftop-mounting. In this manner, in a particularly hot and humid area abroad, the humidity correction coefficient Hc may be made smaller than the value in a case of Japan.

In FIG. 21, a relationship between the annual monthly average atmospheric temperature and the average relative humidity in New Delhi, Riyadh, Abu Dhabi, and Las Vegas is illustrated as examples. As illustrated in FIG. 21, in Riyadh and Las Vegas in particular, the average relative humidity is excessively low and is substantially around 15% to 45% throughout a year. Thus, for example, in Riyadh, Las Vegas, and the like, from the information of the relative humidity in the fields, in a case of using conventional EVA, the humidity correction coefficient Hc may be made larger than 2 for ground-mounting and may be made larger than 2.5 for rooftop-mounting. In addition, in a case of using improved EVA, the humidity correction coefficient Hc may be made larger than 1.5 for ground-mounting and may be made larger than 1.8 for rooftop-mounting. In this manner, in a particularly dry area in the field abroad, the humidity correction coefficient Hc may be made larger than the value in a case of Japan.

(Method of Using Monthly Humidity Correction Coefficient)

In addition, if information of a monthly average relative humidity RHm is available, a monthly stress index Am can be defined as in the following Formula (31).

$$\text{Monthly stress index } Am = \text{Heff} \cdot \Sigma \exp(-Ea/kTmp) \quad \text{Formula (31)}$$

Here, the sum total interval is the number of days of each day in the corresponding month.

From Formula (31), by using a monthly humidity correction coefficient Hcm, as illustrated in the following Formula (32), an annual stress index Ac subjected to humidity correction can be obtained.

$$\text{Annual stress index } Ac \text{ subjected to humidity correction} \approx \Sigma\{Am/Hcm\} \quad \text{Formula (32)}$$

Here, the sum total interval is 12 months of each month.

By using the annual stress index Ac subjected to humidity correction, the number of useful life years Yh based on hygrothermal degradation in a humidity range in the field can be obtained by dividing the above-described useful life stress index B by the above Ac as illustrated in the following Formula (33).

$$\text{Number of useful life years } Yh \text{ of } PV \text{ module=useful life stress index } B/Ac \quad \text{Formula (33)}$$

According to this calculation, the useful life prediction can be performed more accurately than in a case of using the information of the annual average relative humidity RH. This calculation is particularly useful in an area where the relative humidity varies significantly throughout a year.

(Method of Using Daily Humidity Correction Coefficient)

In addition, if information of a daily average relative humidity RHd is available, a daily stress index Ad can be defined as in the following Formula (34).

$$\text{Daily stress index } Ad = \text{Heff} \cdot \exp(-Ea/kTmp) \quad \text{Formula (34)}$$

Here, Tmp is a value that may differ from day to day.

From Formula (34), by using a daily humidity correction coefficient Hcd, as illustrated in the following Formula (35), the annual stress index Ac subjected to humidity correction can be obtained.

$$\text{Annual stress index } Ac \text{ subjected to humidity correction} \approx \Sigma\{Ad/Hcd\} \quad \text{Formula (35)}$$

Here, the sum total interval is 365 days of each day.

The number of useful life years Yh based on hygrothermal degradation in a humidity range in the field can be obtained by using the above Ac according to Formula (33) in substantially the same manner as above.

According to this calculation, the useful life prediction can be performed still more accurately than in a case of using the information of the monthly average relative humidity RHm. This calculation is particularly useful in an area where the relative humidity significantly varies throughout a month.

Here, the physics to be considered when humidity correction is conducted using the relative humidity information will be described. That is, the humidity correction coefficient Hc should be determined on the basis of results of damp heat tests conducted with the relative humidity as a variable. A note is added that it is not possible to assume a humidity correction coefficient in simple inverse proportion to the absolute water vapor pressure (water vapor density) in the atmosphere or a humidity correction coefficient in simple inverse proportion to the water molecule concentration in EVA.

Moisture in EVA is considered to be in a condensed state (liquid phase state) in a temperature pressure range in the field. The higher the temperature, the faster the diffusion of moisture in EVA proceeds. That is, in daytime hours with the maximum module temperature, a diffusion length of moisture in EVA excessively increases. On the other hand, in a time slot such as the morning, the evening, or the night in which the module temperature decreases, the diffusion length of moisture in EVA excessively decreases in contrast. As a result, the water molecule concentration (the concentration of water molecules) in EVA is considered to become closer to an equilibrium concentration in a state in which the module temperature is the maximum over time. That is, the amount of moisture (water in a liquid phase state) in EVA of a module that has been deployed in the field for a certain time is considered to be substantially given by the following amount of moisture. That is, the amount of moisture is the amount of moisture in EVA that is assumed to be in equilibrium with the amount of moisture (water vapor in a gas phase state) in the atmosphere that is at substantially the same temperature as the module by contacting with the module, in a temperature range in which the module temperature is the maximum. Hereinafter, reference to the concentration of water or water vapor indicates the concentration [number/cm$^3$] of water molecules that are present in a unit volume.

Water molecule concentration n_H$_2$O resin in polymer material composed of EVA (hereinafter also simply referred to as "resin") can be derived on the basis of thermal physics and thermochemistry as follows.

$$n\_H_2O\ resin = RH \cdot Ps(T)/Ps'(T) \cdot n\ \text{whole liquid} \quad \text{Formula (36)}$$

Here, T is the absolute temperature [K] of an equilibrium system formed by the resin and the atmosphere. RH is the value [%/100] obtained by dividing the relative humidity [%] in the atmosphere by 100. A water molecule concentration n_H$_2$O in the resin is the number of water molecules [number/cm$^3$] per resin unit volume. n_whole liquid is the maximum number of water molecules (saturated molecule number) [number/cm$^3$] that can be included per resin unit volume. Ps(T) is the saturated water vapor pressure [Pa] of the water vapor at a temperature T. Ps'(T) is a function [Pa] having temperature dependency defined from a thermal equilibrium relationship between water in the resin and water vapor in the atmosphere (experiment results of a segregation coefficient).

In addition, Ps(T) can be expressed as in the following Formula (37).

$$Ps(T) = \exp(\Delta G\_H_2O\ \text{liquid phase/gas phase}(T)/RT) \quad \text{Formula (37)}$$

Here, ΔG_H$_2$O liquid phase/gas phase(T) is a difference between the molar Gibbs energy of water in a liquid state and the molar Gibbs energy of water vapor in a gas state, at the temperature T.

In addition, ΔG_H$_2$O liquid phase/gas phase(T) can be expressed as in the following Formula (38).

$$\Delta G\_H_2O\ \text{liquid phase/gas phase}(T) = \Delta G\_H_2O\ \text{liquid phase/gas phase}(298) - T \cdot \Delta S\_H_2O\ \text{liquid phase/gas phase}(298) \quad \text{Formula (38)}$$

Here, ΔG_H$_2$O liquid phase/gas phase(298) is a difference between the molar standard Gibbs energy of formation of water in a liquid state and the molar standard Gibbs energy of formation of water vapor in a gas state, at a temperature of 25° C. ΔS_H$_2$O liquid phase/gas phase(298) is a difference between the molar standard entropy of water in a liquid state and the molar standard entropy of water vapor in a gas state, at a temperature of 25° C.

In addition, Ps'(T) is defined as in the following Formula (39).

$$Ps'(T) = \exp(\Delta G\_H_2O\ \text{liquid phase'/gas phase}(T)/RT) \quad \text{Formula (39)}$$

Here, ΔG_H$_2$O liquid phase'/gas phase(T) is a difference, at the temperature T, between the molar Gibbs energy of water in a liquid state in the resin and the molar Gibbs energy of water vapor in a gas state.

In addition, ΔG_H$_2$O liquid phase'/gas phase(T) is defined as in the following Formula (40).

$$\Delta G\_H_2O\ \text{liquid phase'/gas phase}(T) = \Delta G\_H_2O\ \text{liquid phase'/gas phase}(298) - T \cdot \Delta S\_H_2O\ \text{liquid phase'/gas phase}(298) \quad \text{Formula (40)}$$

Here, ΔG_H$_2$O liquid phase'/gas phase(298) is a difference, at a temperature of 25° C., between the molar standard Gibbs energy of formation of water in a liquid state in the resin and the molar standard Gibbs energy of formation of water vapor in a gas state. ΔS_H$_2$O liquid phase'/gas phase (298) is a difference, at a temperature of 25° C., between the molar standard entropy of water in a liquid state in the resin and the molar standard entropy of water vapor in a gas state.

Next, from the comparison between the water molecule concentration n_H$_2$O resin in the resin and a water molecule concentration n_H$_2$O atmosphere in the atmosphere, a segregation coefficient C regarding water molecules can be obtained.

$$\text{Segregation coefficient } C = n\_H_2O\ \text{resin}/n\_H_2O\ \text{atmosphere} \quad \text{Formula (41)}$$

Formula (41) can be expressed as in the following Formula (42) from Formula (36).

$$\text{Segregation coefficient } C = RH \cdot Ps(T) \cdot n\_\text{whole liquid}/(Ps'(T) \cdot n\_H_2O\ \text{atmosphere}) \quad \text{Formula (42)}$$

In addition, considering RH·Ps(T)=P(T)=n_H$_2$O atmosphere·kT, Formula (42) can be expressed as in the following Formula (43). P(T) is the water vapor pressure [Pa] of water vapor at the temperature T.

$$\text{Segregation coefficient } C = n\_\text{whole liquid} \cdot kT/Ps'(T) \quad \text{Formula (43)}$$

If the segregation coefficient C at each temperature T is known from Formula (43), Ps'(T) can be obtained.

Next, a method of obtaining the segregation coefficient C regarding water molecules from an experiment by using Formula (41) will be described.

EVA is extracted from a PV module subjected to a hot and humid test under a predetermined temperature condition, the water molecule concentration n_H$_2$O resin in EVA is subjected to a quantitative analysis by the Karl-Fischer method or the like. Then, the water molecule concentration n_H$_2$O atmosphere in the atmosphere at the predetermined temperature can be obtained from the temperature and the relative humidity of the hot and humid test condition. The segregation coefficient C can be obtained by obtaining a ratio between the obtained water molecule concentration n_H$_2$O resin in the resin and the water molecule concentration n_H$_2$O atmosphere in the atmosphere. This is repeated at different temperatures, and thereby, the segregation coefficient C at each temperature is obtained.

Figure 22:
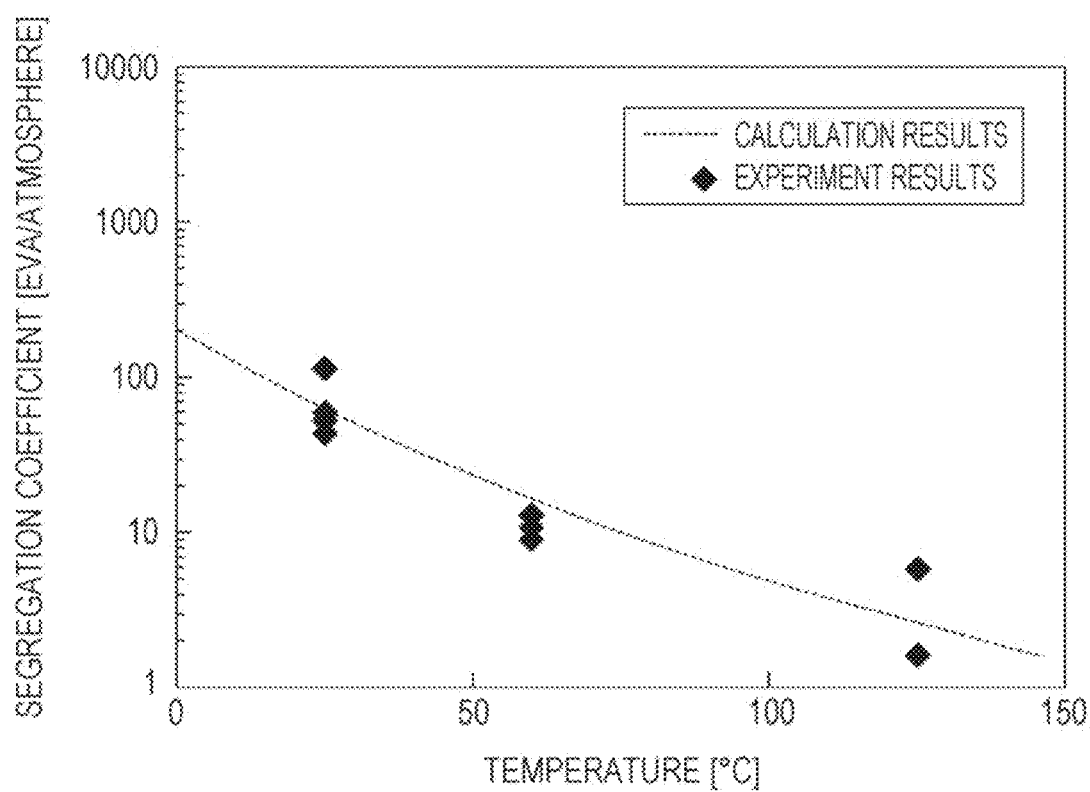
FIG. 22 illustrates a relationship between a segregation coefficient of water and temperature between EVA and an atmosphere.

FIG. 22 plots the segregation coefficient C obtained at each temperature. By using these pieces of experiment data, Ps'(T) can be obtained. Here, in Formula (40), by setting ΔG_H$_2$O liquid phase'/gas phase(298)=−9448 J/mol and ΔS_H$_2$O liquid phase'/gas phase(298)=−83.1 J/mol, and given Ps'(T) from Formula (39), it is confirmed that the segregation coefficient C calculated according to Formula (43) well reproduces the segregation coefficient C obtained by the experiment. Here, considering ΔG_H$_2$O liquid phase/gas phase(298)=−8589 J/mol and ΔS_H$_2$O liquid phase/gas phase(298)=−118.8 J/mol in a simple system of water (liquid phase) and water vapor (gas phase), it is found that water is thermodynamically more stable in the resin than in the system of water and water vapor.

In addition, from Formula (36), it is found that the water molecule concentration in EVA is in proportion to the relative humidity RH. In addition, if the relative humidity RH is constant, from the temperature dependency of Ps(T)/Ps'(T), the water molecule concentration in EVA can be expected to gradually increase in proportion to the temperature.

As described above, the water molecule concentration in EVA gradually increases in proportion to the temperature if the relative humidity RH is constant. This indicates that the water molecule concentration in EVA is not determined in the form of being in proportion to the saturated water vapor pressure, which increases exponentially in proportion to the temperature. The water molecule concentration in EVA gradually increases in proportion to the temperature, not increasing exponentially in proportion to the temperature, because temperature dependency of the segregation coefficient acts so as to almost cancel temperature dependency of the saturated water vapor pressure. That is, Formula (36) can be expressed as in the following Formula (44) by using Formula (43).

$$n\_H_2O \text{ resin} = RH \cdot Ps(T)/kT \cdot \text{segregation coefficient } C \quad \text{Formula (44)}$$

Figure 23:
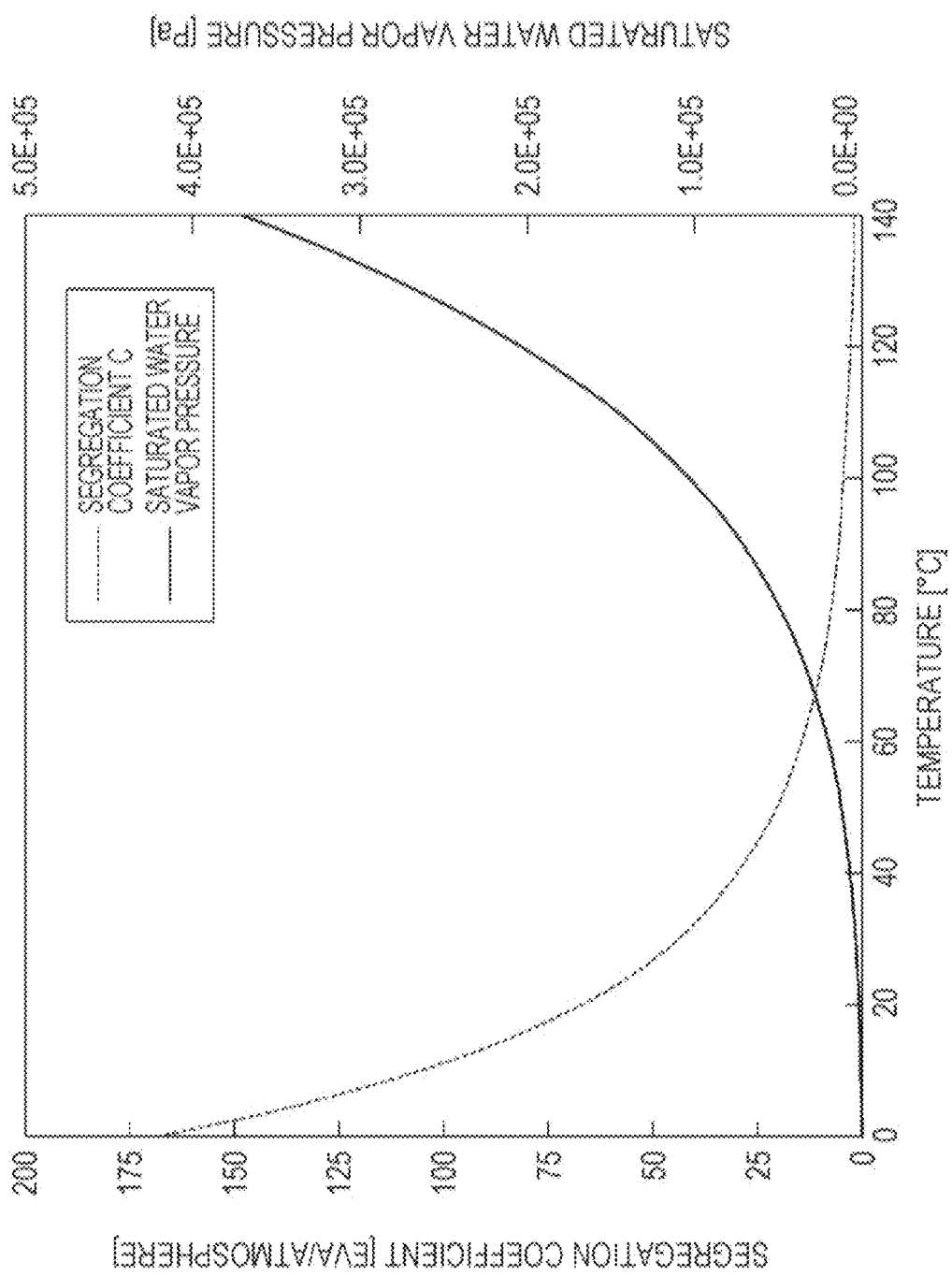
FIG. 23 illustrates a relationship among the segregation coefficient of water between EVA and an atmosphere, saturated water vapor pressure, and temperature.

The temperature dependency of the segregation coefficient can be naturally understood by considering that the equilibrium relationship between water in EVA and water vapor in the atmosphere is basically the same as the equilibrium relationship between water alone (liquid phase water molecules) and water vapor (gas phase water molecules). That is, in the system of water alone and water vapor as illustrated in FIG. 23, if the temperature decreases, the saturated water vapor pressure significantly decreases exponentially (the saturated water vapor concentration significantly decreases exponentially). On the other hand, the change in water density with respect to the temperature decrease is only about a thermal expansion coefficient of water, and this change is almost negligible in the current case. That is, liquid phase water molecule concentration/gas phase water molecule concentration, that is, the segregation coefficient of water molecules, significantly increases exponentially as the temperature decreases. Thus, the influence of the temperature dependency of the saturated water vapor pressure is canceled, and the fact can be understood that the liquid phase water molecule concentration is almost unchanged in the system of water alone/water vapor between 0 to 100° C. The physical phenomenon occurring between water in EVA and water vapor in the atmosphere is basically the same as this. It can be understood that the moisture concentration in EVA does not significantly change because the influence of the saturated water vapor pressure, which decreases exponentially as the temperature decreases, is canceled by the segregation coefficient of water between EVA and the atmosphere significantly increasing exponentially as the temperature decreases.

In other words, it is possible to interpret that, even if the water vapor concentration in the atmosphere significantly changes, since the moisture retaining ability of EVA is strong, the water molecule concentration change (decrease) in EVA is not large compared to the water molecule concentration change (decrease) in the atmosphere. That is, it is possible to interpret that, even if the saturated water vapor pressure in a temperature range of an actual field decreases by more than or equal to one order of magnitude compared with the saturated water vapor pressure in a temperature range of a hot and humid test), the water molecule concentration change (decrease) in EVA is not large compared to the water molecule concentration change (decrease) in the atmosphere.

The above can also be confirmed from the following fact. That is, comparing the water molecule concentration in EVA of a test product that is subjected to a hot and humid test at a relative humidity RH of around 90% and the water molecule concentration in EVA of a product collected from the field, only the difference (coefficient level) illustrated in FIG. 24 occurs.

FIG. 24 illustrates the water molecule concentration (the concentration of water molecules) in EVA of each of EVA of a test product that is subjected to a hot and humid test and EVA of a product collected from the field in Japan. Here, the concentration of water molecules means the number of water molecules in an EVA unit volume. As illustrated in FIG. 24, the test product had about 1 to $2 \times 10^{20}/cm^3$ at most under conditions of a temperature of 125° C. and a relative humidity RH of 95%. The test product had about 5 to $8 \times 10^{19}/cm^3$ at most under conditions of a temperature of 95° C. and a relative humidity RH of 95%. On the other hand, the collected product had about 3 to $5 \times 10^{19}/cm^3$. The difference of the water molecule concentration in EVA between the test product and the collected product can be confirmed to be much smaller than the difference of the saturated water vapor pressure obtained from the temperature dependency of the saturated water vapor pressure.

Considering the above description, points to be noted for humidity correction of the hygrothermal useful life will be described below.

Firstly, for humidity dependency of the hygrothermal useful life, it is not possible to apply the temperature dependency of the saturated water vapor pressure as a humidity correction coefficient as it is. Specifically, it is not possible to apply, as the humidity correction coefficient, a ratio between the saturated water vapor pressure in a hot and humid test and the saturated water vapor pressure at the temperature of a PV module deployed in the field. If the ratio is applied as the humidity correction coefficient, the hygrothermal useful life is significantly overestimated. This is because the influence of the temperature dependency of the segregation coefficient is not considered.

Secondly, from Formula (36), the water molecule concentration in EVA is considered to be in proportion to the relative humidity RH in outside air, but the hygrothermal useful life and the humidity correction coefficient that are obtained from results of experiments actually performed by setting a plurality of relative humidities are not in simple inverse proportion to the relative humidity RH. That is, in Formula (18), n≈1 is not satisfied, and n<1 is satisfied non-negligibly. If the humidity correction coefficient in simple inverse proportion to the relative humidity RH (in simple proportion to 1/RH) is given, that is, if n≈1, the hygrothermal useful life is significantly overestimated. The water molecule concentration in EVA and the hygrothermal useful life are not in a simple inverse proportion relationship because a corrosion degradation reaction of the contact portions of the electrodes are not in simple proportion to the water molecule concentration in EVA. That is, water itself does not cause a corrosion reaction. The corrosion reaction involves acid (acetic acid in a case of EVA), and although moisture is not a direct corrosion factor it is factor that indirectly contributes to the corrosion reaction that involves acid.

The points to be noted for humidity correction for the hygrothermal useful life prediction have been described above. That is, it is necessary to be noted that the assumption of the hygrothermal useful life in simple inverse proportion to the absolute water vapor pressure (water vapor density) in the atmosphere and the assumption of the hygrothermal useful life in simple inverse proportion to the water molecule concentration in EVA lead to significant overestimation of the hygrothermal useful life.

In a method according to the present disclosure, the relative humidity dependency of the hygrothermal useful life is derived from actual experiment results. Thus, the hygrothermal useful life is not significantly overestimated as above.

(Prediction of Upper Limit and Lower Limit of Humidity Correction Coefficient Hc)

Here, as illustrated in FIG. 24, the water molecule concentration in EVA of the product collected from the field is about 3 to $5\times10^{19}/cm^3$. This value is confirmed to be 2 to 3 times higher than the value calculated from the above experiment information of the segregation coefficient and average humidity information in the field.

It is considered that this difference occurs because the state of EVA of the test product prepared for obtaining the segregation coefficient and the state of EVA of the product collected from the field differ from each other. That is, the test product is placed in a state of simple hygrothermal stress without UV light stress, and the test ends when the saturation of moisture in resin can be confirmed. Thus, a hydrolysis reaction (acetic acid generation reaction) of EVA due to hygrothermal stress stays at an early stage. On the other hand, the product collected from the field sufficiently undergoes UV light stress and also undergoes hygrothermal stress to a degree that acetic acid is considerably generated. It is known that EVA receives damage on a molecule structure by UV light.

In addition, by the generation of acetic acid caused by UV light stress and the generation of acetic acid caused by hygrothermal, as a matter of course, the structure changes at a molecule level in accordance with the generation of acetic acid. In addition, there is also a report that the degradation of the molecule structure is likely to occur particularly on the interface between EVA and the photovoltaic cell. That is, it is thought that the amount of cavitation (cavity volume) that is able to capture water molecules increases because the degree of degradation of EVA of the product collected from the field has progressed compared to that of EVA of the test product. Thus, as the water molecule concentration in EVA of the product collected from the field, it is considered that a higher value than a value predicted from experiment results (the segregation coefficient) of the test product is observed.

The increase in the amount of cavitation in the resin increases the maximum number of water molecules n_whole liquid that can be included per resin unit volume. In the present case, the maximum number of water molecules n_whole liquid means the saturated number of water molecules per unit volume when all cavities in the resin are saturated with water molecules. It is considered that, since the amount of all cavities (cavity volume) increases in accordance with the degradation of EVA, the water molecule concentration n_H$_2$O resin in EVA becomes higher than the value predicted from experiment results of the test product according to Formula (36).

Here, if the water molecule concentration in EVA of the product collected from the field is to be realized by EVA of the test product, according to the prediction, the relative humidity RH in the atmosphere at the module temperature needs to be about 60%±about 20%. In a case where the relative humidity RH is 60%, if the humidity correction coefficient is predicted from the graph illustrated in FIG. 18 indicating the relationship between the relative humidity and the humidity correction coefficient, it is found that the rough value is about 1.2 for conventional EVA and is about 1.1 for improved EVA.

EVA of the PV module deployed in the field degrades gradually along with the number of exposure years, and thus, the increase in the amount of cavitation in EVA in accordance with the degradation is supposed to proceed gradually. Therefore, it is considered that the humidity correction coefficient is also to change gradually along with the number of field exposure years. That is, it is considered that the humidity correction coefficient is to decrease gradually over time.

In view of the above, it is considered that the humidity correction coefficient predicted on the basis of information of the test product is the rough value of the upper limit and that the humidity correction coefficient predicted on the basis of information of the product collected from the field is the rough value of the lower limit. That is, for conventional EVA, the rough value of the upper limit of the humidity correction coefficient can be about 2.2, and, to set more specifically, can be about 2 in a case of ground-mounting and can be about 2.5 in a case of rooftop-mounting, and the rough value of the lower limit of the humidity correction coefficient can be about 1.2. For improved EVA, the rough value of the upper limit of the humidity correction coefficient is about 1.6, and, to set more specifically, can be about 1.5 in a case of ground-mounting and can be about 1.8 in a case of rooftop-mounting, and the rough value of the lower limit of the humidity correction coefficient can be about 1.1.

(UV Correction Coefficient Uc)

Next, the UV correction coefficient Uc in Formula (1) will be described.

The above number of useful life years Y is obtained by multiplying the above number of useful life years Yh by the UV correction coefficient Uc as illustrated in the following Formula (45).

$$\text{Number of useful life years } Y = \text{number of useful life years } Yh \times UV \text{ correction coefficient } Uc \qquad \text{Formula (45)}$$

Here, as illustrated in Formula (17), the number of useful life years Yh is obtained by multiplying the number of useful life years Yv by the humidity correction coefficient Hc. Here, the number of useful life years Yv is the number of useful life years of the PV module based on hygrothermal degradation on a virtual field at a humidity of around 90%.

The UV correction coefficient value Uc can be obtained on the basis of the time until the useful life obtained by performing a damp heat test and the time until the useful life obtained by performing a damp heat test after giving a predetermined amount of UV light stress. Specifically, on the basis of the above tests, the UV correction coefficient Uc can be obtained as in the following Formula (46).

$$UV \text{ correction coefficient } Uc = \tau UD/\tau D \qquad \text{Formula (46)}$$

Here, τD is the time until the useful life obtained by performing a damp heat test (hereinafter also referred to as "DH test" (DH: damp heat)) on the PV module. In addition, τUD is the time until the useful life obtained by a sequential test (hereinafter also referred to as "UV DH sequential test") in which a damp heat (DH) test is performed sequentially after giving the predetermined amount of UV light stress to the PV module.

The amount of UV light stress to be given to the PV module when τUD illustrated in Formula (46) is to be obtained changes depending on the type and/or the addition amount of additives that are added to EVA. In this case, a rough value of the UV light amount to be given may be a light amount with which the generation amount of acid (e.g., acetic acid) caused by the additive with respect to a cumulative irradiation amount of UV light is almost saturated.

A case of performing a UV test in which acetic acid is generated owing to an ultraviolet absorber will be described below. In this case, as long as UV light is in a wavelength range of 300 to 400 nm, a rough value of the amount of UV light stress may be an irradiation energy amount of 250 to 300 kWh/m². This amount corresponds to a UV light energy amount in the field in Japan for about three years. It is confirmed that, with irradiation with the UV light amount with an irradiation energy amount of about this degree, the deterioration of the ultraviolet absorber is almost complete. That is, even with irradiation with UV light with the above irradiation energy amount or more, acetic acid is no more generated owing to the ultraviolet absorber. The above can be confirmed from a saturation trend of an acetic acid ion concentration ($[CH_3COO^-]$) with respect to the irradiation energy amount of UV light illustrated in FIG. 31.

Figure 25A:
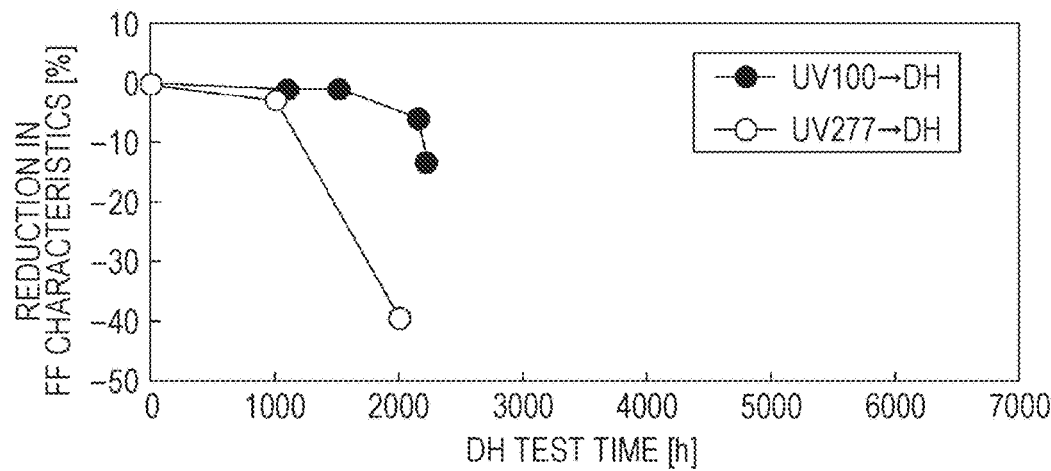
FIG. 25A to FIG. 25C illustrate results of UV DH sequential tests on PV modules using some types of EVA.
Figure 25B:
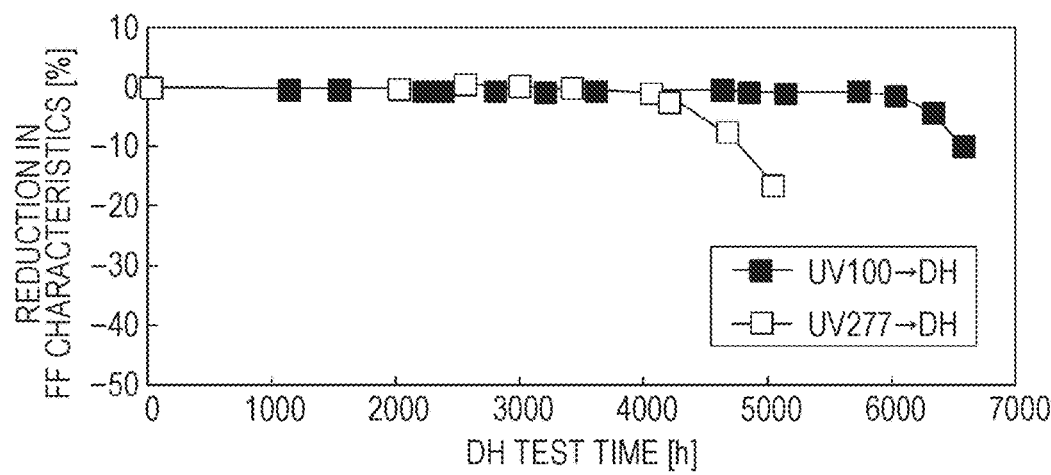
Figure 25C:
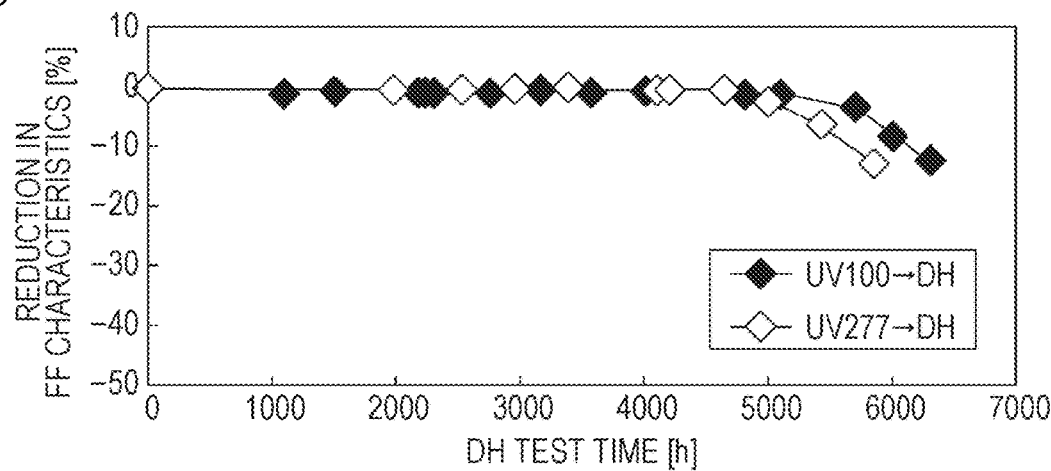

The applicants have performed experiments including DH tests and UV DH sequential tests for some types of EVA with different conditions such as the presence or absence of an ultraviolet absorber UVA, in order to obtain the UV correction coefficient Uc. FIG. 25A to FIG. 25C illustrate graphs of results of the UV DH sequential tests for some types of EVA. FIG. 25A illustrates test results of a product using EVA 1 (with addition of the ultraviolet absorber), that is conventional EVA, as a sample. FIG. 25B illustrates test results of a product using EVA 2 (with addition of the ultraviolet absorber), that is improved EVA, as a sample. FIG. 25C illustrates test results of a product using EVA 3 (without addition of the ultraviolet absorber), that is improved EVA, as a sample.

In each of the graphs in FIG. 25A to FIG. 25C, the horizontal axis represents the time of a DH test, and the vertical axis represents reduction in FF characteristics. Each of FIG. 25A to FIG. 25C illustrates results of a DH test after a UV test with an irradiation energy amount of 100 kWh/m² together with results of a DH test after a UV test with an irradiation energy amount of 277 kWh/m². In addition, the DH test was performed under conditions of a temperature of 95° C. and a relative humidity of 95%. In addition, UV100 illustrated in FIG. 25A to FIG. 25C means the UV test with a UV light irradiation energy amount of 100 kWh/m², and UV277 means the UV test with a UV light irradiation energy amount of 277 kWh/m². Here, it is separately confirmed that the useful life obtained by performing the DH test after the UV test with an irradiation energy amount of 100 kWh/m² is close to the useful life obtained by performing only the DH test, to the extent that the difference can be ignored.

As illustrated in FIG. 25A and FIG. 25B, non-negligible shortening of the useful life caused by UV light was observed for both the improved EVA (EVA 2) and the conventional EVA (EVA 1). Specifically, in the conventional EVA (EVA 1), it is confirmed that the useful life shortened on the basis of UV light degradation is about 50%. In contrast, in the improved EVA (EVA 2), it is confirmed that the useful life shortened on the basis of UV light degradation is about 30%. Here, the addition amount of the ultraviolet absorber UVA is equal in the conventional EVA (EVA 1) and in the improved EVA (EVA 2).

On the other hand, as illustrated in Fig. FIG. 25C, in the improved EVA (EVA 3) to which the ultraviolet absorber UVA is not added, it is confirmed that the useful life shortened on the basis of UV light degradation is about 5%.

From the above experiment results, the UV correction coefficients Uc of the three different types of EVA (EVA 1, EVA 2, and EVA 3) are as follows. That is, the UV correction coefficient Uc of EVA 1 is about 0.5, the UV correction coefficient Uc of EVA 2 is about 0.7, and the UV correction coefficient Uc of EVA 3 is about 0.95. As described above, EVA 1 corresponds to the conventional EVA to which the ultraviolet absorber is added. It is found that, in EVA 1, shortening of the useful life based on UV and hygrothermal degradation is remarkable. In the useful life almost based on only hygrothermal stress for which the influence of UV light is negligible, the useful life using EVA 1 is about one third of those using EVA 2 and EVA 3. From this, it can be presumed that the useful life using EVA 1 on an actual field with the influence of UV light is to be remarkably shortened compared with those using EVA 2 and EVA 3.

The additive to be added to EVA may generate acid (e.g., acetic acid) in EVA other than the ultraviolet absorber UVA. For example, it is known that a crosslinking agent or the like generates acid (e.g., acetic acid) in EVA under UV light irradiation, as in the ultraviolet absorber UVA. Also in this case, as in the above case, it is possible to determine a predetermined UV light irradiation amount by confirming the saturation trend of acid to be generated. Therefore, also in a case other than the ultraviolet absorber UVA, it is possible to obtain the UV correction coefficient Uc on the basis of information of the time until the useful life obtained by performing an experiment including a DH test and a UV DH sequential test.

As described above, the information processing apparatus 1 according to an embodiment can obtain the number of useful life years Y of the PV module on the basis of the useful life stress index B, the annual stress index A, the humidity correction coefficient Hc, and the UV correction coefficient Uc according to the above Formula (1). That is, the information processing apparatus 1 according to an embodiment can obtain the number of useful life years of the PV module based on UV and/or hygrothermal degradation in the field according to the above Formula (1).

(Useful Life Prediction without Using UV Correction Coefficient Uc)

When calculating the number of useful life years Y of the PV module as above, the calculation is also possible without using the UV correction coefficient Uc. The calculation of the number of useful life years Y of the PV module without using the UV correction coefficient Uc will be described below.

As illustrated in the above Formula (1), the number of useful life years Y can be expressed as (useful life stress index B/annual stress index A)×humidity correction coefficient Hc×UV correction coefficient Uc. Here, the useful life stress index B and the annual stress index A are indices illustrating amounts of hygrothermal stress. By replacing the useful life stress index B and the annual stress index A by indices indicating an amount of UV and hygrothermal stress, the number of useful life years Y of the PV module can be calculated without using the UV correction coefficient Uc. In this case, the useful life stress index B may be replaced by "useful life stress index Bu" indicating the amount of UV and hygrothermal stress. In addition, the annual stress index A may be replaced by "annual stress index Au" indicating the amount of UV and hygrothermal stress.

In this case, as the activation energy to be used for calculating the useful life stress index Bu and the annual stress index Au, instead of the activation energy Ea of hygrothermal degradation, an activation energy Eau of UV and hygrothermal degradation may be used. In addition, the activation energy Eau of UV and hygrothermal degradation may be calculated as in the case of using Formula (3) by performing UV DH sequential tests under two or more temperature conditions. The temperature conditions here are temperature conditions of DH tests in the UV DH sequential tests.

Then, the useful life stress index Bu may be calculated by replacing T indicating the useful life in the damp heat test in Formula (2) by τUD indicating the time until the useful life obtained by a UV DH sequential test. In addition, the annual stress index Au may be calculated by using the activation energy Eau of UV and hygrothermal degradation as in the case of using Formula (15) or the like.

In the above manner, the number of useful life years Y of the PV module is also obtained by excluding the UV correction coefficient Uc from the above Formula (1).

As will be described later, when a time period of about 3 years to 5 years elapses from when the PV module is deployed in the field, of the generation of acids that cause degradation of the PV module, those caused by exposure to UV light are almost saturated. Therefore, if the PV module is deployed in the field for a sufficient time period, such as about 3 years to 5 years, the number of useful life years Y of the PV module can be calculated with practical accuracy without using the UV correction coefficient Uc. On the other hand, if the time period during which the PV module has been deployed in the field is a short time period compared with about 3 years to 5 years, of the generation of acids that cause degradation of the PV module, those caused exposure to UV light are not saturated yet. In such a case, by using the UV correction coefficient Uc, the number of useful life years Y of the PV module can be calculated more accurately.

As described above, the information processing apparatus 1 according to an embodiment can estimate the useful life of the PV module easily with favorable accuracy. Therefore, the information processing apparatus 1 according to an embodiment can quantify the prediction of the useful life of the PV module based on degradation reasonably, that is, on an objective basis. Thus, the information processing apparatus 1 according to an embodiment contributes to the evaluation of the quality value regarding long-term reliability of the PV module.

(Useful Life Prediction Using Graph)

Next, simplified prediction of the above number of useful life years Y of the PV module will be described.

The information processing apparatus 1 according to an embodiment may also estimate the useful life of the PV module based on UV and/or hygrothermal degradation in the field visually by using a graph. In an embodiment, the useful life of the PV module may be predicted by using, for example, a graph illustrating a relationship between the temperature and the useful life of the PV module. To perform such prediction, the concept of the on-field annual effective module temperature Tmp_eff will be described below.

As described above, the annual stress index A can be expressed as in Formula (13). In Formula (13), the sum total interval is 365 days of each day.

Here, the on-field annual effective module temperature Tmp_ eff is defined as in the following Formula (47).

$$Tmp\_eff = (-Ea/k)/\ln\{\Sigma \exp(-Ea/kTmp)/365\} \quad \text{Formula (47)}$$

Here, from the above Formula (11), the daily maximum temperature Tmp of the PV module is the daily maximum atmospheric temperature Tmax+ΔT. In addition, the sum total interval is 365 days of each day.

By using Formula (47), the annual stress index A illustrated in Formula (13) can be expressed as in the following Formula (48).

$$\text{Annual stress index } A = Heff \cdot \sum \exp(-Ea/kTmp) \quad \text{Formula (48)}$$
$$= Heff \cdot 365 \cdot \exp(Ea/kTmp\_eff)$$

On an actual field, the module temperature may differ every day throughout a year. However, by introducing the concept of the annual effective module temperature Tmp_ eff, the temperature that may differ every day throughout a year can be represented by only one module temperature. On the other hand, from results of damp heat tests performed under two or more temperature conditions, a relationship between the useful life τ based on hygrothermal degradation (at a humidity of around 90%) and the temperature Tm can be expressed as a graph. In this case, the relationship between T and Tm follows the formula expressing the useful life stress index B illustrated in Formula (2).

Figure 26:
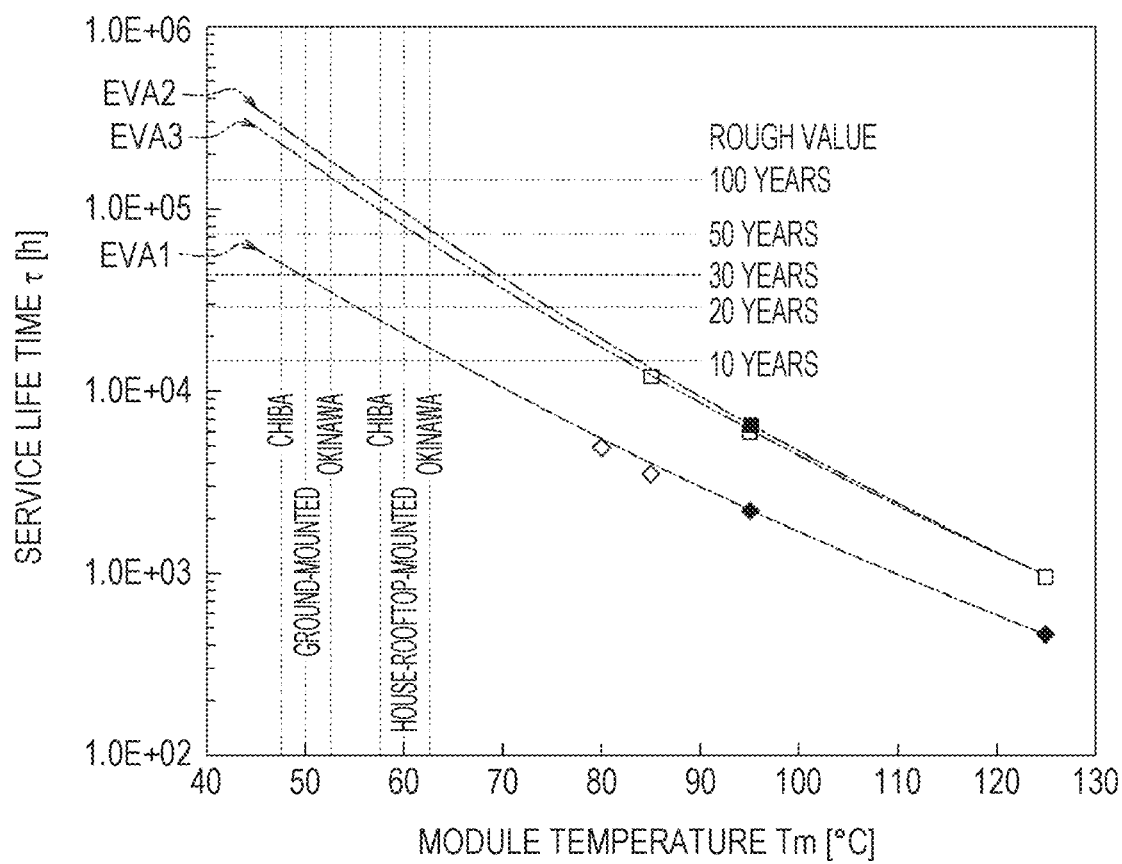
FIG. 26 illustrates an example of a relationship between the useful life based on hygrothermal degradation and temperature.

FIG. 26 illustrates the relationship between the useful life τ based on hygrothermal degradation (at a relative humidity of around 90%) and the temperature Tm. The graph illustrated in FIG. 26 is expressed on the basis of results of damp heat tests performed under two or more temperature conditions. In FIG. 26, dots indicate experiment results obtained under the respective temperature conditions. In the graph in FIG. 26, the horizontal axis represents the module temperature Tm, and the vertical axis represents the useful life τ in the damp heat tests. The module temperature Tm can be given by a test temperature in a case of the damp heat tests. The module temperature Tm can be given by the annual effective module temperature Tmp_eff in a case of field-mounting. The same applies in FIG. 27, FIG. 32, FIG. 33, and FIG. 34 described later. The useful life τ in the damp heat tests may be a time until the FF characteristics or Pm characteristics of the PV module are reduced by 10% compared with the initial value. FIG. 26 illustrates curves indicating the useful lives of PV modules based on hygrothermal degradation by illustrating the relationship between Tm and T. Hereinafter, a curve indicating the useful life of a PV module based on hygrothermal degradation will also be referred to as "useful life curve".

FIG. 26 illustrates the useful life curves for each of EVA 1, EVA 2, and EVA 3. As described above, EVA 1 is a sample of a product made using conventional EVA (with addition of the ultraviolet absorber). EVA 2 is a sample of a product made using improved EVA (with addition of the ultraviolet absorber). EVA 3 is a sample of a product made using improved EVA to which the ultraviolet absorber is not added, in contrast to the improved EVA 2. As illustrated in FIG. 26, in each sample, the useful life τ becomes shorter as the module temperature Tm becomes higher.

A procedure of obtaining the number of useful life years Y by using the annual effective module temperature Tmp_eff will be described below.

First, in a graph such as the graph illustrated in FIG. 26, a perpendicular line at the temperature of Tmp_eff is drawn, and an intersection with the curve indicating the relationship between Tm and T is obtained. The time on the vertical axis of the intersection indicates the useful life Tv [hours] based on hygrothermal degradation on a (virtual) field (at a humidity of around 90%).

Next, the useful life Tv [hours] is converted into the number of useful life years Yv [years] by using the following Formula (49).

Number of useful life years Yv [years]=useful life Tv [hours]/Heff/365  Formula (49)

Lastly, as illustrated in Formula (16) and Formula (1), by performing humidity correction and UV correction on the number of useful life years Yv, the number of useful life years Y can be obtained.

FIG. 26 illustrates, as specific examples of Tmp_eff, rough values of Tmp_eff in a case of ground-mounting and in a case of rooftop-mounting in each area of Chiba and Okinawa and illustrates perpendicular lines at the temperatures. The same applies in FIG. 27, FIG. 32, FIG. 33, and FIG. 34 described later.

In the above procedure, description is made on the assumption that humidity correction and UV correction are performed after the number of useful life years Yv is obtained, but this order may be reversed. That is, the useful life Tv may be obtained by, after performing temperature correction and UV correction in advance on the useful life curves illustrated in FIG. 26, drawing perpendicular lines at the temperatures of Tmp_eff and obtaining the intersections with the useful life curves.

Figure 27:
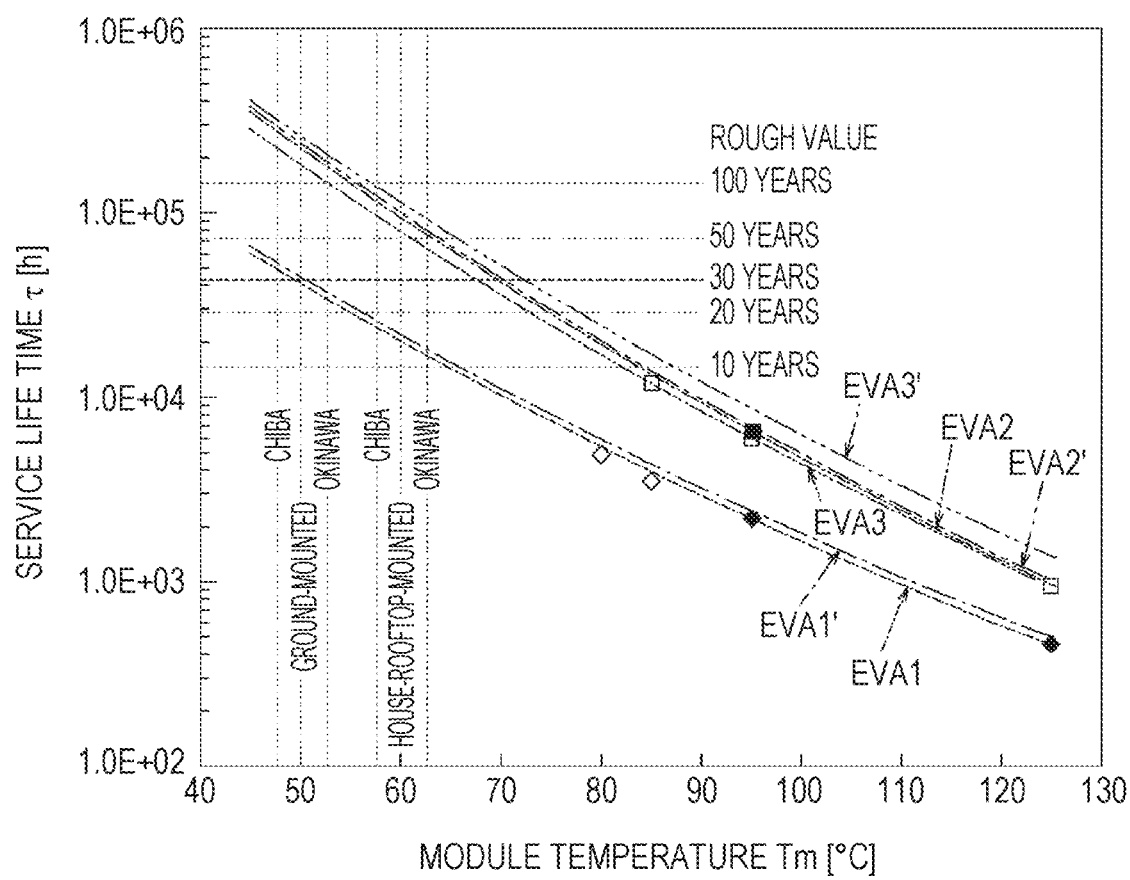
FIG. 27 illustrates an example of a relationship between the useful life based on UV and hygrothermal degradation and temperature.

FIG. 27 illustrates the state in which humidity correction and UV correction are performed on the useful life curves. FIG. 27 illustrates the state before and after humidity correction and UV correction are performed on the useful life curves illustrated in FIG. 26. FIG. 27 illustrates the useful life curves using EVA 1, EVA 2, and EVA 3 before humidity correction and UV correction are performed. In FIG. 27, useful life curves after performing humidity correction and UV correction on the useful life curves using EVA 1, EVA 2, and EVA 3 are illustrated as EVA 1', EVA 2', and EVA 3'. If humidity correction and UV correction are performed on the useful life curve using EVA 1, as illustrated in FIG. 27, the corrections almost cancel each other, and the useful life after the corrections is close to the useful life before the corrections. In addition, even if humidity correction and UV correction are performed on the useful life curve using EVA 2, the corrections almost cancel each other, and the useful life after the corrections is close to the useful life before the corrections. On the other hand, as EVA 3, EVA to which the ultraviolet light absorber is not added is used. Thus, if humidity correction and UV correction are performed on the useful life curve for EVA 3, the influence of humidity correction emerges, and thus, the useful life after the corrections is non-negligibly longer than that before the corrections.

As described above, the information processing apparatus 1 according to an embodiment can estimate the useful life of the PV module more easily and visually via the graph. Therefore, the information processing apparatus 1 according to an embodiment can quantify the prediction of the useful life of the PV module based on degradation reasonably, that is, on an objective basis. Thus, the information processing apparatus 1 according to an embodiment contributes to the evaluation of the quality value regarding long-term reliability of the PV module. Here, the graph is not necessary. For example, the useful life Tv [hours] based on hygrothermal degradation on a (virtual) field (at a humidity of around 90%) may be calculated by using the useful life stress index B illustrated in Formula (2) and the temperature of Tmp_eff illustrated in Formula (47), and the number of useful life years Y may be obtained through the above procedure.

Figure 28:
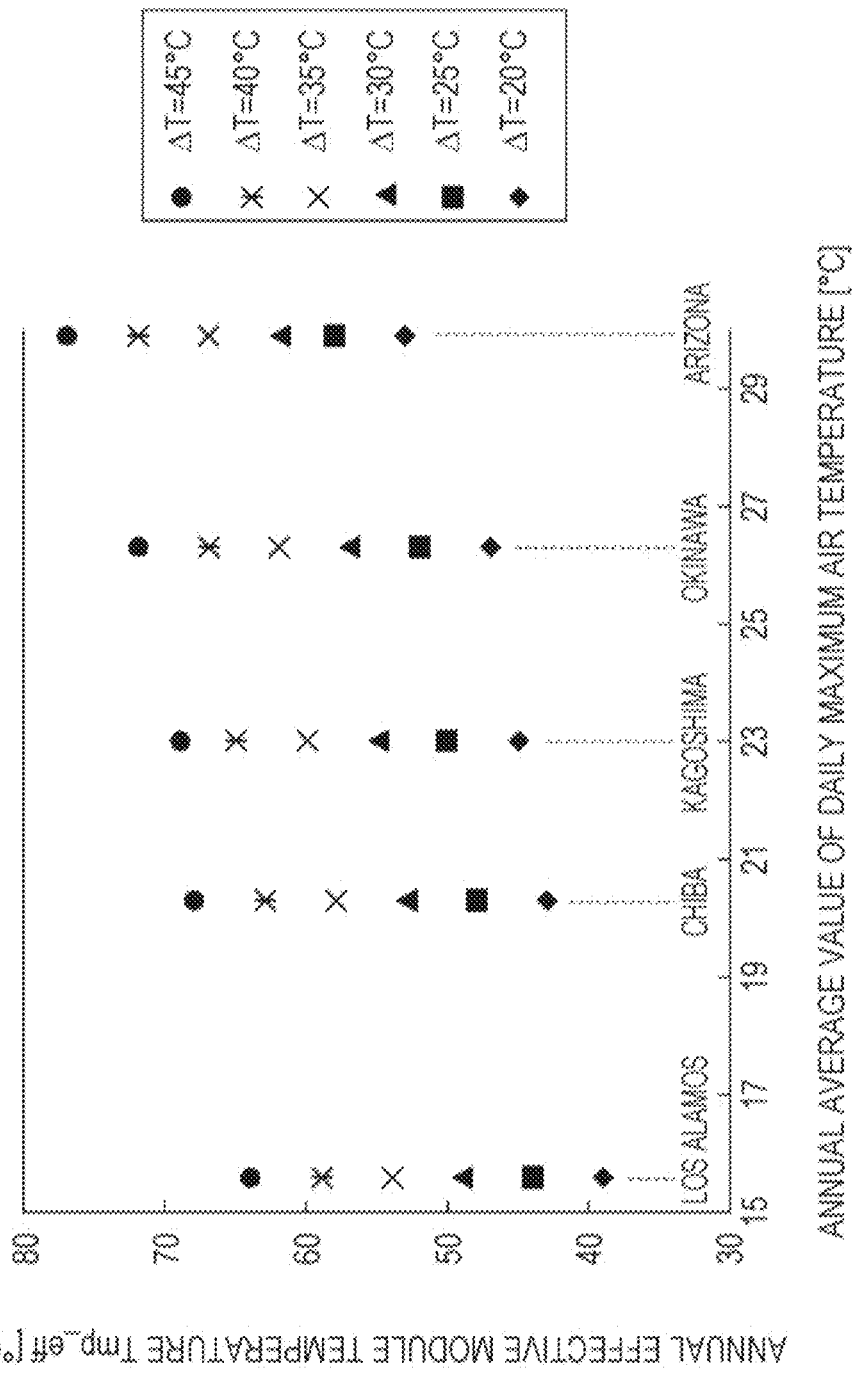
FIG. 28 is a graph illustrating an example of a correlation among Tmp_eff, an annual average value of Tmax, and ΔT.

To estimate the above Tmp_eff, a correlation among Tmp_eff, the annual average value of Tmax, and ΔT can be prepared in advance in the form of a table, a graph, or the like. FIG. 28 illustrates, in the form of a graph, an example of the correlation among Tmp_eff, the annual average value of Tmax, and ΔT. In the graph in FIG. 28, the horizontal axis represents the annual average value of the daily maximum temperature Tmax, and the vertical axis represents the annual effective module temperature Tmp_eff. On the basis of such a graph, as long as the annual average value of Tmax, and ΔT are given, an approximate value of Tmp_eff can be read immediately. A rough value of ΔT may be 25° C. in a case of a ground-deployed PV module and may be 35° C. in a case of a rooftop-deployed PV module. By such calculation, the above prediction of the useful life can be performed more easily. In addition, the annual average value of Tmax may be the average value of the daily maximum atmospheric temperature in the field acquired for one year on each day, or may be an average value of a monthly average of the daily maximum atmospheric temperature in the field acquired for one year.

As described above, Tmp_eff may be defined so as to differ from step G1 in FIG. 5 described above or Formula (47) described later if an approximate value that serves as the rough value is wished to be obtained easily. That is, as illustrated in Formula (28), Tmp_eff and the Tmax annual average may be directly associated with each other without $\exp(-Ea/kTmp)$. In a case of such a definition, for example, as ΔT in Formula (28), the median value of ΔT for 365 days or an annual median value of a monthly average of ΔT may be used. If an annual average of ΔT is used as ΔT in Formula (28), Imp eff may be underestimated. Thus, it is not preferable to use the annual average of ΔT as ΔT in Formula (28). If a more accurate value is necessary as Tmp_eff, a value given by Formula (47) described later with an original definition can be used.

(Useful Life Prediction Using Monthly Atmospheric Temperature Information)

Next, further simplified prediction of the above number of useful life years Y of the PV module will be described.

In the above calculation, atmospheric temperature information (daily maximum atmospheric temperature information) for 365 days throughout a year is necessary. Here, if substantially the same calculation can be performed by using monthly atmospheric temperature information, the number of useful life years can be predicted more easily. The monthly atmospheric temperature information is very easily accessible. Therefore, if the number of useful life years can be predicted by using the monthly atmospheric temperature information, the calculation can be performed easily.

The applicants have found that, when the monthly average value data of the daily maximum atmospheric temperature (Tmax_monthly average) is used as the monthly atmospheric temperature information, consistency with Heff illustrated in Formula (12) and the like is favorable. In this manner, the annual stress index A illustrated in Formula (13) can be calculated as in the following Formula (50) by using Heff as it is.

$$\text{Annual stress index } A \approx \text{Heff} \cdot \Sigma \{\exp(-Ea/k\text{Tmp\_month}) \times \text{number of days in month}\} \quad \text{Formula (50)}$$

Here, the sum total interval is 12 months of each month. The number of days in a month is the number of days in the corresponding month, and, for example, values such as 31 for January, 28 for February, 31 for March, and 30 for April can be given. In addition, in Formula (50), kTmp_month can be defined as in the following Formula (51).

$$Tmp\_\text{month}=T\text{max\_monthly average}+\Delta T \quad \text{Formula (51)}$$

Data of the monthly maximum atmospheric temperature is also easily accessible as the monthly atmospheric temperature information. However, the applicants have confirmed that it is difficult to further simplify the prediction of the number of useful life years by using the data of the monthly maximum atmospheric temperature. By using the data of the monthly maximum atmospheric temperature, the above-described consistency with Heff is not satisfied, which disenables the calculation using Heff as it is.

In addition, the applicants have verified the accuracy of the prediction of the useful life using the monthly atmospheric temperature information. That is, the applicants have calculated the annual stress index A by using daily data. In addition, the applicants have calculated the annual stress index A by using monthly data. As a result, the applicants have confirmed that the difference between both is within about 5%.

As described above, the information processing apparatus 1 according to an embodiment can estimate the annual stress index A with sufficient accuracy by using only the monthly atmospheric temperature information. Thus, the information processing apparatus 1 according to an embodiment can estimate the useful life of the PV module more easily with practical accuracy by using the above-described useful life stress index B, humidity correction coefficient Hc, and UV correction coefficient Uc. Therefore, the information processing apparatus 1 according to an embodiment can quantify the prediction of the useful life of the PV module based on degradation reasonably, that is, on an objective basis. Thus, the information processing apparatus 1 according to an embodiment contributes to the evaluation of the quality value regarding long-term reliability of the PV module.

(Correction Using Annual Effective Power Generation Day Rate)

As necessary, the above number of useful life years Y can be corrected as in the following Formula (52) by using an annual effective power generation day rate.

Number of useful life years Y after correction=number of useful life years Y before correction/annual effective power generation day rate     Formula (52)

Here, the annual effective power generation day rate is a ratio of the number of days during which the PV module can generate power effectively among 365 days in a year. For example, rainy days during which the PV module generates almost no power are excluded from effective power generation days. Regarding this ratio, for cloudy days, on the basis of a power generation amount for sunny days, power generation amount for cloudy days/the power generation amount for sunny days is counted as an effective number of days for one cloudy day (value between 0 and 1). This correction is particularly useful in an area with a rainy season, such as tropical regions.

(Useful Life Prediction by Testing of Collected Products)

Next, the prediction of the useful life by further performing an acceleration test on a collected product of a PV module in the field will be described. The prediction of the useful life described below may be performed independently of the above prediction of the useful life. In the prediction of the useful life described below, an acceleration test is further performed on the collected product of the PV module from the field, and a residual useful life of the PV module is obtained for the prediction of the useful life in the field.

A method of estimating the useful life from results of further performing the acceleration test on the collected product in the field is conventionally known. However, as described above, not a single cause makes the PV module degrade. In the prediction of the useful life of the PV module, it is necessary to consider both degradation caused by UV stress and degradation caused by hygrothermal stress. In this case, the useful life prediction is not possible by the conventionally known method. Therefore, when considering both degradation caused by UV stress and degradation caused by hygrothermal stress, it is necessary to perform the useful life prediction by a method that is more advanced than the conventionally known method.

In the useful life prediction described below, the PV module deployed in the field is collected and an additional test is performed.

(Useful Life Prediction Method without Influence of UV Light)

First, a case of estimating the useful life of a PV module without the influence of UV light will be described with reference to FIG. 29. This assumes a case of estimating the useful life of the PV module using EVA not including the ultraviolet absorber UVA. This useful life prediction can be performed by using a conventionally known idea.

In the useful life prediction using an additional test of the collected product, first, a damp heat test is performed on a new PV module (initial product) that can be regarded as having substantially the same specifications as the collected product. For example, as a result of a damp heat test (DH test) at a temperature of 95° C. and a humidity of 95%, the initial product reaches the useful life at a [hours]. Here, the useful life may be, as described above, the time until the output characteristics of the PV module rapidly decrease. (1) illustrated in FIG. 29 indicates, by the length in the lateral direction, the stress amount until the PV module reaches the useful life as a result of performing the DH test on the initial product for a [hours].

Next, it is assumed that a PV module that has been deployed in a certain field for X [years] has been collected. Then, a damp heat test (substantially the same DH test as above) at a temperature of 95° C. and a humidity of 95% is performed on the collected PV module (collected product). As a result, it is assumed that the collected product reaches the useful life at $\beta$ [hours]. (2) illustrated in FIG. 29 indicates, by the length in the lateral direction, the stress amount until the PV module reaches the useful life as a result of performing the DH test on the collected product for $\beta$ [hours].

From the above results, (3) (=(1)-(2)) illustrated in FIG. 29 indicates, by the length in the lateral direction, the stress amount of being deployed in the field for X [years]. That is, it is considered that the stress amount of performing the DH test on the initial product for a [hours] is equal to the sum of the stress amount of the collected product being deployed in the field for X [years] and the stress amount of the collected product being subjected to the DH test for $\beta$ [hours]. Therefore, it can be considered that the stress amount of a certain PV module being deployed in the field for X [years] is equal to the stress amount of the PV module being subjected to the DH test for $(\alpha-\beta)$ [hours].

In this case, a number of useful life years Yp [years] predicted in a case where the initial product is deployed in the field can be expressed as in the following Formula (53).

$$Yp[\text{years}]=(X\,[\text{Years}]/(\alpha-\beta))\times\alpha \qquad \text{Formula (53)}$$

In this manner, the information processing apparatus 1 according to an embodiment can obtain the number of useful life years Yp [years] in a case where a certain PV module is deployed in a certain field from the start.

(Useful Life Prediction Method with Influence of UV Light)

Next, a case of estimating the useful life of a PV module considering the influence of UV light will be described with reference to FIG. 30. This assumes a case of estimating the useful life of the PV module using EVA to which the ultraviolet absorber UVA is added, or the like. This useful life prediction cannot be performed by using a conventionally known idea and needs to be performed by using a further developed idea.

Also in this case, in the useful life prediction using the additional test of the collected product, first, a damp heat test is performed on a new PV module (initial product) that can be regarded as having substantially the same specifications as the collected product. For example, as a result of a damp heat test (DH test) at a temperature of 95° C. and a humidity of 95%, the initial product reaches the useful life at α [hours]. Here, the useful life may be, as described above, the time until the output characteristics of the PV module rapidly decrease. (1) illustrated in FIG. 30 indicates, by the length in the lateral direction, the stress amount until the PV module reaches the useful life as a result of performing the DH test on the initial product for α [hours].

Next, it is assumed that a PV module that has been deployed in a certain field for X [years] has been collected. Then, a damp heat test (substantially the same DH test as above) at a temperature of 95° C. and a humidity of 95% is performed on the collected PV module (collected product). As a result, it is assumed that the collected product reaches the useful life at β [hours]. (2) illustrated in FIG. 30 indicates, by the length in the lateral direction, the stress amount until the PV module reaches the useful life as a result of performing the DH test on the collected product for β [hours].

From the above results, (3) (=(1)-(2)) illustrated in FIG. 30 indicates, by the length in the lateral direction, the stress amount of being deployed in the field for X [years]. That is, it is considered that the stress amount of performing the DH test on the initial product for α [hours] is equal to the sum of the stress amount of the collected product being deployed in the field for X [years] and the stress amount of the collected product being subjected to the DH test for β [hours]. Therefore, it can be considered that the stress amount of a certain PV module being deployed in the field for X [years] is equal to the stress amount of the PV module being subjected to the DH test for (α-β) [hours].

Subsequently, a UV irradiation test (UV test) is performed on a new PV module (initial product) that can be regarded as having substantially the same specifications as the collected product, and further, a damp heat test (DH test) at a temperature of 95° C. and a humidity of 95% is performed thereon. Such a sequential test (UV DH sequential test) is also referred to as a combined sequential test. Here, the energy amount of UV irradiation may be an amount corresponding to the energy for which it is expected that the generation amount of acetic acid generated by being exposed to UV light in the field is almost saturated. Here, a time period until acetic acid generated by being exposed to UV light in the field is almost saturated is represented by Z [years] as an effective number of UV stress years.

The energy amount of UV irradiation in the UV test may be, for example, 250 to 300 kWh/m². This is the energy amount corresponding to a UV irradiation energy in the field in Japan for about three years. In this case, it is assumed that the fact that the generation amount of acetic acid caused by UV light is saturated by the UV irradiation energy in the field for about three years is known by, for example, other experiments or the like. The other experiment may be, for example, an experiment of analyzing an acetic acid concentration in EVA with respect to the irradiation energy amount of UV light, as illustrated in FIG. 31.

Figure 31:
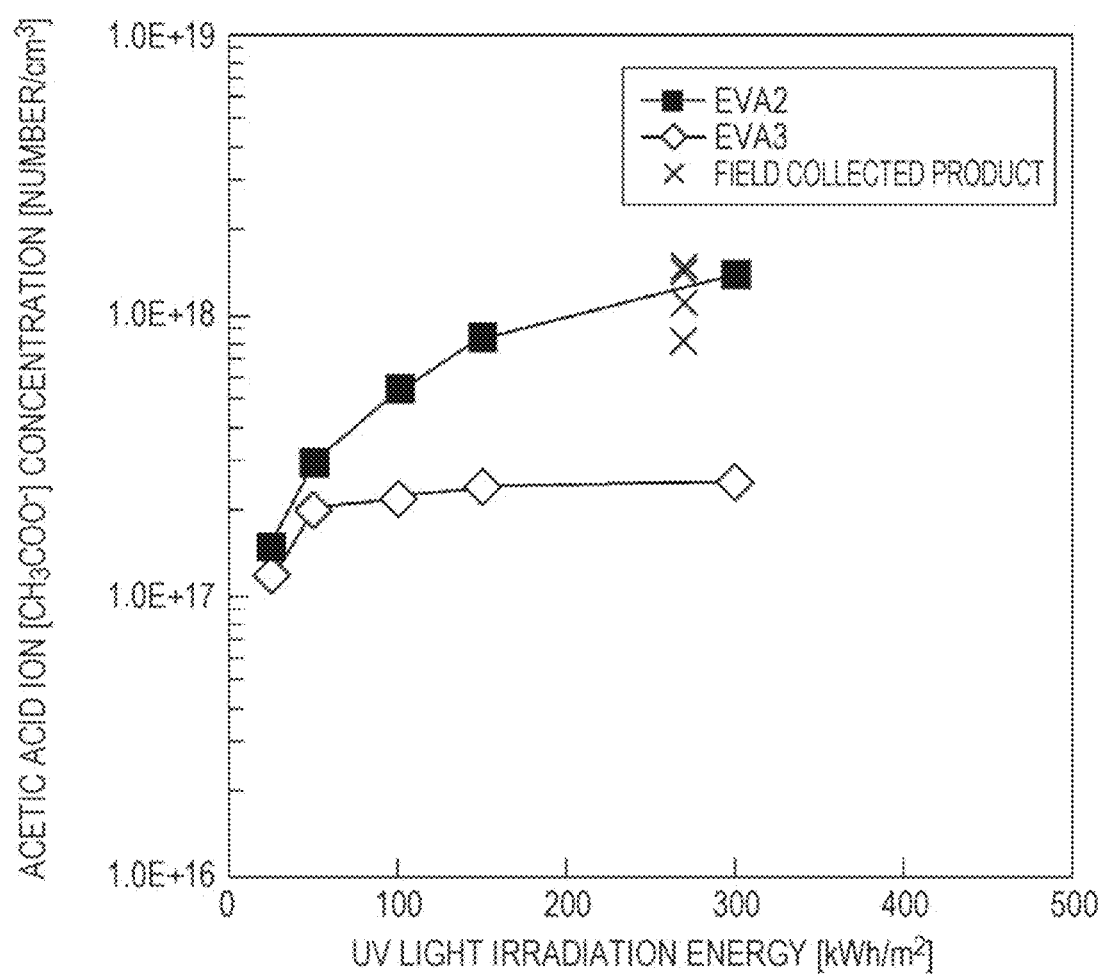
FIG. 31 illustrates an example of results of experiments of analyzing acetic acid concentration with respect to an irradiation energy amount of UV light.

FIG. 31 illustrates an example of results of experiments of analyzing an acetic acid concentration (more technically, acetic acid ion concentration [$CH_3COO^-$]) in EVA with respect to the irradiation energy amount of UV light. FIG. 31 illustrates analysis results of a module using EVA 2 (improved EVA with addition of the ultraviolet absorber), a module using EVA 3 (improved EVA without addition of the ultraviolet absorber), and a field collected product (a module collected from the field) using EVA having substantially the same specifications as EVA 2.

As a result of the above UV DH test, by the DH test (performed sequentially to the UV test), it is assumed that the initial product reaches the useful life at γ [hours]. (4) illustrated in FIG. 30 indicates, by the length in the lateral direction, the stress amount until the PV module reaches the useful life as a result of, after performing the UV test on the initial product, performing the DH test for γ [hours].

From the above results, (5) (=(1)-(4)) illustrated in FIG. 30 indicates the stress amount of the initial product being subjected to a UV test in the field for Z [years]. That is, it can be considered that the stress amount (5) of the initial product being subjected to the UV test in the field for Z [years] is equal to the stress amount of the PV module being subjected to the DH test for (α-γ) [hours]. In other words, (α-γ) [hours] represents the amount of UV stress converted into the time of the DH test giving the stress amount that is equal thereto.

Here, it is assumed that it is known that the generation of acetic acid caused by UV light is saturated if the initial product is exposed to UV light in the field for Z [years] years. Thus, it is noted that, as the collected product, a PV module satisfying X>Z when the number of years during which the PV module is deployed in the field is X [years] needs to be used.

Incidentally, the stress amount (3) illustrated in FIG. 30, that is, the stress amount of the collected product deployed in the field for X [years] is expected to include the amount of UV stress and the amount of hygrothermal stress. That is, (3) illustrated in FIG. 30 can be considered to correspond to the sum of the UV stress amount (6) illustrated in FIG. 30 and the hygrothermal stress amount (7) illustrated in FIG. 30. As described above, the UV stress amount (6) in the field can be represented as (α-γ) [hours] if being converted into the time of the DH test giving the stress amount that is equal thereto. On the other hand, the hygrothermal stress amount (7) in the field can be represented as (γ-β) [hours] if being converted into the time of the DH test.

From the above results, it can be considered that the hygrothermal stress amount of a certain PV module being deployed in the field for X [years] is equal to the stress amount of the PV module being subjected to the DH test for (γ-β) [hours].

In this case, the number of useful life years Yp [years] based on degradation due to UV and hygrothermal stress in a case where the initial product is deployed in the field can be predicted as in the following Formula (54).

$$Yp[\text{years}] = (X\ [\text{Years}]/(\gamma-\beta)) \times \gamma \qquad \text{Formula (54)}$$

In this manner, the information processing apparatus 1 according to an embodiment can obtain, considering the influence of UV light, the number of useful life years Yp [years] in a case where a certain PV module is deployed in a certain field from the start.

In addition, since UV correction coefficient Uc=γ/α, the number of useful life years Yp can also be expressed as in the following Formula (55) by using Uc.

$$\text{Number of useful life years } Yp[\text{years}] = X[\text{years}]/(1-\beta/(Uc \times \alpha)) \qquad \text{Formula (55)}$$

(Useful Life Prediction Considering Effective Number of UV Stress Years Z)

In the above prediction, from the relationship between the irradiation energy amount of UV light and the generation amount of acetic acid caused by UV light, which is obtained from an experiment of irradiating the initial product with UV light, it was assumed that the generation amount of acetic acid caused by UV light is almost saturated by UV light irradiation in the field for Z years. In addition, in the useful life prediction using the above UV DH sequential test, the UV correction coefficient Uc is calculated by performing a test by adding a predetermined amount of the UV irradiation energy at once before adding hygrothermal stress. That is, in the UV DH sequential test, a state in which acetic acid is sufficiently generated by the predetermined UV light energy corresponding to that in the field for Z years is formed in advance, and then, by adding hygrothermal stress, the acetic acid concentration increases exponentially. This situation differs from the situation that actually occurs in the field. That is, on the actual field, the UV light energy corresponding to that for Z years is not given at once, and, depending on weather conditions, the UV light energy of less than or equal to the predetermined amount is given every day throughout Z years.

Incidentally, the reason why the acetic acid concentration in EVA increases exponentially is that hydrogen ions released as a result of ionization of part of acetic acid act as a catalyst that promotes a hydrolysis reaction of EVA (acetic acid generation reaction). In other words, the reason why the acetic acid concentration increases exponentially is that acetic acid that is already present has acts to increase the rate at which acetic acid is subsequently generated (this phenomenon is known as acid-catalyst hydrolysis reaction). That is, the acetic acid concentration that is present at a moment determines the increase speed of acetic acid at the moment.

Considering the above, in the UV DH sequential test, because of initial irradiation with the predetermined amount of the UV light energy corresponding to that for Z years, a large amount of acetic acid due to UV light corresponding to the UV light energy amount for Z years is already generated in EVA. The increase speed of acetic acid by the hydrolysis reaction of EVA under hygrothermal stress is, as described above, dependent on the acetic acid concentration that is already present. Thus, the increase speed of the acetic acid concentration in EVA in the DH test after being subjected to the UV light energy for Z years is much faster than the increase speed in the DH test alone without UV light irradiation.

On the other hand, what occurs on the actual field is, although varying more or less depending on weather conditions, the situation in which UV light stress and hygrothermal stress are added to the PV module every day and almost at the same time.

Here, for the UV DH sequential test, a UV DH sequential cycle test is assumed in which a UV test, a DH test, a UV test, and a DH test are sequentially repeated with shorter test time in each of the UV tests and the DH tests, which are sequentially performed in the form of a cycle test. However, it is assumed that the total UV test time and the total DH test time will be maintained unchanged even if the number of cycles is changed.

Here, the generation of acetic acid by the hydrolysis reaction of EVA under hygrothermal stress is caused by the acid-catalyst hydrolysis reaction. In addition, the increase speed of acetic acid increases in proportion to the acetic acid concentration that is present at that time. Considering the above, it can be understood that the increase speed of the acetic acid concentration in the UV DH sequential cycle test becomes slower than the increase speed of the acetic acid concentration in the UV DH sequential test. In the UV DH sequential test, a large amount of UV light energy corresponding to that for Z years is added initially, acetic acid due to the large amount of UV light is generated, and under hygrothermal stress where a large amount of acetic acid is present, the acid-catalyst hydrolysis reaction proceeds. In contrast, in the UV DH sequential cycle test, the acetic acid generation amount due to UV light is smaller in a stage where the number of cycles is smaller (early stage of the cycle test), and the acid-catalyst hydrolysis reaction is difficult to proceed even if hygrothermal stress is added.

In summary, the efficiency of the acid-catalyst hydrolysis reaction during the DH test is relatively high in the UV DH sequential test, and the efficiency of the acid-catalyst hydrolysis reaction during the DH test is relatively low in the UV DH sequential cycle test. What occurs on the actual field can be considered to be the limit of reducing the cycle interval of the UV DH sequential cycle test to an infinitesimal. In this case, it is obvious that the efficiency of the acid-catalyst hydrolysis reaction during the DH test in the UV DH sequential cycle test assuming the actual field is lower than the efficiency of the acid-catalyst hydrolysis reaction during the DH test in the UV DH sequential test. That is, the time until the same acetic acid concentration is longer in the UV DH sequential cycle test assuming the actual field than in the UV DH sequential test.

From the above description, it can be understood that the method of calculating the useful life of the field collected product on the basis of results of the UV DH sequential test tends to estimate the useful life shorter than the actual useful life. The prediction error can be regarded as about Z years at most. Thus, as in the following Formula (56), a more accurate number of useful life years Yp' due to UV and hygrothermal degradation in the field may be obtained. Here, Z is referred to as the effective number of UV stress years.

$$\text{Number of useful life years } Yp' \text{ [years]} = Yp + Z \quad \text{Formula (56)}$$

(Actual Examples of Yp and Yp')

Examples of results obtained by collecting PV modules actually deployed in the field and further performing a damp heat test thereon will be illustrated below. Here, the PV modules deployed in Okinawa area were collected, and the damp heat test was performed. In addition, the PV modules that were collected and further subjected to the damp heat test include a PV module using conventional EVA and a PV module using improved EVA.

By collecting the PV modules and further performing the damp heat test as described above, the following results were obtained. That is, the useful life Yp of the PV module using conventional EVA was predicted as about 10 to 15 years (about 13 to 18 years if corrected by using the effective number of stress years Z). On the other hand, the useful life Yp of the PV module using improved EVA was predicted as about 40 to 50 years (about 43 to 53 years if corrected by using Z). Here, the on-field annual effective module temperature Tmp_eff of the collected PV modules was predicted as about 57 to 60° C. (ΔT≈30 to 33° C.) on the basis of annual atmospheric temperature information in Okinawa area, information of the mounting style of the PV modules, and the like.

Figure 32:
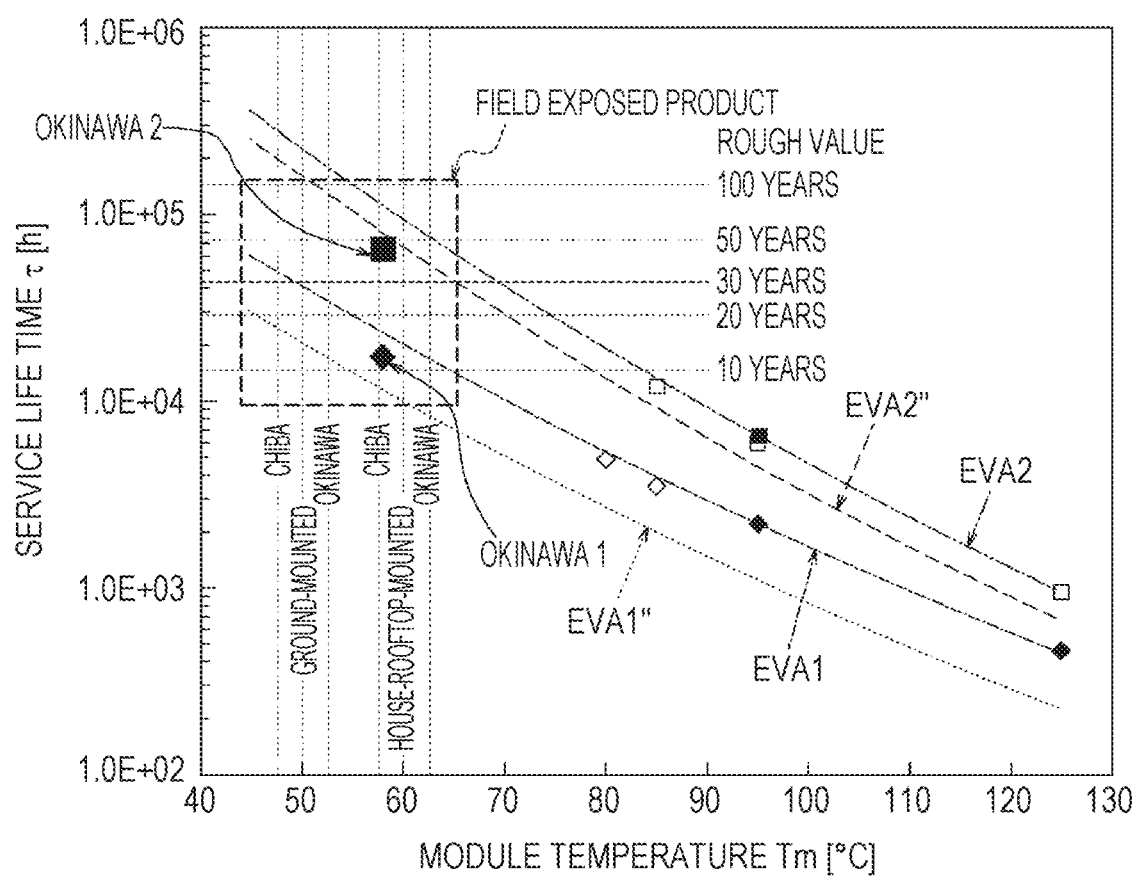
FIG. 32 is a diagram in which the useful life of field collected products is plotted on a graph illustrating examples of the relationship between the useful life based on UV and hygrothermal degradation and temperature.
Figure 33:
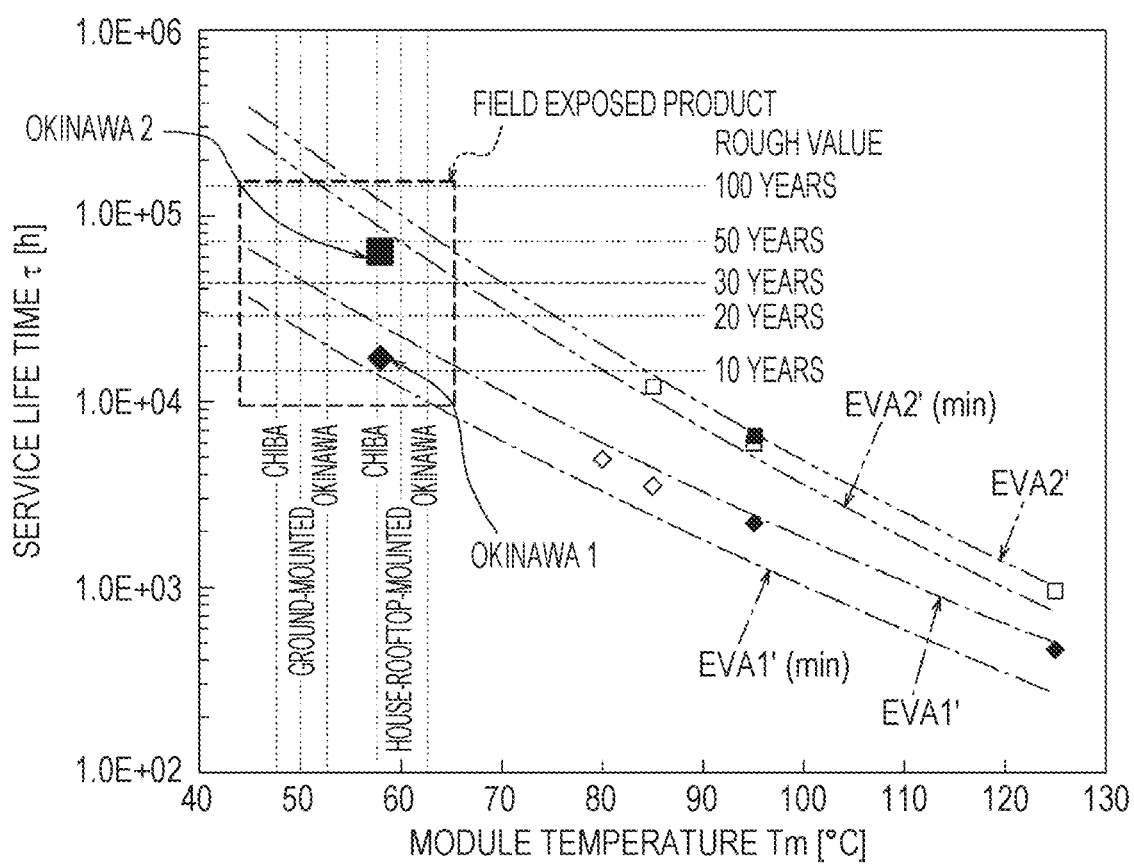
FIG. 33 is a diagram in which the useful life of field collected products is plotted on a graph illustrating examples of the relationship between the useful life based on UV and hygrothermal degradation and temperature.
Figure 34:
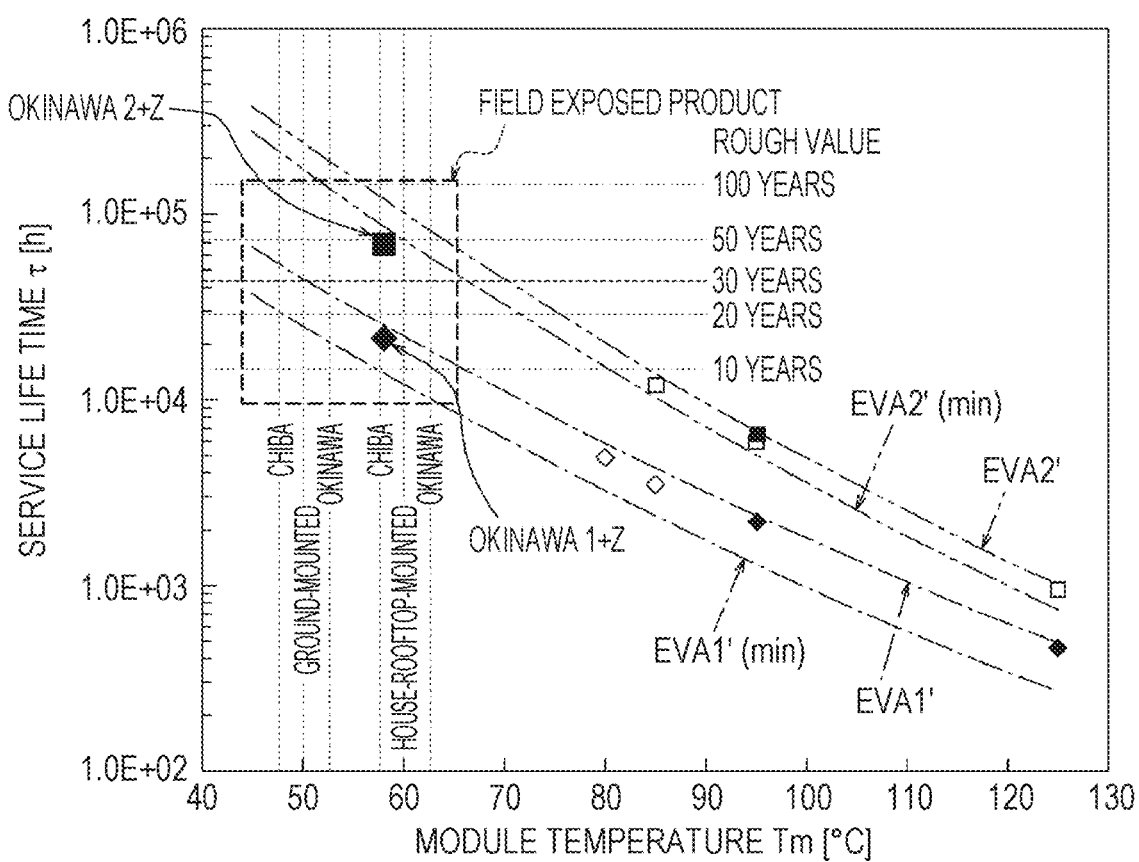
FIG. 34 is a diagram in which the useful life of field collected products is plotted on a graph illustrating examples of the relationship between the useful life based on UV and hygrothermal degradation and temperature.

FIG. 32, FIG. 33, and FIG. 34 illustrate examples of results by additionally plotting the information obtained in the above manner (Tmp_eff and the number of useful life years Yp or Yp') for the field collected products on a graph illustrating the relationship between the useful life based on hygrothermal degradation and the temperature (useful life curve). In the graphs in FIG. 32, FIG. 33, and FIG. 34, the horizontal axis represents the module temperature Tm, and the vertical axis represents the useful life τ in the damp heat test. Here, the module temperature Tm can be given by a test temperature in a case of the damp heat test and can be given by the annual effective module temperature Tmp_eff in a case of field-mounting. When the number of useful life years Yp [years] or Yp' [years] was converted into the useful life τ [h], as in the case illustrated in Formula (49), the conversion was performed via Heff (hereinafter, "useful life" will be also simply referred to as "useful life".) Here, the dot for "Okinawa 1" is the useful life of the PV module using conventional EVA (EVA corresponding to EVA 1), and the dot for "Okinawa 2" is the useful life of the PV module using improved EVA (EVA corresponding to EVA 2).

In FIG. 32 the useful life curves of EVA 1 and EVA 2 before humidity correction and UV correction are illustrated, and the useful life curves of EVA 1" and EVA 2" after only UV correction are illustrated. FIG. 33 illustrates useful life curves of EVA 1' and EVA 2' after humidity correction and UV correction by using a rough value of an upper limit of a humidity correction coefficient (the humidity correction coefficient of EVA 1' is 2.2, and the humidity correction coefficient of EVA 2' is 1.6). In addition, FIG. 33 illustrates useful life curves of EVA 1'(min) and EVA 2'(min) after humidity correction and UV correction by using a rough value of a lower limit of the humidity correction coefficient (the humidity correction coefficient of EVA 1'(min) is 1.2, and the humidity correction coefficient of EVA 2'(min) is 1.1). FIG. 34 illustrates results obtained by replacing the dots for Okinawa 1 and Okinawa 2 in the graph illustrated in FIG. 33 by Okinawa 1+Z and Okinawa 2+Z. Here, Okinawa 1+Z is plotted by converting the number of useful life years Yp' [years], obtained by adding three years as the effective number of UV stress years Z to the number of useful life years Yp [years] of the PV module using conventional EVA, into the useful life τ [h]. In addition, Okinawa 2+Z is plotted by converting the number of useful life years Yp' [years], obtained by adding three years as the effective number of UV stress years Z to the number of useful life years Yp [years] of the PV module using improved EVA, into the useful life τ [h].

An example of the above calculation, that is, the calculation of the number of useful life years of the PV module, performed by the information processing apparatus 1 according to an embodiment will be further described.

As described above, in the information processing apparatus 1 according to an embodiment, the control unit 10 can perform various calculations on the basis of input of various types of information acquired from the input unit 20 and/or the communication unit 40. In addition, in the information processing apparatus 1 according to an embodiment, the control unit 10 can output results of various calculations from the output unit 30 and/or the communication unit 40. Therefore, the information processing apparatus 1 according to an embodiment can output information of various results on the basis of input of necessary various types of information.

More specifically, the information processing apparatus 1 according to an embodiment may output result information on the basis of input of first information, second information, and third information. Here, the first information may be information indicating an amount of hygrothermal stress that a PV module receives from start until end of a time period during which the PV module is capable of outputting predetermined electric power, such as the above useful life stress index B (step S7 in FIG. 4). The second information may be information indicating an amount of hygrothermal stress that the PV module receives per predetermined time period in the field where the PV module is deployed, such as the above annual stress index A (step S6 in FIG. 4). The third information may be information indicating an amount of ultraviolet light stress that the PV module receives in the field, such as the above UV correction coefficient Uc (step S11 in FIG. 4). In addition, the result information may be information about the time period during which the PV module is expected to be capable of outputting the predetermined electric power if the PV module is deployed in the field, such as the above number of useful life years Y (step S12 in FIG. 4).

In addition, the first information may be generated on the basis of the activation energy Ea of hygrothermal degradation obtained from results of damp heat tests performed on the PV modules under two or more temperature conditions (step S5 in FIG. 4). In addition, the second information may be generated on the basis of information about a daily maximum temperature of the PV module in the field where PV module is deployed, such as information indicating Tmp (step S3 in FIG. 4).

The information processing apparatus 1 according to an embodiment may output the result information by taking into account correction based on hygrothermal stress that the PV module receives in the field, such as correction using the above humidity correction coefficient Hc (step S9 in FIG. 4).

More specifically, the information processing apparatus 1 according to an embodiment may output result information on the basis of input of the first information and the second information. Here, the first information may be information indicating an amount of hygrothermal stress that the PV module receives from start until end of a time period during which the PV module is capable of outputting predetermined electric power, such as the above useful life stress index B (step S7 in FIG. 4). The second information may be information indicating an amount of hygrothermal stress that the PV module receives per predetermined time period in the field where the PV module is deployed, such as the above annual stress index A (step S6 in FIG. 4). In particular, for example, the second information may be information indicating an amount of hygrothermal stress that the PV module receives in the field for a year. In addition, the result information may be information about the time period during which the PV module is expected to be capable of outputting the predetermined electric power if the PV module is deployed in the field, such as the above number of useful life years Y (step S12 in FIG. 4). In addition, the second information may be generated on the basis of information about a daily maximum temperature of the PV module in the field where PV module is deployed, such as the information indicating Tmp (step S3 in FIG. 4).

In addition, the first information and/or the second information may be, for example, generated on the basis of the activation energy Ea of hygrothermal degradation obtained from results of damp heat tests performed on the PV module under two or more temperature conditions (step S5 in FIG. 4).

The second information may be generated on the basis of a value obtained by dividing a sum total, in a unit of a predetermined time period, the amount of which is in proportion to daily hygrothermal stress in the PV module deployed in the field, by an amount in proportion to hygrothermal stress per unit time at a maximum temperature of the PV module deployed in the field.

In addition, in the second information, a daily time during which the PV module deployed in the field receives hygrothermal stress may be a time that may differ from day to day, such as Neff in the above Formula (10). On the other hand, in the second information, a daily time during which the PV module deployed in the field receives hygrothermal stress may be a constant value throughout a year, such as Heff in the above Formula (12) or step S4 in FIG. 4.

The information processing apparatus 1 according to an embodiment may output the result information by taking into account, correction based on humidity stress that the PV module receives in the field, such as correction using the above humidity correction coefficient Hc (step S9 in FIG. 4). In addition, the information processing apparatus 1 according to an embodiment may output the result information by taking into account, correction based on ultraviolet stress that the PV module receives in the field, such as correction using the above UV correction coefficient Uc (step S11 in FIG. 4). Either one or both of the above two corrections may be taken into account.

In addition, the information processing apparatus 1 according to an embodiment can output, as described above, information of various results on the basis of input of necessary various types of information. More specifically, the information processing apparatus 1 according to an embodiment can output result information on the basis of input of third information and fourth information.

Here, the third information may be information indicating a representative value of a temperature of the PV module deployed in the field throughout a year, such as the above annual effective module temperature Tmp_eff (step G1 in FIG. 5).

In addition, the fourth information is information indicating a correlation obtained from the results of two or more tests performed under different environment conditions, and may be a correlation between at least one of the temperature and a humidity of the PV module, and a time period during which the PV module is capable of outputting predetermined electric power. Here, the fourth information may be, for example, generated in the manner described in step G2 in FIG. 5. That is, as described in step G2 in FIG. 5, the correlation may be obtained by setting, for example, the temperature of the PV module as the module temperature Tm and the time period during which the PV module is capable of outputting the predetermined electric power as useful life T. Such a correlation may be, as described above, obtained from results of two or more tests performed under different environment conditions.

In addition, the result information may be information about the time period during which the PV module is expected to be capable of outputting the predetermined electric power in the field, such as the above number of useful life years Y (step G5 in FIG. 5).

The information processing apparatus 1 according to an embodiment may output the result information by taking into account, correction based on humidity stress that the PV module receives in the field, such as correction using the above humidity correction coefficient Hc (step S9 in FIG. 5). In addition, the information processing apparatus 1 according to an embodiment may output the result information by taking into account correction based on ultraviolet stress that the PV module receives in the field, such as correction using the above UV correction coefficient Uc (step S11 in FIG. 5). Either one or both of the above two corrections may be taken into account.

In addition, the third information may be generated on the basis of hygrothermal stress that the PV module receives per predetermined time period in the field where the PV module is deployed, such as the above annual stress index A (step S6 in FIG. 4). Here, the third information may be, for example, determined on the basis of information of a monthly average of a daily maximum atmospheric temperature in the field acquired for a year.

In addition, the fourth information may be, for example, information indicating a correlation obtained from the results of the tests performed under temperature conditions within a predetermined temperature difference. In addition, the fourth information may also be, for example, information indicating a correlation obtained from the results of the tests performed under humidity conditions within a predetermined humidity difference.

(Useful Life Prediction Using Only Collected Products from the Field)

Next, a method of estimating the useful life of a PV module by using only a collected product of the PV module deployed in the field without using a new PV module (initial product) will be described. According to this method, since the useful life of the PV module can be predicted without needing the initial product of the PV module, the useful life prediction with higher versatility can be implemented.

To estimate the useful life by using only PV modules collected from the field (field collected products), first, at least two (two or more) PV modules collected from the same field are prepared.

Here, the plurality of collected PV modules need to satisfy the following conditions, for example.
(1) Specifications of the plurality of PV modules (e.g., model or specification of materials) are the same
(2) The timing at which the plurality of PV modules are deployed in the same field is the same
(3) The time period during which the plurality of PV modules are deployed in the same field is the same
(4) The mounting style (or situation) in which the plurality of PV modules are deployed in the same field is the same In the above conditions, "same" may include a case that can be regarded as almost the same, even if not the same in a technical meaning. In short, the plurality of collected PV modules need a history that the plurality of PV modules having the same specifications (or specifications that can be regarded as the same) are used under the same environment conditions (or environment conditions that can be regarded as the same).

Here, the time period during which a PV module is deployed in the field is desirably more than or equal to three years, more preferably more than or equal to five years. If the time period during which the PV module is deployed in the field is more than or equal to three years, more preferably more than or equal to five years, the above generation of acetic acid caused by UV light can be regarded as being almost saturated. That is, the PV module in such a state is in a state in which the influence of shortening of the useful life caused by UV light is maximum. In other words, after such a state, the acetic acid concentration in the PV module increases mainly because the hydrolysis reaction of EVA occurs owing to ingress of moisture from outside air into the EVA encapsulant. If a PV module collected from the field is in the above state, the influence of shortening of the useful life caused by UV light is already maximum in the PV module. Therefore, for such a PV module, as described below, the useful life prediction can be performed without using the UV correction coefficient Uc. On the other hand, if a PV module that is deployed in the field for less than three years is collected and used, the useful life prediction described below tends to overestimate the useful life. In such a case, as described above, by using the UV correction coefficient Uc, the useful life of the PV module can be accurately calculated.

Figure 35:
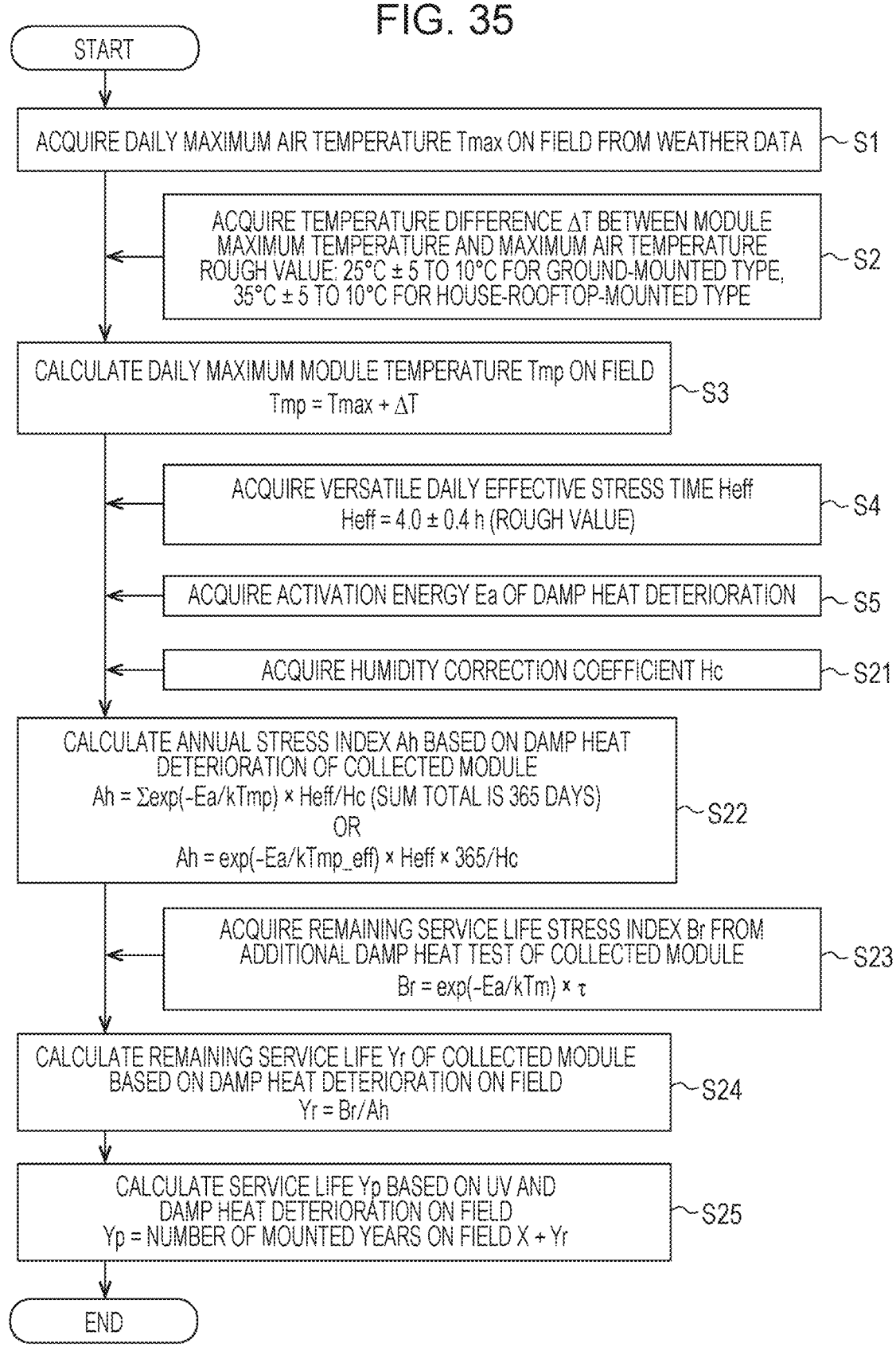
FIG. 35 illustrates another logic flow for useful life prediction according to an embodiment.

FIG. 35 illustrates a logic flow of the useful life prediction using only a product collected from the field. As in the above FIG. 4, FIG. 35 schematically illustrates a logic flow when the information processing apparatus 1 according to an embodiment performs the useful life prediction. As illustrated in FIG. 35, the information processing apparatus 1 according to an embodiment may perform the useful life prediction on the basis of the following logic flow.

To estimate the useful life by using only a PV module collected from the field (field collected product), as described above, at least two or more PV modules collected from the same field are prepared. Then, the at least two or more PV modules collected from the same field are divided into two or more groups. A case in which two PV modules collected from the field are prepared, and the collected products are divided into Group 1 and Group 2 one by one will be described below. Here, in a case where one group includes a plurality of collected products, an average may be obtained for information (residual useful life) of results regarding the collected products described below. In addition, in a case of dividing into three or more groups, the least squares method may be used for obtaining the activation energy Ea of the hygrothermal degradation described below.

Upon the start of the logic flow illustrated in FIG. 35, as illustrated in step S1, the control unit 10 of the information processing apparatus 1 acquires the daily maximum atmospheric temperature Tmax in the field. Step S1 may be performed in substantially the same manner as step S1 illustrated in FIG. 4.

As illustrated in step S2 in FIG. 35, the control unit 10 acquires ΔT (temperature difference between the module maximum temperature Tmp and the daily maximum atmospheric temperature Tmax). Stem S2 may be performed in substantially the same manner as step S2 illustrated in FIG. 4.

As illustrated in step S3 in FIG. 35, the control unit 10 calculates the daily maximum temperature Tmp (=Tmax+ΔT) of the PV module in the field. Step S3 may be performed in substantially the same manner as step S3 illustrated in FIG. 4.

As illustrated in step S4 in FIG. 35, the control unit 10 acquires the daily effective stress time Heff, which can be used in a versatile manner throughout a year. Step S4 may be performed in substantially the same manner as step S4 illustrated in FIG. 4.

As illustrated in step S5 in FIG. 35, the control unit 10 acquires the activation energy Ea of hygrothermal degradation. The activation energy Ea of hygrothermal degradation may be acquired as follows.

First, the PV modules that are collected from the field and divided into Group 1 and Group 2 may be input to acceleration tests under different conditions. That is, the collected product in Group 1 may be subjected to, for example, a damp heat test at a temperature T1 and a relative humidity (RH) H0. On the other hand, the collected product in Group 2 may be subjected to, for example, a damp heat test at a temperature T2 and the relative humidity (RH) H0. Here, the temperature T1 and the temperature T2 may be employed from, for example, a temperature range of about 85° C. to 95° C. Specifically, T1=85° C. and T2=95° C. may be set. In addition, the relative humidity (RH) H0 may be employed from a humidity range of about 85% to 95%. Specifically, H0=95% may be set.

The damp heat test may be performed until the PV module collected from the field reaches the useful life. As a result, the time from the start of the test until the useful life is acquired. This time is the residual useful life T. That is, a residual useful life T1 is obtained for the PV module in Group 1. On the other hand, a residual useful life T2 is obtained for the PV module in Group 2.

The activation energy Ea of hygrothermal degradation can be calculated from the above Formula (3) by using the information obtained as above. Formula (3) is illustrated below again. Here, each of the temperature T1 and the temperature T2 is a value represented by the absolute temperature [K].

$$\exp(-Ea/kT1) \times \tau 1 = \exp(-Ea/kT2) \times \tau 2 \qquad \text{Formula (3)}$$

If Formula (3) is solved for Ea, the following Formula (57) is obtained.

$$Ea = k \cdot \ln(\tau 1/\tau 2) \cdot (1/T1 - 1/T2)^{-1} \qquad \text{Formula (57)}$$

Subsequently, as illustrated in step S21 in FIG. 35, the control unit 10 acquires the humidity correction coefficient Hc. Step S21 may be performed in substantially the same manner as step S9 illustrated in FIG. 4.

Subsequently, as illustrated in step S22 in FIG. 35, the control unit 10 acquires an annual stress index Ah of the PV module collected from the field. The annual stress index Ah accounts for the humidity correction coefficient Hc with respect to the above annual stress index A.

The PV module collected from the field is subjected to temperature and humidity stress in the environment of the field where the PV module has been deployed. Thus, to obtain the annual stress index Ah reflecting both the temperature and humidity in the field from which the PV module is collected, it is necessary to consider both temperature information in the field and humidity information in the field. In this case, as the temperature information, the maximum temperature Tmp of the PV module deployed in the field, which differs from day to day, may be used. On the other hand, as the temperature information, the annual effective module temperature Tmp_eff of the PV module deployed in the field may be used. In addition, as the humidity information, the humidity correction coefficient Hc may be applied. In a case where the PV module is deployed in a field different from the field where the PV module has been deployed, the annual stress index Ah may be obtained considering both the temperature information and the humidity information in the field where the PV module is newly deployed.

From the above, the annual stress index Ah of the PV module collected from the field can be expressed as in the following Formula (58). Hereinafter, the annual stress index Ah of the PV module collected from the field will be simply referred to as "annual stress index Ah" as appropriate.

$$\text{Annual stress index } Ah = \Sigma \exp(-Ea/kTmp) \times Heff/Hc \qquad \text{Formula (58)}$$

Here, the sum total interval is 365 days.

In addition, the annual stress index Ah can also be expressed as in the following Formula (59).

$$\text{Annual stress index } Ah = \exp(-Ea/k\text{Tmp\_eff}) \times Heff \times 365/Hc \qquad \text{Formula (59)}$$

Here, Heff is a daily effective stress time that can be used in a versatile manner throughout a year. In addition, as described above, Tmp_eff may be approximated from a correlation between the annual average temperature of the daily maximum atmospheric temperature Tmax and ΔT.

Subsequently, as illustrated in step S23 in FIG. 35, the control unit 10 acquires a residual useful life stress index Br.

The remaining useful life stress index Br acquired in step S23 is information corresponding to a stress amount necessary to consume all the residual useful life of the PV module collected from the field. This can be expressed as in the following Formula (60).

$$Br = \exp(-Ea/kTm) \times \tau \qquad \text{Formula (60)}$$

Here, Tm is a test temperature (absolute temperature [K] unit) in the acceleration test performed for the collected PV module, and τ is a useful life ([h] unit) obtained in the acceleration test.

When obtaining Br in Formula (60), as Tm and τ, a set of T1 and τ1 may be used, or a set of T2 and τ2 may be used. By using information of either set, the same Br is obtained.

Subsequently, as illustrated in step S24 in FIG. 35, the control unit 10 calculates the number of residual useful life years Yr. The number of residual useful life years Yr indicates the number of years from the time of collection until the useful life in a case where the collected PV module is kept deployed in the field as it is. This can be expressed as in the following Formula (61) by using the residual useful life stress index Br and the annual stress index Ah.

Number of residual useful life years $Yr=Br/Ah$    Formula (61)

Subsequently, as illustrated in step S25 in FIG. 35, the control unit 10 may calculate the number of useful life years Yp. The number of useful life years Yp from when the PV module is deployed in the field until the useful life can be expressed as in the following Formula (62) in addition to the number of residual useful life years Yr to a number of years X during which the PV module is deployed in the field.

Number of useful life years $Yp=X+Yr$    Formula (62)

Here, a case in which the PV module collected from the field where the PV module has been deployed is deployed in another field that is different from the field where the PV module has been deployed will be described. In such a case, the number of useful life years Yp in a case where the PV module is deployed in the another field from the start can be expressed as in the following Formula (63).

Number of useful life years $Yp=X\times(Ah\_bf/Ah\_af)+Yr$    Formula (63)

Here, X is the number of years during which the PV module is deployed in the field where the collected PV module has been deployed. In addition, Ah_bf is an annual stress index in the field where the collected PV module has been deployed, and Ah_af is an annual stress index on the other field where the PV module is deployed. In addition, Yr is obtained by replacing Ah by Ah_af in Formula (61).

From the above, it is illustrated that the number of useful life years Yp of the PV module in the field (collected from the field where the PV module has been deployed) can be calculated by using only the field collected product without needing a new PV module (initial product).

An example in which the information processing apparatus 1 according to an embodiment performs the useful life prediction using the above calculation, that is, only the product collected from the field, will be further described below.

As described above, in the information processing apparatus 1 according to an embodiment, the control unit 10 can perform various calculations on the basis of input of various types of information acquired from the input unit 20 and/or the communication unit 40. In addition, in the information processing apparatus 1 according to an embodiment, the control unit 10 can output results of various calculations from the output unit 30 and/or the communication unit 40. Therefore, the information processing apparatus 1 according to an embodiment can output information of various results on the basis of input of necessary various types of information.

More specifically, the information processing apparatus 1 according to an embodiment may output result information on the basis of input of first information and second information. Here, the first information may be information indicating an amount of hygrothermal stress that the photovoltaic module receives from a time point during a time period during which the photovoltaic module is capable of outputting predetermined electric power until the end thereof, such as the above residual useful life stress index Br (step S23 in FIG. 35). In addition, the second information may be information indicating an amount of hygrothermal stress that the photovoltaic module receives per predetermined time period in the field where the photovoltaic module is deployed, such as the above annual stress index Ah (step S22 in FIG. 35). In addition, the result information may be information about a residual time period during which the photovoltaic module is expected to be capable of outputting the predetermined electric power if the photovoltaic module is deployed in the field, such as the above number of residual useful life years Yr (step S24 in FIG. 35).

In addition, the first information may also be information indicating an amount of hygrothermal stress that the photovoltaic module receives from a time point at which a predetermined time period elapses after the generation of acid caused by ultraviolet stress that the photovoltaic module receives has reached a predetermined saturation level. Furthermore, the first information may also be information indicating an amount of hygrothermal stress that the photovoltaic module receives from the above time point until the end of the time period during which the photovoltaic module is capable of outputting the predetermined electric power. For example, the first information may also be information indicating a stress amount corresponding to at least part of the region of the stress amount (2) illustrated in FIG. 30. In this case, "time point at which a predetermined time period elapses after the generation of acid caused by ultraviolet stress that the photovoltaic module receives has reached a predetermined saturation level" may also be, for example, a time point at which the photovoltaic module is collected from the field where the photovoltaic module has been deployed.

In addition, the first information and/or the second information may be, for example, generated on the basis of the activation energy Ea of hygrothermal degradation obtained from results of damp heat tests performed on the photovoltaic module, which is collected from the field, under two or more temperature conditions (step S5 in FIG. 35).

In addition, the second information may also be generated on the basis of information of the humidity in the field where the photovoltaic module is deployed and information on the humidity in two or more damp heat tests for the photovoltaic module collected from the field, such as information indicating the humidity correction coefficient Hc. Here, the humidity correction coefficient Hc may be acquired as described in step S21 in FIG. 35 (or step S9 in FIG. 4).

In addition, the second information may also be generated on the basis of the information about the daily maximum temperature of the photovoltaic module in the field where the photovoltaic module is deployed, such as the information indicating Tmp (step S3 in FIG. 35).

Furthermore, the second information may also be generated on the basis of the information indicating a daily time during which the photovoltaic module receives hygrothermal stress in the field where the photovoltaic module is deployed, such as Heff (step S4 in FIG. 35) or Neff. Here, "information indicating a daily time during which the photovoltaic module receives hygrothermal stress in the field where the photovoltaic module is deployed" may also be, for example, information indicating a constant value throughout a year.

In addition, the second information may also be information indicating an amount of hygrothermal stress that the photovoltaic module receives for a year in the field where the photovoltaic module is deployed, such as the annual stress index Ah (step S22 in FIG. 35).

The information processing apparatus 1 according to an embodiment may output, as the result information, information such as Yp described in step S25 in FIG. 35. That is, the information processing apparatus 1 may add a time period from when the photovoltaic module is deployed in the field until the time point at which the photovoltaic module is collected, to a residual time period during which the photovoltaic module is expected to be capable of outputting the predetermined electric power if the photovoltaic module is deployed in the field, and may output it. Here, "residual time period during which the photovoltaic module is expected to be capable of outputting the predetermined electric power if the photovoltaic module is deployed in the field" may be, for example, the above number of residual useful life years Yr (step S24 in FIG. 35). In addition, "time period from when the photovoltaic module is deployed in the field until the time point at which the photovoltaic module is collected" may be, for example, the number of years X during which the photovoltaic module is deployed in the field as illustrated in step S25 in FIG. 35.

The above embodiment is not limited only to the implementation as the information processing apparatus 1. For example, the above embodiment may also be implemented as a control method of a device such as the information processing apparatus 1. Furthermore, for example, the above embodiment may also be implemented as a program executed by a device such as the information processing apparatus 1.

As described above, according to the above method, the useful life of the PV module can be predicted without needing the initial product of the PV module. Thus, the information processing apparatus 1 according to an embodiment can implement the useful life prediction of the PV module with higher versatility.

(Verification of Compatibility Between Two Independent Useful Life Prediction Methods)

The applicants have compared the number of useful life years Yp or Yp' and the number of useful life years Y with each other. Here, the number of useful life years Yp or Yp' is, as described above, the number of useful life years predicted from information of results of performing damp heat tests on PV modules collected from the field. In addition, the number of useful life years Y is the number of useful life years predicted, independently of the above, from test information (the DH test and the UV DH sequential test performed by using the temperature and the relative humidity as variables) of a PV module that is a manufacture initial product. As a result, the applicants have confirmed favorable consistency with each other in an error range that is practically allowable, as illustrated in FIG. 33 and FIG. 34. Therefore, it has been confirmed that each of the above prediction of the number of useful life years Y, the prediction of the number of useful life years Y using a graph, and the prediction of the number of useful life years Y using the monthly atmospheric temperature information is extremely useful. That is, it has been verified that, as a method of estimating the useful life based on UV and hygrothermal degradation on an actual field, each of the above useful life prediction methods not only has high quantitativity and versatility but also is sufficient for practical use.

(Method of Correcting Useful Life Prediction Using Information of Field Product)

Here, for example, in a case where a non-negligible difference, not within the error range, arises between the number of useful life years Y calculated according to the above Formula (1) and the number of useful life years Yp or Yp' calculated according to the above Formula (54) or Formula (56), the calculated number of useful life years Y may be corrected by using a correction coefficient. Hereinafter, the number of useful life years Y before correction will be referred to as "number of useful life years Ybf", and the number of useful life years Y after correction will be referred to as "number of useful life years Yaf".

The number of useful life years Yaf can be obtained by multiplying the number of useful life years Ybf by a feedback correction coefficient Fc of a product collected from the field, as expressed in the following Formula (64).

$$\text{Number of useful life years } Yaf = \text{number of useful life years } Ybf \times Fc \qquad \text{Formula (64)}$$

The above feedback correction coefficient Fc of the field collected product can be expressed as in the following Formula (65).

$$Fc = \{\Sigma(Yp/Ybf)\}/\text{number of collected product additional test samples } Nf \qquad \text{Formula (65)}$$

Here, the sum total interval is a number of samples Nf in an additional test of field collected products. Yp is a value that differs for each field collected product. In addition, Ybf is a value that differs depending on the area in which the PV module is deployed, the mounting style of the PV module, and/or the like. In addition, Yp' may also be used instead of Yp.

According to such calculation, the accuracy of the prediction of the number of useful life years Y calculated according to Formula (1) can be further increased. In addition, according to such calculation, the accuracy of the useful life prediction can be improved sequentially as information of an additional test of the field collected product is accumulated.

(Output Warranty Safety Factor)

As described above, the information processing apparatus 1 according to an embodiment can estimate the number of useful life years Y based on UV and hygrothermal degradation in the field. Thus, by setting an output warranty period (number of years) Ypw of the PV module, the information processing apparatus 1 according to an embodiment can calculate an output warranty safety factor for UV and hygrothermal stress, as expressed in the following Formula (66). In Formula (66), the output warranty safety factor for UV and hygrothermal stress is simply referred to as "output warranty safety factor Spw".

$$\text{Output warranty safety factor } Spw = \text{number of useful life years } Y/\text{output warranty period } Ypw \qquad \text{Formula (66)}$$

The useful life prediction of the PV module may include various uncertain elements and/or errors. Therefore, when estimating the useful life of the PV module, it is desirable to sufficiently secure the output warranty safety factor Spw. As a rough value, it is desirable that the output assurance safety factor Spw be more than or equal to 1.3 at least. More desirably, the output warranty safety factor Spw is preferably more than or equal to 1.5. Still more desirably, the output warranty safety factor Spw is preferably more than or equal to 2.0. In particular, it is desirable that the output warranty safety factor Spw be more than or equal to 2.0 in an area with a large irradiation amount of UV light, particularly a hot and humid area, and the like.

Here, the output warranty safety factor Spw can be set to any value on the basis of an output warranty period Ypw that is set by a manufacturer of the PV module. If it is not possible to secure the above output warranty safety factor Spw, it is desirable for the manufacturer of the PV module to sufficiently secure the output warranty safety factor Spw by setting the output warranty period Ypw to a short time period or the like.

(Effects of Useful Life Prediction According to Embodiment)

Effects of the useful life prediction of the PV module performed by the information processing apparatus 1 according to an embodiment will be further described in light of the actual situation of the conventional art.

Conventionally, a technique of estimating the useful life based on UV and hygrothermal degradation quantitatively with appropriate accuracy has not been established. For example, a test based on the current IEC standard is performed under a single condition, such as a temperature of 85° C. and a humidity of 85% for 1000 hours. By such a test, information about the useful life of the PV module is not obtained.

Thus, conventionally, for example, the actual situation has been at least the following situations.

(1) It has not been possible to set the above output warranty period Ypw on the basis of some grounds (i.e., considering the safety factor Spw, for example). Thus, it has not been possible to provide a user with sufficient appeal and/or information on long-term reliability of a PV module product.

(2) It has not been possible to estimate a power generation cost [yen/kWh] quantitatively and appropriately on the basis of technical grounds. Thus, grounds for determining a value regarding the total power generation amount and/or power generation cost at a stage of planning a power generation business has been insufficient.

(3) For example, at a power plant or the like, when the photovoltaic generation system is sold, it has not been possible to evaluate the asset value of the system rightfully and appropriately. Thus, grounds contributing to making decision in the power generation business have been insufficient.

(4) It has only recently become known that UV light has large influence on the useful life of a PV module. However, it has not been possible to estimate, quantitatively and appropriately on the basis of technical grounds, the specific degree of the influence of UV light on the useful life of a PV module.

(5) It has not been possible for the market and users to know useful life information of a PV module as a product. Thus, without sufficient information, the market and users have to select a product actually having a long or short useful life.

(6) Regarding the long-term reliability of a PV module, while the quality difference between manufacturers is not visible, the market is in a state of distribution of the good and bad. Such a state is desirably improved in a beneficial direction in view of healthy development of the photovoltaic generation industry and market in the future.

On the other hand, for example, before deploying a photovoltaic generation system or the like, there is a demand to estimate the useful life of PV modules constituting the system. In particular, information about the useful life of PV modules is necessary when the power generation cost is predicted in yen/kWh. In addition, appropriate evaluation of the asset value is desired when selling the solar cell system.

As described above, the information processing apparatus 1 according to an embodiment can convert the prediction of the useful life of a PV module based on UV and hygrothermal degradation into a numeric value reasonably, that is, on an objective basis. In addition, the information processing apparatus 1 according to an embodiment can estimate the useful life of a PV module based on degradation quantitatively on the basis of appropriate grounds.

In addition, the information processing apparatus 1 according to an embodiment can evaluate the asset value of the photovoltaic generation system. That is, the information processing apparatus 1 according to an embodiment can, for example, contribute to the prediction of the total power generation amount or power generation cost of the photovoltaic generation system even at a stage at which deployment of the system is being planned on the basis of results of the prediction of the useful life according to the present disclosure. In addition, the information processing apparatus 1 according to an embodiment can contribute to the prediction of the residual power generation amount of the photovoltaic generation system also at a stage of considering selling of the system on the basis of results of the prediction of the useful life according to the present disclosure. Objective evaluation of the useful life of the PV module in this manner can contribute to the formation of the healthy photovoltaic generation industry and market. In addition, if information of the useful life prediction of the PV module by the information processing apparatus 1 according to an embodiment is spread in the industry, a user can obtain information about the long-term reliability in the market.

In addition, as described above, the information processing apparatus 1 according to an embodiment can, for example, determine a versatile value of the daily effective stress time Heff throughout a year from an actually measured data set of the module temperature on a plurality of existing fields. By using the above Heff, the information processing apparatus 1 according to an embodiment can easily estimate the useful life of the PV module before deploying a new photovoltaic generation system. In addition, as described above, the information processing apparatus 1 according to an embodiment can incorporate, not only humidity correction, but also UV correction, at the time of the useful life prediction of the PV module. In addition, as described above, the information processing apparatus 1 according to an embodiment can estimate the useful life by further performing the acceleration test on the collected product of the PV module. In addition, as described above, the information processing apparatus 1 according to an embodiment can define the output warranty safety factor of the PV module on the basis of results of the useful life prediction of the PV module based on UV and hygrothermal degradation. If the output warranty safety factor of the PV module is defined in this manner, a user can obtain more accurate information about the long-term reliability of the PV module in the market.

(Other Embodiments)

Embodiments in which the above embodiment is changed or modified as appropriate will be further described below.

In the embodiment illustrated in FIG. 4 and FIG. 5, "acquire UV correction coefficient Uc" in step S11 is executed immediately before "calculate useful life Y based on UV and hygrothermal degradation on field" in step S12. However, "acquire UV correction coefficient Uc" in step S11 may be executed, not only immediately before step S12, but also at an earlier stage.

In the embodiment illustrated in FIG. 4 and FIG. 5, "acquire UV correction coefficient Uc" in step S11 may be performed in any given step that can take into account correction in consideration of the influence of UV.

In addition, in the above "Useful Life Prediction using Only Collected Products from the Field", for a PV module that is deployed in the field for more than or equal to three to five years, on the basis of the fact that the generation of acetic acid caused by UV light is almost saturated, the useful life of the PV module is calculated without using the UV correction coefficient Uc. On the basis of a principle that is substantially the same as this, the useful life of a new PV module (initial product) may be calculated.

That is, in this case, first, by performing the UV test on a new PV module (initial product), the generation of acetic acid caused by UV light may be saturated. Subsequently, the damp heat test (DH test) may be performed on the PV module. For example, the number of useful life years (hours) in a case where the UV test is performed first and then the DH test is performed next at a temperature of around 90° C. on the new PV module (initial product) may be obtained. In addition, for example, the number of useful life years (hours) in a case where the UV test is performed first and then the DH test is performed next at a temperature of around 125° C. on a new PV module (initial product) having almost the same specifications may be obtained. Then, if the useful life is calculated in the temperature band in the field of the PV module on the basis of these results, it is not necessary to acquire the UV correction coefficient Uc.

In addition, the humidity condition in the above damp heat test may be, for example, RH of 90±about 5%. Since the influence of humidity correction is not large with such a variation, the condition can be considered in almost the same range. On the other hand, if, for example, the humidity condition in the above damp heat test deviates from RH of 90±5%, the useful life of the PV module can be calculated more accurately by using the humidity correction coefficient Hc.

Although the present disclosure has been described on the basis of the drawings and examples, it should be noted that a person skilled in the art easily makes various changes or modifications on the basis of the present disclosure. Therefore, it should be noted that these changes or modifications are included in the scope of the present disclosure. For example, functions or the like included in the functional units can be rearranged not to be logically inconsistent. The plurality of functional units or the like may be combined together or may be divided. Each embodiment related to the above present disclosure is not limited to implementation faithful to each embodiment that has been described and may be implemented by combining features or omitting part of them as appropriate.

For example, as described above, the information processing apparatus 1 according to an embodiment can evaluate the asset value (the number of useful life years) at a stage at which deployment of the photovoltaic generation system is being planned, but may evaluate the asset value (the number of residual useful life years) of a used photovoltaic generation system. For example, the information processing apparatus 1 according to an embodiment may evaluate the asset value (the number of residual useful life years) of a used photovoltaic generation system from the point of view of the useful life based on UV and hygrothermal degradation. In this case, for example, the following (1) to (3) is possible.

(1) First, from information of atmospheric temperature and humidity at a place where PV modules are deployed and information of the mounting style of the PV modules, the number of useful life years Y based on UV and hygrothermal degradation is roughly calculated. In this case, for a product having almost the same specifications as the deployed PV modules, information (T) of the time until the useful life due to a damp heat test and information (Ea) of the activation energy of degradation may be used. On the other hand, if information of such a product that can be regarded as having almost the same specifications is unavailable, from existing information or available information, test information (T and Ea) of a PV module having specifications that are considered to be close to the specifications of the PV modules may be used instead.

Subsequently, the residual useful life in a case where the PV modules are kept deployed in a certain field is obtained. For example, PV modules deployed in a certain field for X [years] is collected. If the number of useful life years in an environment where the PV modules are deployed in the field has information indicating Y [years], the residual time τra [hours] in a case where the PV modules are deployed in the field can be expressed as in the following Formula (67).

$$\text{Residual useful life } \tau ra[\text{hours}] = (Y-X) \times H\text{eff} \times 365 \quad \text{Formula (67)}$$

Subsequently, by using the annual effective module temperature Tmp_eff of the PV modules deployed in the field as the temperature information, the residual useful life stress index Br can be expressed as in the following Formula (68).

$$Br = \exp(-Ea/k\text{Tmp\_eff}) \times \tau ra \quad \text{Formula (68)}$$

In Formula (68), the residual useful life stress index Br is calculated by using the annual effective module temperature Tmp_eff of the PV modules deployed in the field. In addition, the residual useful life stress index Br may also be calculated by using the maximum temperature Tmp of the PV modules, which differs from day to day, of the PV modules deployed in the field.

Next, the annual stress index Ah of the PV modules in another field where the PV module is to be deployed can be expressed as in Formula (58) or Formula (59). In this case, the number of residual useful life years Yr on the other field can be calculated by using Formula (61).

(2) If a temperature monitor value of the PV modules in the photovoltaic generation system is present, by using the annual stress index Ah calculated by using the temperature information thereof, the number of residual useful life years Yr may be calculated. In this case, the accuracy of estimating the residual useful life can be more increased.

(3) By collecting some PV modules from the photovoltaic generation system and by further performing the damp heat test, the residual useful life of the PV modules may be confirmed. Specifically, the method described above in (Useful Life Prediction using Only Collected Products from the Field) can be used.

As described above, the information processing apparatus 1 according to an embodiment can output various types of result information on the basis of input of necessary various types of information. More specifically, the information processing apparatus 1 according to an embodiment may output the result information on the basis of input of fourth information, fifth information, and sixth information.

Here, the fourth information may be information indicating a time period during which a first PV module is deployed in a predetermined field, the first PV module being deployed in the predetermined field among a plurality of PV modules having the same specifications. That is, the fourth information may be, for example, the time period X [years] during which a collected product that receives stress corresponding to the region of the stress amount (3) illustrated in FIG. 30 is deployed in the field.

The fifth information is information obtained from results of a damp heat test performed on the first PV module and may be information indicating a time period during which the first PV module is capable of outputting predetermined electric power. That is, the fifth information may be, for example, the time β [hours] during which the DH test is performed on a collected product that receives stress corresponding to the region of the stress amount (2) illustrated in FIG. 30.

The sixth information is information obtained from a damp heat test performed on a second PV module that is different from the first PV module among the plurality of PV modules, the damp heat test being performed after a predetermined ultraviolet irradiation test, and may be information indicating a time period during which the second PV module is capable of outputting predetermined electric power. That is, the sixth information may be, for example, the time γ [hours] during which the DH test is performed sequentially to the UV test on a collected product that receives stress corresponding to the region of the stress amount (4) illustrated in FIG. 30.

In addition, the result information may be information about a time period during which the second PV module is expected to be capable of outputting predetermined electric power if the second PV module is deployed in a predetermined field, such as the above number of useful life years Y (step S12 in FIG. 4). The information processing apparatus 1 according to an embodiment may output result information by setting, as the second PV module, a PV module that is not deployed in the predetermined field, such as a PV module of an initial product.

The above embodiment is not limited only to the implementation as the information processing apparatus 1. For example, the above embodiment may be implemented as a control method of a device (e.g., computer) such as the information processing apparatus 1. Furthermore, for example, the above embodiment may also be implemented as a program executed by a device (e.g., computer) such as the information processing apparatus 1.

In addition, an additional correction coefficient may be provided for the useful life as necessary. For example, in a case where the back sheet 120 has an aluminum (Al) sheet, a moisture ingress route is limited to a side surface of the PV module, and a moisture ingress amount from a back surface of the PV module is reduced, and thus, the useful life becomes longer. The extension amount of the useful life is in proportion to the size of the PV module. In a case of a normal PV module size (about 60 to 72 cells per module), the correction coefficient can be set to about 2 to 3 at most as appropriate.

In addition, although the case where EVA is used as a material of the encapsulant is described above, the material of the encapsulant is not limited to EVA, and may also be, for example, olefin or other resin material.

The invention claimed is:

1. An apparatus for predicting useful life of a photovoltaic module, comprising:
an input that receives first information indicating an amount of hygrothermal stress that a photovoltaic module undergoes from a start until an end of a period during which the photovoltaic module outputs predetermined electric power, and receives second information indicating an amount of hygrothermal stress that the photovoltaic module undergoes per a predetermined time in a field where the photovoltaic module is deployed, the second information generated based on information about daily maximum temperatures of the photovoltaic module in the field where the photovoltaic module is deployed; and
an output that outputs result information about a predicted period during which the photovoltaic module is expected to output the predetermined electric power when the photovoltaic module is deployed in the field, wherein
the second information is generated based on an activation energy of hygrothermal degradation obtained from results of damp heat tests performed on same type of photovoltaic modules as the photovoltaic module under two or more temperature conditions, and
the second information is generated based on a value obtained by dividing
a sum total in a unit of the predetermined time,
an amount that is in proportion to daily hygrothermal stress in the photovoltaic module deployed in the field, by
an amount that is in proportion to hygrothermal stress per unit time at a maximum temperature of the photovoltaic module deployed in the field.

2. The apparatus according to claim 1, wherein the first information is generated based on an activation energy of hygrothermal degradation obtained from results of damp heat tests performed on same type of photovoltaic modules as the photovoltaic module under two or more temperature conditions.

3. The apparatus according to claim 1, wherein, in the second information, a daily time during which the photovoltaic module deployed in the field undergoes hygrothermal stress differs from day to day.

4. The apparatus according to claim 1, wherein, in the second information, a daily time during which the photovoltaic module deployed in the field undergoes hygrothermal stress is a constant value throughout a year.

5. The apparatus according to claim 1, wherein the second information is information indicating an amount of hygrothermal stress that the photovoltaic module undergoes in the field for a year.

6. The apparatus according to claim 1, wherein the result information includes correction based on hygrothermal stress that the photovoltaic module undergoes in the field and/or correction based on ultraviolet light stress that the photovoltaic module undergoes in the field.

7. A control method of a device for predicting useful life of a photovoltaic module, the method comprising:
acquiring first information indicating an amount of hygrothermal stress that a photovoltaic module undergoes from a start until an end of a period during which the photovoltaic module outputs predetermined electric power;
acquiring second information indicating an amount of hygrothermal stress that the photovoltaic module undergoes per a predetermined time in the field where the photovoltaic module is deployed, the second information generated based on information about daily maximum temperatures of the photovoltaic module in the field where the photovoltaic module is deployed; and
based on input of the first information and the second information, outputting result information about a predicted period during which the photovoltaic module is expected to output the predetermined electric power when the photovoltaic module is deployed in the field, wherein
the second information is generated based on an activation energy of hygrothermal degradation obtained from results of damp heat tests performed on same type of photovoltaic modules as the photovoltaic module under two or more temperature conditions, and
the second information is generated based on a value obtained by dividing
a sum total in a unit of the predetermined time,
an amount that is in proportion to daily hygrothermal stress in the photovoltaic module deployed in the field, by
an amount that is in proportion to hygrothermal stress per unit time at a maximum temperature of the photovoltaic module deployed in the field.

8. A non-transitory computer-readable recording medium that stores a control program for causing, when executed by a device that predicts useful life of a photovoltaic module, the device to execute:
acquiring first information indicating an amount of hygrothermal stress that a photovoltaic module undergoes from a start until an end of a period during which the photovoltaic module outputs predetermined electric power;
acquiring second information indicating an amount of hygrothermal stress that the photovoltaic module undergoes per a predetermined time in the field where the photovoltaic module is deployed, the second information generated based on information about daily maximum temperatures of the photovoltaic module in the field where the photovoltaic module is deployed; and
based on input of the first information and the second information, outputting result information about a predicted period during which the photovoltaic module is expected to output the predetermined electric power when the photovoltaic module is deployed in the field
wherein
the second information is generated based on an activation energy of hygrothermal degradation obtained from results of damp heat tests performed on same type of photovoltaic modules as the photovoltaic module under two or more temperature conditions, and
the second information is generated based on a value obtained by dividing
a sum total in a unit of the predetermined time,
an amount that is in proportion to daily hygrothermal stress in the photovoltaic module deployed in the field, by
an amount that is in proportion to hygrothermal stress per unit time at a maximum temperature of the photovoltaic module deployed in the field.

9. An apparatus for predicting useful life of a photovoltaic module, comprising:
an input that receives first information indicating a representative value of a temperature of a photovoltaic module deployed in the field throughout a year, and receives second information indicating a correlation between the temperature and/or a humidity of the photovoltaic module and a period during which the photovoltaic module outputs predetermined electric power, the correlation obtained from results of two or more tests performed under different environment conditions, and
an output that outputs result information about a predicted period during which the photovoltaic module is expected to output the predetermined electric power in the field,
wherein the second information indicates a correlation obtained from results of tests performed under temperature conditions, where a difference between the temperature conditions is within a predetermined difference.

10. The apparatus according to claim 9, wherein the result information includes correction based on hygrothermal stress that the photovoltaic module undergoes in the field and/or correction based on ultraviolet light stress that the photovoltaic module undergoes in the field.

11. The apparatus according to claim 9, wherein the first information is generated based on hygrothermal stress that the photovoltaic module undergoes per a predetermined time in the field where the photovoltaic module is deployed.

12. The apparatus according to claim 9, wherein the first information is determined based on information of a monthly average of daily maximum temperatures in the field acquired for a year.

13. The apparatus according claim 9, wherein the second information indicates a correlation obtained from a result of tests performed under humidity conditions, where a difference between the humidity conditions is within a predetermined difference.

14. A control method of a device for predicting useful life of a photovoltaic module, the method comprising:
acquiring first information indicating a representative value of a temperature of a photovoltaic module deployed in the field throughout a year;
acquiring second information indicating a correlation between the temperature and/or a humidity of the photovoltaic module and a period during which the photovoltaic module outputs predetermined electric power, the correlation obtained from results of two or more tests performed under different environment conditions; and
outputting, based on the first information and the second information, result information about a predicted period during which the photovoltaic module is expected output the predetermined electric power in the field,
wherein the second information indicates a correlation obtained from results of tests performed under temperature conditions, where a difference between the temperature conditions is within a predetermined difference.

15. A non-transitory computer-readable recording medium that stores a control program for causing, when executed by a device that predicts useful life of a photovoltaic module, the device to execute:
acquiring first information indicating a representative value of a temperature of a photovoltaic module deployed in the field throughout a year;
acquiring second information indicating a correlation between the temperature and/or a humidity of the photovoltaic module and a period during which the photovoltaic module outputs predetermined electric power, the correlation obtained from results of two or more tests performed under different environment conditions; and
outputting, based on the first information and the second information, result information about a predicted period during which the photovoltaic module is expected output the predetermined electric power in the field, wherein the second information indicates a correlation obtained from results of tests performed under temperature conditions, where a difference between the temperature conditions is within a predetermined difference.

* * * * *